(12) United States Patent
Takeuchi et al.

(10) Patent No.: US 7,336,021 B2
(45) Date of Patent: Feb. 26, 2008

(54) PIEZOELECTRIC/ELECTROSTRICTIVE DEVICE AND METHOD OF MANUFACTURING SAME

(75) Inventors: Yukihisa Takeuchi, Nishikamo-Gun (JP); Kazuyoshi Shibata, Mizunami (JP); Masahiko Namerikawa, Seto (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/584,223

(22) Filed: Oct. 20, 2006

(65) Prior Publication Data

US 2007/0035209 A1 Feb. 15, 2007

Related U.S. Application Data

(63) Continuation of application No. 09/672,069, filed on Sep. 28, 2000, now Pat. No. 7,164,221, which is a continuation-in-part of application No. 09/524,042, filed on Mar. 13, 2000, now Pat. No. 6,498,419.

(60) Provisional application No. 60/204,702, filed on May 16, 2000.

(30) Foreign Application Priority Data

| Oct. 1, 1999 | (JP) | ................... 11-281522 |
| Oct. 28, 1999 | (JP) | ................... 11-307844 |
| Nov. 16, 1999 | (JP) | ................... 11-326195 |
| Dec. 27, 1999 | (JP) | ................... 11-371967 |
| Jan. 21, 2000 | (JP) | ................... 2000-013576 |
| Jan. 24, 2000 | (JP) | ................... 2000-015123 |
| Mar. 1, 2000 | (JP) | ................... 2000-056434 |
| May 1, 2000 | (JP) | ................... 2000-133012 |

(51) Int. Cl.
*H01L 41/08* (2006.01)

(52) U.S. Cl. ...................... 310/331; 310/328

(58) Field of Classification Search ................ 310/328, 310/330–332
See application file for complete search history.

(56) References Cited

U.S. PATENT DOCUMENTS 2,497,665 A 2/1950 Gravley (Continued)

FOREIGN PATENT DOCUMENTS

DE 3142684 5/1983

(Continued)

OTHER PUBLICATIONS

Sato, Hiroshi et al., "New PZT Actuator Using Piezoelectric Thin Film on Parallel Plate Structure", Micromechatronics and Human Science, 1997, Proceedings of the 1997 International Symposium on Nagoya, Japan, Oct. 5, 1997, pp. 79-84.

(Continued)

*Primary Examiner*—Mark Budd
(74) *Attorney, Agent, or Firm*—Burr & Brown

(57) ABSTRACT

A piezoelectric/electrostrictive (P/E) device includes at least one actuator section secured to thin plate sections with an adhesive. The actuator section includes a multilayered member including at least three actuator films, each of which include a P/E layer and electrode films. One or more holes or recesses are formed in portions of the thin plate sections on which the P/E elements are formed. The electrode films contact upper and lower surfaces of respective P/E layers and alternately extend to opposite surfaces thereof. End surface electrodes electrically connect an electrode film that contacts one of the P/E layers and an electrode film that contacts another one of the P/E layers. The end surface electrodes are electrically connected to terminals which are provided on a surface of an outermost layer of the P/E layers, and which are separated from one another by a predetermined distance.

2 Claims, 53 Drawing Sheets

U.S. PATENT DOCUMENTS

| | | |
|---|---|---|
| 3,597,642 A | 8/1971 | Kurino |
| 3,614,485 A | 10/1971 | Cosman et al. |
| 3,891,869 A | 6/1975 | Scarpa |
| 4,254,354 A | 3/1981 | Keem |
| 4,290,041 A | 9/1981 | Utsumi et al. |
| 4,456,394 A | 6/1984 | Kolm et al. |
| 4,523,120 A | 6/1985 | Assard et al. |
| 4,612,440 A | 9/1986 | Brunnée et al. |
| 4,713,573 A | 12/1987 | Gansert et al. |
| 4,742,264 A | 5/1988 | Ogawa |
| 4,805,057 A | 2/1989 | Ogawa et al. |
| 5,049,775 A | 9/1991 | Smits |
| 5,166,571 A | 11/1992 | Konno et al. |
| 5,175,465 A | 12/1992 | Um et al. |
| 5,342,751 A | 8/1994 | Nishiyama et al. |
| 5,500,777 A | 3/1996 | Hasegawa et al. |
| 5,691,594 A | 11/1997 | Takeuchi et al. |
| 5,774,961 A | 7/1998 | Takeuchi et al. |
| 5,828,157 A | 10/1998 | Miki et al. |
| 5,831,371 A | 11/1998 | Bishop |
| 5,912,524 A | 6/1999 | Ohnishi et al. |
| 5,912,526 A | 6/1999 | Okawa et al. |
| 5,940,947 A | 8/1999 | Takeuchi et al. |
| 6,010,919 A | 1/2000 | Matsuhiro et al. |
| 6,018,212 A | 1/2000 | Kikuchi et al. |
| 6,049,158 A | 4/2000 | Takeuchi et al. |
| 6,107,727 A | 8/2000 | Kaida et al. |
| 6,109,104 A | 8/2000 | Fukuda et al. |
| 6,140,739 A | 10/2000 | Arai et al. |
| 6,246,552 B1 | 6/2001 | Soeno et al. |
| 6,262,516 B1 | 7/2001 | Fukuda et al. |
| 6,274,966 B1 | 8/2001 | Kohno et al. |
| 6,316,865 B1 | 11/2001 | Riedel |
| 6,323,582 B1 | 11/2001 | Takeuchi et al. |
| 6,329,740 B1 | 12/2001 | Hirota et al. |
| 6,333,681 B1 | 12/2001 | Takeuchi et al. |
| 6,335,586 B1 | 1/2002 | Takeuchi et al. |
| 6,342,751 B1 | 1/2002 | Takeuchi et al. |
| 6,351,056 B1 | 2/2002 | Takeuchi et al. |
| 6,396,193 B1 | 5/2002 | Takeuchi et al. |
| 6,404,109 B1 | 6/2002 | Takeuchi et al. |
| 6,455,981 B1 | 9/2002 | Takeuchi et al. |
| 6,476,539 B1 | 11/2002 | Takeuchi et al. |
| 6,534,898 B1 | 3/2003 | Takeuchi et al. |
| 6,534,899 B1 | 3/2003 | Takeuchi et al. |
| 6,715,192 B2 | 4/2004 | Takeuchi et al. |
| 7,164,221 B1 * | 1/2007 | Takeuchi et al. ............ 310/331 |
| 2002/0010990 A1 | 1/2002 | Takeuchi et al. |
| 2002/0013987 A1 | 2/2002 | Hirota et al. |
| 2002/0017014 A1 | 2/2002 | Takeuchi et al. |

FOREIGN PATENT DOCUMENTS

| | | |
|---|---|---|
| DE | 3424005 | 1/1986 |
| DE | 293918 | 9/1991 |
| DE | 4218368 | 12/1993 |
| DE | 197 15 194 | 10/1997 |
| EP | 0 629 007 | 12/1994 |
| EP | 0 667 646 | 8/1995 |
| EP | 0 742 597 | 11/1996 |
| EP | 1 017 116 A2 | 7/2000 |
| EP | 1 020 937 | 7/2000 |
| EP | 1 089 351 A2 | 4/2001 |
| EP | 1 089 352 A2 | 4/2001 |
| EP | 1 089 356 A2 | 4/2001 |
| EP | 1 089 358 A2 | 4/2001 |
| GB | 789336 | 1/1958 |
| GB | 1 328 931 | 9/1973 |
| GB | 2 146 790 | 4/1985 |
| JP | 58-151077 | 9/1983 |
| JP | 59-063782 | 4/1984 |
| JP | 62-259485 | 11/1987 |
| JP | 63-64640 | 3/1988 |
| JP | 10-136665 | 5/1998 |
| JP | 11-051959 | 2/1999 |
| WO | 99/01901 | 1/1999 |
| WO | 01/26166 A1 | 4/2001 |
| WO | 01/26169 A1 | 4/2001 |

OTHER PUBLICATIONS

U.S. Appl. No. 09/642,861, filed Aug. 21, 2000, Takeuchi et al.

U.S. Appl. No. 09/643,163, filed Aug. 21, 2000, Takeuchi et al.

U.S. Appl. No. 09/918,274, filed Jul. 30, 2001, Namerikawa et al.

U.S. Appl. No. 09/613,536, filed Jul. 10, 2000, Takeuchi et al.

U.S. Appl. No. 09/627,260, filed Jul. 28, 2000, Takeuchi et al.

U.S. Appl. No. 10/072,189, filed Feb. 7, 2002, Takeuchi et al.

U.S. Appl. No. 09/683,477, filed Jan. 4, 2002, Takeuchi et al.

Yoshikazu Soeno, et al., "*Piezoelectric Piggy-Back Microactuator for Hard Disk Drive*," IEEE Transactions on Magnetics, vol. 35, No. 2, Mar. 1999, pp. 983-987.

S. Koganezawa, et al., "*Dual-Stage Actuator System for Magnetic Disk Drives Using a Shear Mode Piezoelectric Microactuator,*" IEEE Transactions on Magnetics, vol. 35, No. 2, Mar. 1999, pp. 998-992.

* cited by examiner

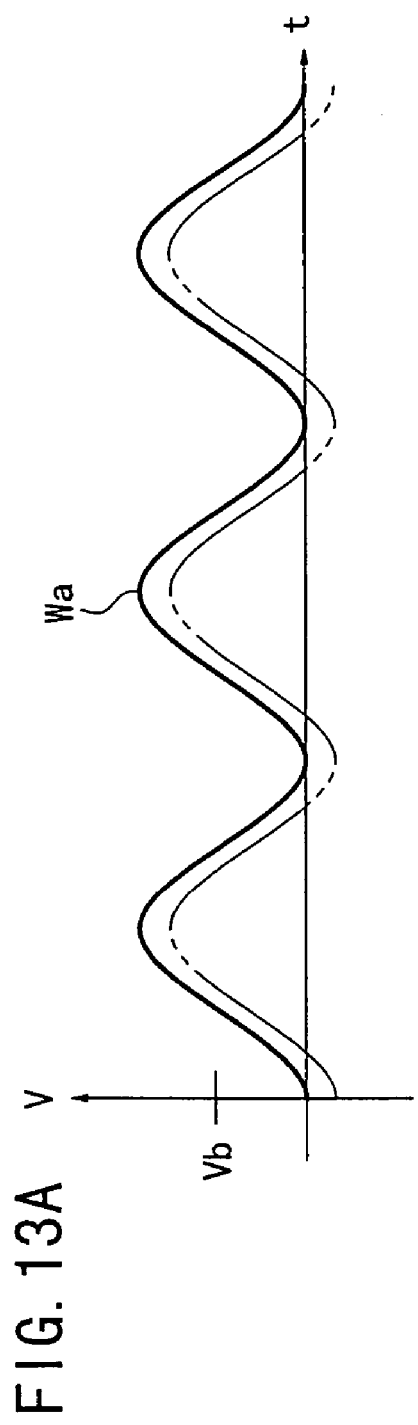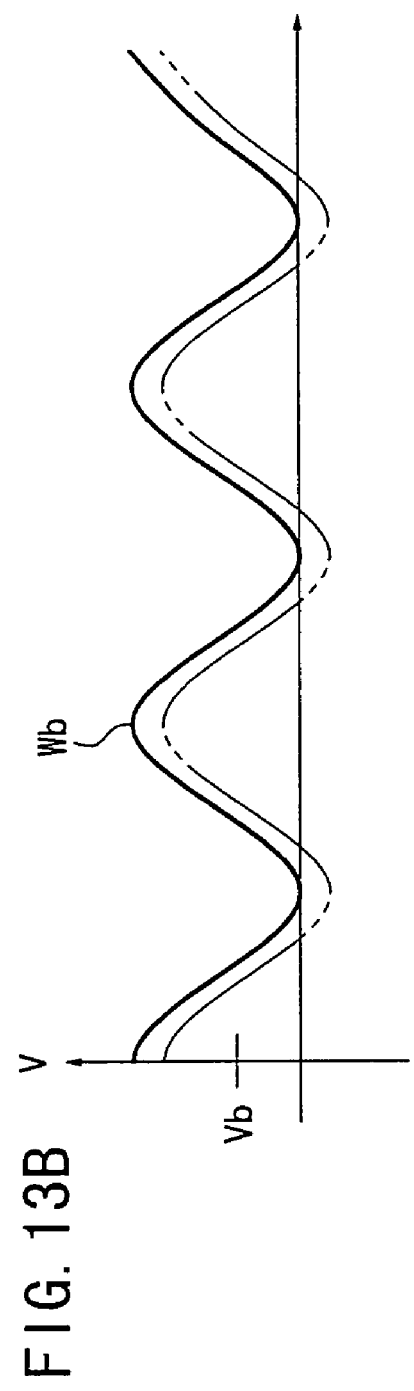

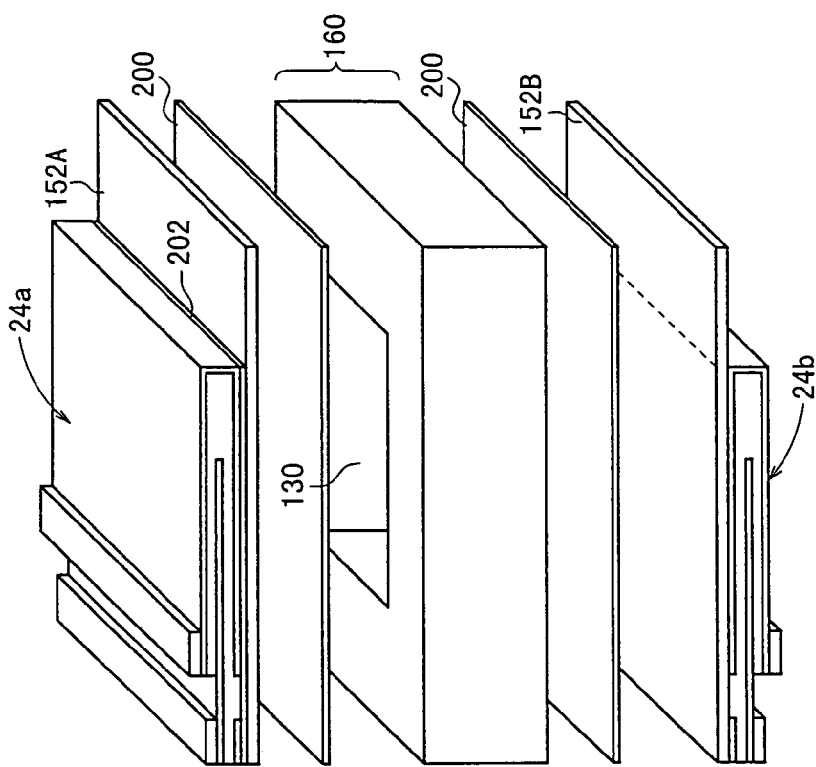
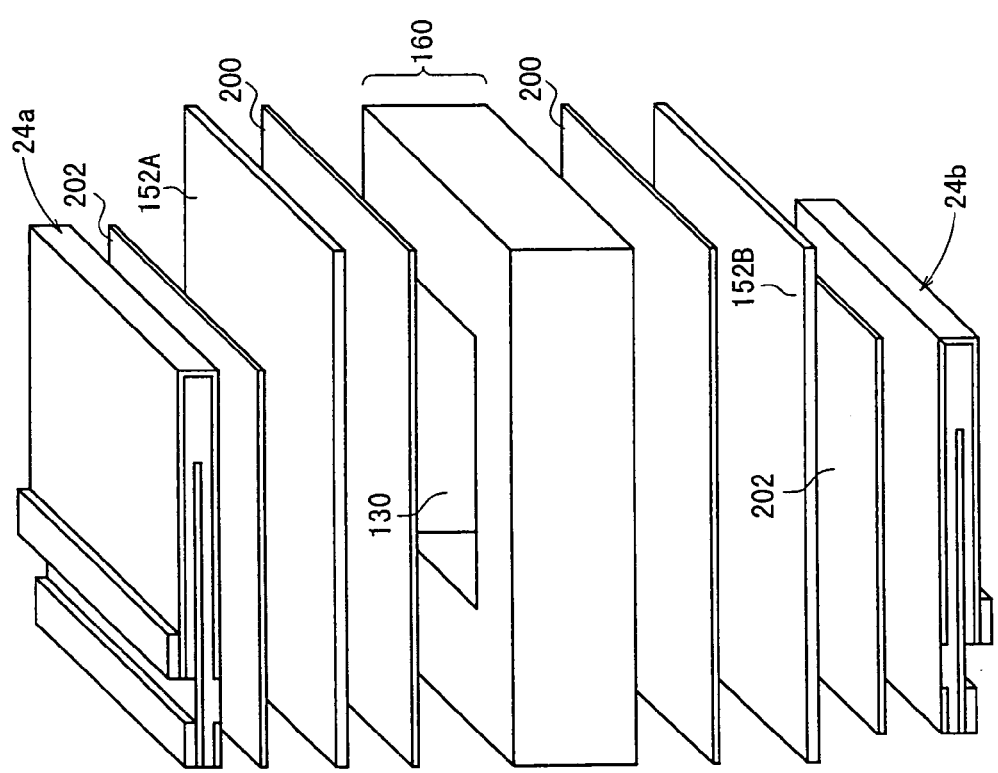

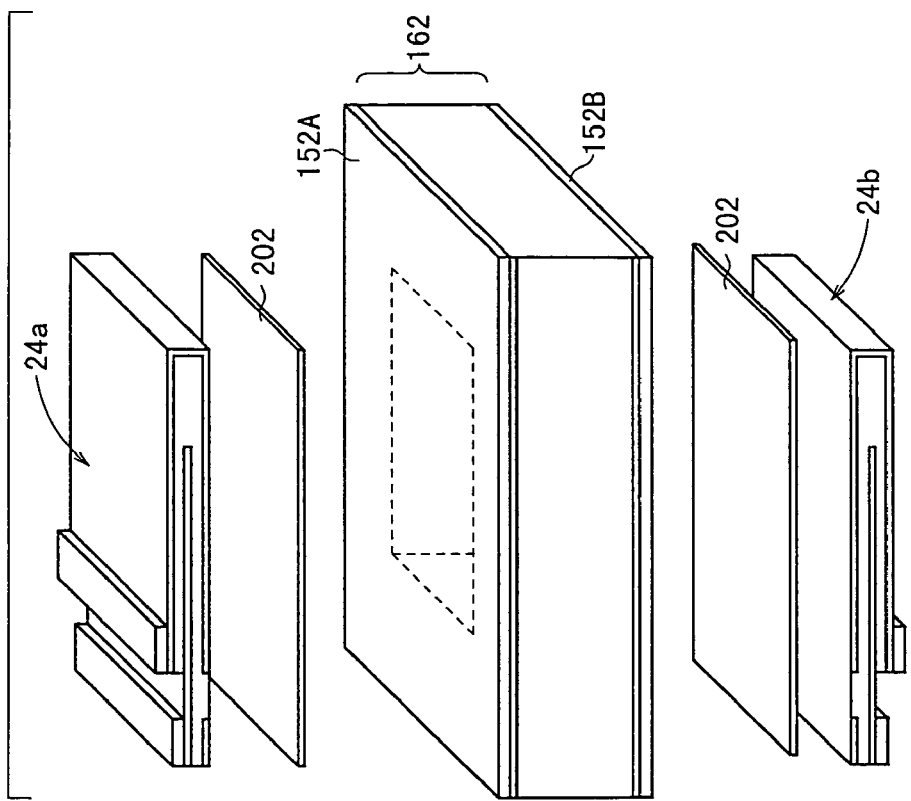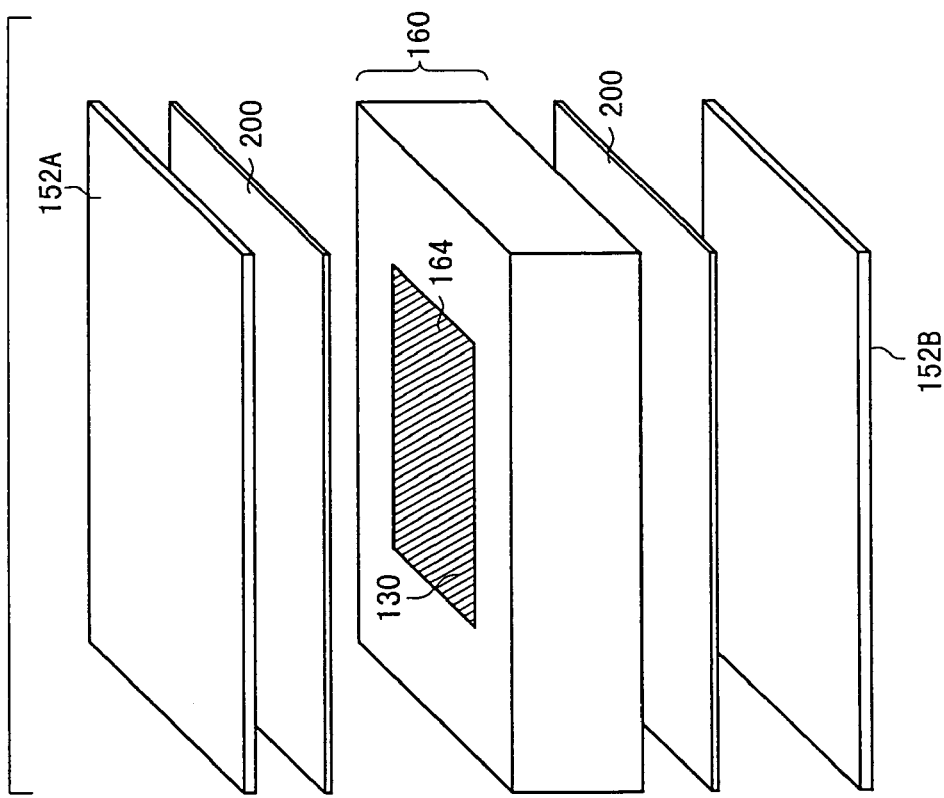

FIG. 41
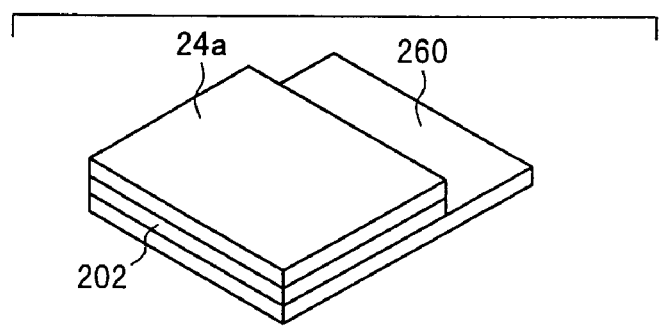
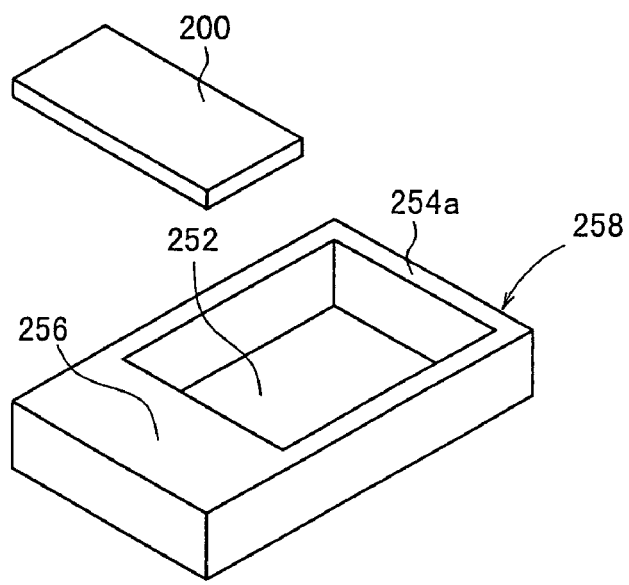
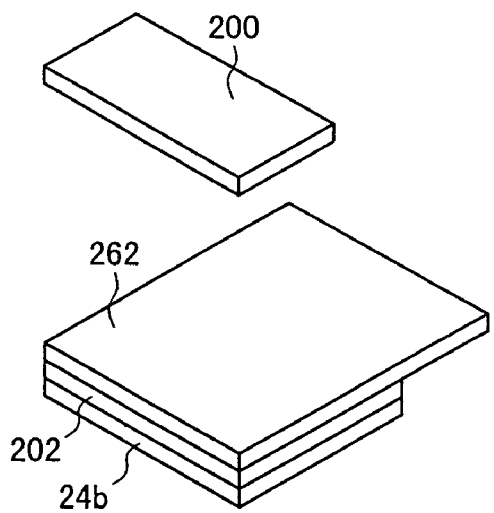

PIEZOELECTRIC/ELECTROSTRICTIVE DEVICE AND METHOD OF MANUFACTURING SAME

CROSS-REFERENCE TO RELATED APPLICATIONS

This application is a continuation of U.S. application Ser. No. 09/672,069 filed Sep. 28, 2000 now U.S. Pat. No. 7,164,221, which is a continuation-in-part of U.S. application Ser. No. 09/524,042 filed Mar. 13, 2000, now U.S. Pat. No. 6,498,419, and which claims the benefit of U.S. Provisional Application Ser. No. 60/204,702 filed May 16, 2000, the entireties of which are incorporated herein by reference.

BACKGROUND OF THE INVENTION

1. Field of the Invention

The present invention relates to a piezoelectric/electrostrictive device which is provided with a movable section to be operated on the basis of a displacement action of a piezoelectric/electrostrictive element, or a piezoelectric/electrostrictive device which is capable of detecting displacement of a movable section by the aid of a piezoelectric/electrostrictive element, and a method for producing the same. In particular, the present invention relates to a piezoelectric/electrostrictive device which is excellent in strength, shock resistance, and moisture resistance and which makes it possible to efficiently operate a movable section to a great extent, and a method for producing the same.

2. Description of the Related Art

Recently, a displacement element, which makes it possible to adjust the optical path length and the position in an order of submicron, is required, for example, in the fields of optical science, magnetic recording, and precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material).

As shown in FIG. 53, for example, those hitherto disclosed as such a displacement element include a piezoelectric actuator comprising a fixation section 404, a movable section 406, and a beam section 408 for supporting them which are formed in an integrated manner with a hole 402 provided through a plate-shaped member 400 composed of a piezoelectric/electrostrictive material and with an electrode layer 410 provided on the beam section 408 (see, for example, Japanese Laid-Open Patent Publication No. 10-136665).

The piezoelectric actuator is operated such that when a voltage is applied to the electrode layer 410, the beam section 408 makes extension and contraction in a direction along a line obtained by connecting the fixation section 404 and the movable section 406 in accordance with the inverse piezoelectric effect or the electrostrictive effect. Therefore, the movable section 406 can perform circular arc-shaped displacement or rotational displacement in the plane of the plate-shaped member 400.

On the other hand, Japanese Laid-Open Patent Publication No. 63-64640 discloses a technique in relation to an actuator based on the use of a bimorph. In this technique, electrodes for the bimorph are provided in a divided manner. The divided electrodes are selectively driven, and thus the highly accurate positioning is performed at a high speed. This patent document (especially in FIG. 4) discloses a structure in which, for example, two bimorphs are used in an opposed manner.

However, the piezoelectric actuator described above involves such a problem that the amount of operation of the movable section 406 is small, because the displacement in the direction of extension and contraction of the piezoelectric/electrostrictive material (i.e., in the in-plane direction of the plate-shaped member 400) is transmitted to the movable section 406 as it is.

All of the parts of the piezoelectric actuator are made of the piezoelectric/electrostrictive material which is a fragile material having a relatively heavy weight. Therefore, the following problems arise. That is, the mechanical strength is low, and the piezoelectric actuator is inferior in handling performance, shock resistance, and moisture resistance. Further, the piezoelectric actuator itself is heavy, and its operation tends to be affected by harmful vibrations (for example, residual vibration and noise vibration during high speed operation).

In order to solve the problems described above, it has been suggested that the hole 402 is filled with a filler material having flexibility. However, it is clear that the amount of displacement, which is brought about by the inverse piezoelectric effect or the electrostrictive effect, is decreased even when the filler material is merely used.

SUMMARY OF THE INVENTION

The present invention has been made taking the foregoing problems into consideration, an object of which is to provide a piezoelectric/electrostrictive device and a method for producing the same which make it possible to obtain a displacement element that is scarcely affected by harmful vibration and capable of high speed response with high mechanical strength while being excellent in handling performance, shock resistance, and moisture resistance, making it possible to realize a long life time of a device, and improve the handling performance of the device and the attachment performance for parts to be attached to the movable section or the fixation performance of the device, so that the movable section may be greatly displaced at a relatively low voltage, and it is possible to achieve a high speed of the displacement action of the device, especially of the movable section (realization of a high resonance frequency), as well as a sensor element which makes it possible to accurately detect vibration of the movable section.

According to the present invention, there is provided a piezoelectric/electrostrictive device comprising at least an actuator section including a stacked type piezoelectric/electrostrictive element secured onto a thin plate section made of metal with an adhesive intervening therebetween; wherein an actuator film of the stacked type piezoelectric/electrostrictive element, which is composed of piezoelectric/electrostrictive layers and electrode films, is constructed by a multilayered member including at least three layers or more.

Accordingly, the thin plate section can be displaced to a great extent even when the areal size of the stacked type piezoelectric/electrostrictive element is not widened on the plane. Further, the piezoelectric/electrostrictive device is excellent in strength and toughness, because the thin plate section is made of metal. Further, it is possible to correspond to the quick displacement action.

In other words, according to the present invention, it is possible to sufficiently respond to any variation of the environment of use and any severe state of use. The piezoelectric/electrostrictive device is excellent in shock resistance, and it is possible to realize a long life time of the piezoelectric/electrostrictive device and improve the handling performance of the piezoelectric/electrostrictive device. Further, the thin plate section can be greatly displaced at a relatively low voltage. The rigidity of the thin plate section is high, the film thickness of the actuator film is thick, and the rigidity thereof is high. Therefore, it is possible to achieve a high speed of the displacement action of the thin plate section (realize a high resonance frequency).

It is preferable that the plurality of electrode films, which are included in the multilayered member for constructing the piezoelectric/electrostrictive element, are stacked to have alternate end surfaces, and they are connected so that an identical voltage is applied to every other layer. It is preferable that the actuator film is composed of the multilayered member having ten layers or less. It is preferable that the actuator film is formed by means of a multilayer printing method. Further, it is preferable that a positional discrepancy in an in-plane direction, which possibly occurs on a perpendicular projection plane of each of the electrode films disposed as every other layer, is not more than 50 μm. It is preferable that the adhesive has a thickness of not more than 15 μm.

In the present invention, it is also preferable that an underlying layer is formed on a surface of the piezoelectric/electrostrictive element opposed to the thin plate section. It is also preferable that one or more holes or recesses are formed at least at a portion of the thin plate section at which the piezoelectric/electrostrictive element is formed. In this arrangement, the adhesive enters the interior of the hole or the recess, and hence the adhesion area is substantially increased. Further, it is possible to achieve a thinner adhesive layer. It is also preferable that at least a portion of a surface of the thin plate section, on which the piezoelectric/electrostrictive element is formed, is a rough surface. In this arrangement, the adhesion area is substantially increased, and hence the adhesion can be tightly effected.

According to another aspect of the present invention, there is provided a piezoelectric/electrostrictive device comprising a pair of mutually opposing thin plate sections made of metal and a fixation section for supporting the thin plate sections, and including an actuator section with a stacked type piezoelectric/electrostrictive element fixed on at least one of the thin plate sections by the aid of an adhesive; wherein the stacked type piezoelectric/electrostrictive element is composed of a plurality of piezoelectric/electrostrictive layers and electrode films; and the electrode films, which contact with upper and lower surfaces of the respective piezoelectric/electrostrictive layers, are alternately led to opposite end surfaces, and end surface electrodes, which electrically connect the respective electrode films alternately led to the opposite end surfaces, are electrically connected to terminals which are provided on a surface of an outermost layer of the piezoelectric/electrostrictive layer and which are arranged while being separated from each other by a predetermined distance respectively. Accordingly, the driving signal can be easily supplied, and the detection signal can be easily obtained with respect to the stacked piezoelectric/electrostrictive element. It is possible to realize the formation of the stacked type piezoelectric/electrostrictive element on the thin plate section.

In the invention described above, it is also preferable that the stacked type piezoelectric/electrostrictive element has a substantially rectangular parallelepiped-shaped configuration. It is preferable that the predetermined distance between the terminals is not less than 50 μm. It is also preferable that at least one of the terminals and one of the end surface electrodes are electrically connected with each other with an electrode film having a film thickness which is thinner than those of the terminal and the end surface electrode.

According to still another aspect of the present invention, there is provided a piezoelectric/electrostrictive device includes a pair of mutually opposing thin plate sections, and a fixation section for supporting the thin plate sections; and one or more piezoelectric/electrostrictive elements arranged on at least one thin plate section of the pair of thin plate sections; wherein a minimum resonance frequency of the device structure, which is obtained when an object member having a size substantially equivalent to that of the fixation section exists between open ends of the pair of thin plate sections, is not less than 20 kHz, and a relative displacement amount between the object member and the fixation section is not less than 0.5 μm at a substantial applied voltage of 30 V at a frequency which is not more than ¼ of the resonance frequency.

Accordingly, it is possible to greatly displace the pair of thin plate sections. Further, it is possible to achieve realization of a high speed (realization of a high resonance frequency) for the displacement action of the device, especially of the pair of thin plate sections. Furthermore, it is possible to obtain a displacement element which is scarcely affected by harmful vibration, which is capable of performing high speed response, which has high mechanical strength, and which is excellent is handling performance, shock resistance, and moisture resistance. Moreover, it is possible to obtain a sensor element which makes it possible to accurately detect the vibration of the movable section.

At least the thin plate section and the fixation section may be constructed by using ceramics or metal. The respective components may be constructed with ceramic materials, or they may be constructed with metal materials. Further, the respective components may be constructed as a hybrid structure obtained by combining those produced from ceramic and metal materials.

It is preferable that when an adhesive intervenes between the piezoelectric/electrostrictive element and the thin plate section, the adhesive has a thickness which is not more than 10% of a thickness of the piezoelectric/electrostrictive element. It is preferable that when one or more piezoelectric/electrostrictive elements are arranged on one thin plate section of the pair of thin plate sections, a thickness of the one thin plate section is thicker than a thickness of the other thin plate section.

It is preferable that when the object member intervenes between the open ends of the pair of thin plate sections, then a distance concerning the pair of thin plate sections between a boundary portion with respect to the object member and a boundary portion with respect to the fixation section is not less than 0.4 mm and not more than 2 mm, and each of the pair of thin plate sections has a thickness which is not less than 10 μm and not more than 100 μm.

It is preferable that the piezoelectric/electrostrictive element is constructed by multilayered member including at least three or more actuator films, which is composed of piezoelectric/electrostrictive layers and electrode films. In this arrangement, it is preferable that the actuator film is composed of the multilayered member having ten layers or less. Further, it is preferable that the piezoelectric/electrostrictive layer has a thickness which is not less than 5 μm and not more than 30 μm. It is preferable that the electrode film has a thickness which is not less than 0.5 μm and not more than 20 μm.

It is preferable that the plurality of electrode films, which are included in the multilayered member for constructing the piezoelectric/electrostrictive element, are stacked alternately, and they are connected so that an identical voltage is applied to every other layer.

Especially, when the thin plate section is made of metal, the piezoelectric/ electrostrictive element is formed such that only the piezoelectric/electrostrictive layer of the first layer, or the electrode film of the first layer and the piezoelectric/electrostrictive layer of the first layer, of the multilayered member for constructing the piezoelectric/electrostrictive element make contact with the thin plate section. By doing so, it is possible to avoid the phenomenon of short circuit formation between the different electrodes.

It is also preferable that one of ends of the electrode layer is formed at a position not including at least the fixation section as viewed in plan view. It is also preferable that an end of the multilayered member for constructing the piezoelectric/electrostrictive element is formed at a position not including at least the fixation section as viewed in plan view.

It is preferable that (1-Lb/La) is not less than 0.4, provided that La represents a shortest distance concerning the pair of thin plate sections between a boundary portion with respect to the object member and a boundary portion with respect to the fixation section, and Lb represents a shortest distance of distances from the boundary portion between the thin plate section and one of the object member and the fixation section on which the multilayered member for constructing the piezoelectric/electrostrictive element is not formed, to an end of the electrode film. More preferably (1-Lb/La) is 0.5 to 0.8.

It is preferable that when the thin plate section is made of metal, the thin plate section is composed of a metal plate subjected to a cold rolling process.

It is also preferable that an adhesive, which has a thickness of not less than 0.1 μm and not more than 30 μm, is allowed to intervene between the thin plate section and the multilayered member for constructing the piezoelectric/electrostrictive element. In this arrangement, the adhesive may be organic resin, or the adhesive may be glass, brazing material, or solder.

It is also preferable that an underlying layer is formed on a surface of the multilayered member opposed to the thin plate section. It is also preferable that one or more holes or recesses are formed at least at a portion of the thin plate section at which the multilayered member is formed. In this arrangement, the adhesive enters the inside of the hole and the recess, and hence the adhesion area is substantially increased. Further, it is possible to use a thinner adhesive layer. It is also preferable that at least a portion of a surface of the thin plate section, on which the multilayered member is formed, is a rough surface. In this arrangement, the adhesion area is substantially increased, and hence the adhesion can be tightly effected. It is preferable that an adhesive, which has a thickness of not less than 0.1 μm and not more than 30 μm, is allowed to intervene between the thin plate section and at least the fixation section. In this arrangement, the adhesive may be organic resin, or the adhesive may be glass, brazing material, or solder.

It is preferable that a stick-out shape of the adhesive, which protrudes from an opposing portion between the thin plate section and at least the fixation section, has a curvature. In this arrangement, the inner wall of the fixation section and the inner wall of each of the thin plate sections are used as the adhesion surface. Therefore, the adhesion area is increased, and it is possible to increase the adhesion strength. Further, the concentration of the stress, which would be otherwise caused on the joined portion (angular portion) between the inner wall of the fixation section and the inner wall of each of the thin plate sections, can be effectively dispersed.

It is preferable that when an object member intervenes between open ends of the pair of thin plate sections, at least an angular portion of the fixation section opposed to the object member is chamfered. In this arrangement, the stick-out amount of the adhesive can be stabilized by appropriately adjusting the chamfering angle and the radius of curvature. Further, it is possible to suppress the local dispersion of the adhesion strength. Thus, it is possible to improve the yield. It is preferable that when the thin plate section is manufactured by means of stamping for a metal plate, a burr, which is brought about by the stamping, is directed outwardly, considering the handling performance and the direction of adhesion of the respective members.

According to still another aspect of the present invention, there is provided a method for producing a piezoelectric/electrostrictive device comprising a pair of mutually opposing thin plate sections, and a fixation section for supporting the thin plate sections; and one or more piezoelectric/electrostrictive elements arranged on at least one thin plate section of the pair of thin plate sections; the method includes the steps of preparing a plurality of thin plates for forming at least the thin plate sections thereafter, the piezoelectric/electrostrictive element, and a support substrate; securing the piezoelectric/electrostrictive element to at least one of the thin plates by the aid of a first adhesive; securing the plurality of thin plates to the support substrate by the aid of a second adhesive to manufacture a master device block including the plurality of thin plates disposed opposingly; and dividing the master device block into a plurality of chips to manufacture individuals of the piezoelectric/electrostrictive devices.

According to still another aspect of the present invention, there is provided a method for producing a piezoelectric/electrostrictive device including a pair of mutually opposing thin plate sections, and a fixation section for supporting the thin plate sections; and one or more piezoelectric/electrostrictive elements arranged on at least one thin plate section of the pair of thin plate sections; the method including the steps of preparing a plurality of thin plates for forming at least the thin plate sections thereafter, the piezoelectric/electrostrictive element, and a support substrate; securing the plurality of thin plates to the support substrate by the aid of a second adhesive to manufacture a master device block including the plurality of thin plates disposed opposingly; securing the piezoelectric/electrostrictive element to at least one of the thin plates by the aid of a first adhesive; and dividing the master device block into a plurality of chips to manufacture individuals of the piezoelectric/electrostrictive devices.

According to the production methods as described above, it is possible to easily produce the piezoelectric/electrostrictive device in which the pair of thin plate sections can be greatly displaced, and it is possible to achieve realization of the high speed (realization of the high resonance frequency) of the device, especially of the displacement action of the pair of thin plate sections.

It is also preferable in the production method described above that when an object member intervenes between open ends of the pair of thin plate sections of the piezoelectric/electrostrictive device to be produced; the support substrate is a rectangular annular structure having a portion to be formed into at least the object member thereafter, and a portion to be formed into the fixation section thereafter.

Alternatively, it is also preferable in the production method described above that when an object member does not intervene between open ends of the pair of thin plate sections of the piezoelectric/electrostrictive device to be produced; the support substrate is a rectangular annular structure having a portion for supporting the open ends (portion to substantially define the thickness of a portion for allowing at least the object member to intervene thereafter), and a portion to be formed into the fixation section thereafter.

The first adhesive and/or the second adhesive may be organic resin, or the first adhesive and/or the second adhesive may be glass, brazing material, or solder. On the other hand, the thin plates and/or the support substrate may be made of metal.

It is preferable that when the step of dividing the master device block includes a treatment for cutting the master device block along predetermined cutting lines; the cutting is performed in substantially the same direction as a displacement direction of the pair of thin plate sections.

Further, it is also preferable that the production method according to the present invention further includes the step of forming an underlying layer on a surface of the piezoelectric/electrostrictive element opposed to the thin plate before securing the piezoelectric/electrostrictive element to the thin plate by the aid of the first adhesive. It is also preferable that the production method according to the present invention further includes the step of forming one or more holes or recesses at least at a portion of the thin plate to which the piezoelectric/electrostrictive element is secured.

It is also preferable that at least a portion of a surface of the thin plate, to which the piezoelectric/electrostrictive element is secured, is roughened. It is also preferable to form a curvature for a stick-out shape of the second adhesive protruding from an opposing portion between the thin plate and the support substrate.

It is also preferable to chamfer mutually opposing angular portions of the support substrate of the master device block. It is also preferable that the method further comprises the step of manufacturing the thin plate by means of stamping for a metal plate; wherein when the master device block is produced by combining the thin plate with the support substrate, a burr, which is brought about on the thin plate due to the stamping, is directed outwardly to produce the master device block.

Therefore, the piezoelectric/electrostrictive device according to the present invention can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device according to the present invention can be preferably utilized for various actuators to be used for the mechanism for adjusting the displacement and the positioning and for adjusting the angle for various precision parts such as those of optical instruments and precision mechanical equipments.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 13A shows a waveform illustrating a voltage waveform to be applied to the first piezoelectric/electrostrictive element;

FIG. 13B shows a waveform illustrating a voltage waveform to be applied to the second piezoelectric/electrostrictive element;

FIG. 17A illustrates a state in which the ceramic green stack is sintered to provide a ceramic stack;

FIG. 17B illustrates a state in which piezoelectric/electrostrictive elements, which are constructed as separate members, are glued to the surfaces of metal plates to serves as thin plate sections respectively;

FIG. 21A illustrates a state in which the ceramic green stack is sintered to provide a ceramic stack, and then a hole is filled with a filler material;

FIG. 21B illustrates a state in which metal plates to serve as thin plate sections respectively are glued to the ceramic stack to provide a hybrid stack;

FIG. 41 illustrates a state in which first and second stainless steel thin plates are glued to another exemplary substrate by the aid of an adhesive;

DETAILED DESCRIPTION OF THE INVENTION

Explanation will be made below with reference to FIGS. 1 to 52 for illustrative embodiments of the piezoelectric/electrostrictive device and the production method for the same according to the present invention.

It is noted that the piezoelectric/electrostrictive device resides in a concept which includes the element for mutually converting the electric energy and the mechanical energy by the aid of the piezoelectric/electrostrictive element. Therefore, the piezoelectric/electrostrictive device is most preferably used as the active element such as various actuators and vibrators, especially as the displacement element based on the use of the displacement brought about by the inverse piezoelectric effect or the electrostrictive effect. Additionally, the piezoelectric/electrostrictive device is also preferably used as the passive element such as acceleration sensor elements and shock sensor elements.

Figure 1:
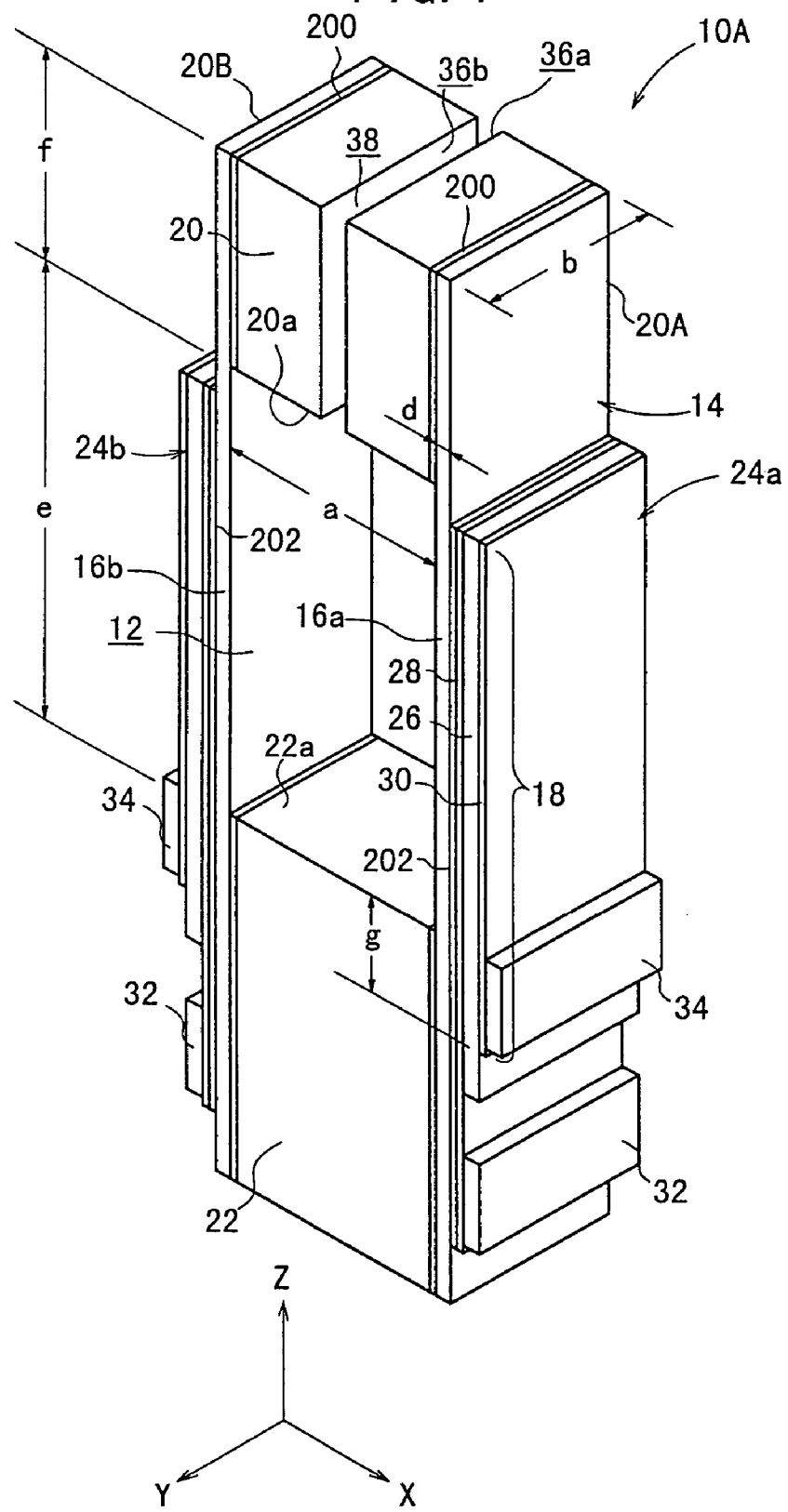
FIG. 1 shows a perspective view illustrating an arrangement of a piezoelectric/electrostrictive device according to a first embodiment.

As shown in FIG. 1, the piezoelectric/electrostrictive device 10A according to the first embodiment has a substrate 14 which has a lengthy rectangular parallelepiped-shaped configuration as a whole and which has a hole 12 provided at an approximately central portion in the major axis direction thereof.

The substrate 14 comprises a pair of mutually opposing thin plate sections 16a, 16b, a movable section 20, and a fixation section 22 for supporting the pair of thin plate sections 16a, 16b and the movable section 20. Piezoelectric/electrostrictive elements 24a, 24b are formed at respective parts of at least the thin plate sections 16a, 16b respectively.

The substrate 14 may be constructed by using ceramics or metal for the entire substrate 14. Alternatively, the substrate 14 may have a hybrid structure obtained by combining those produced with ceramic and metal materials. Further, those adoptable for constructing the substrate 14 include, for example, a structure in which respective parts are glued to one another with an adhesive such as organic resin and glass, and a metal integrated structure which is integrated into one unit, for example, by means of brazing, soldering, eutectic bonding, or welding.

In the first embodiment, the substrate 14 has a hybrid structure in which the pair of thin plate sections 16a, 16b are made of metal, and the other parts, i.e., the movable section 20 and the fixation section 22 are made of ceramics. Specifically, the thin plate sections 16a, 16b made of metal are secured by an adhesive 200 to respective side surfaces of the movable section 20 and the fixation section 22 made of ceramics. It is a matter of course that all of the thin plate sections 16a, 16b, the movable section 20, and the fixation section 22 may be made of metal.

The piezoelectric/electrostrictive elements 24a, 24b are prepared as separate members as described later on, and the prepared piezoelectric/electrostrictive elements 24a, 24b are affixed to the substrate 14 with an adhesive such as organic resin or glass or by means of brazing, soldering, or eutectic bonding. Alternatively, the piezoelectric/electrostrictive elements 24a, 24b are directly formed on the substrate 14 by using the film formation method not by using the sticking method described above. In the first embodiment, the piezoelectric/electrostrictive elements 24a, 24b are secured onto the thin plate sections 16a, 16b by the aid of an adhesive 202 respectively.

The piezoelectric/electrostrictive device 10A includes the hole 12 having, for example, a rectangular configuration which is formed by both inner walls of the pair of thin plate sections 16a, 16b, an inner wall 20a of the movable section 20, and an inner wall 22a of the fixation section 22. The piezoelectric/electrostrictive device 10A is constructed such that the movable section 20 is displaced in accordance with the driving of the piezoelectric/electrostrictive element or elements 24a and/or 24b, or the displacement of the movable section 20 is detected by the piezoelectric/electrostrictive element or elements 24a and/or 24b.

Each of the piezoelectric/electrostrictive elements 24a, 24b includes a piezoelectric/electrostrictive layer 26, and a pair of electrodes 28, 30 formed on both sides of the piezoelectric/electrostrictive layer 26. One electrode 28 of the pair of electrodes 28, 30 is formed at least on each of the pair of thin plate sections 16a, 16b.

In the embodiment shown in FIG. 1, respective forward end surfaces of the pair of electrodes 28, 30 and the piezoelectric/electrostrictive layer 26 for constructing the piezoelectric/electrostrictive element 24a, 24b are substantially aligned. A substantial driving portion 18 of the piezoelectric/electrostrictive element 24a, 24b (portion at which the pair of electrodes 28, 30 are overlapped with each other with the piezoelectric/electrostrictive layer 26 interposed therebetween) is continuously formed over a range from a part of the outer circumferential surface of the fixation section 22 to a part of the outer circumferential surface of the thin plate section 16a, 16b. Especially, in this embodiment, the respective forward end surfaces of the pair of electrodes 28, 30 are located at the positions slightly deviated rearwardly from the inner wall 20a of the movable section 20. Of course, the piezoelectric/electrostrictive element 24a, 24b may be formed such that the substantial driving portion 18 is located over a range from a part of the movable section 20 to a part of the thin plate section 16a, 16b.

Figure 12:
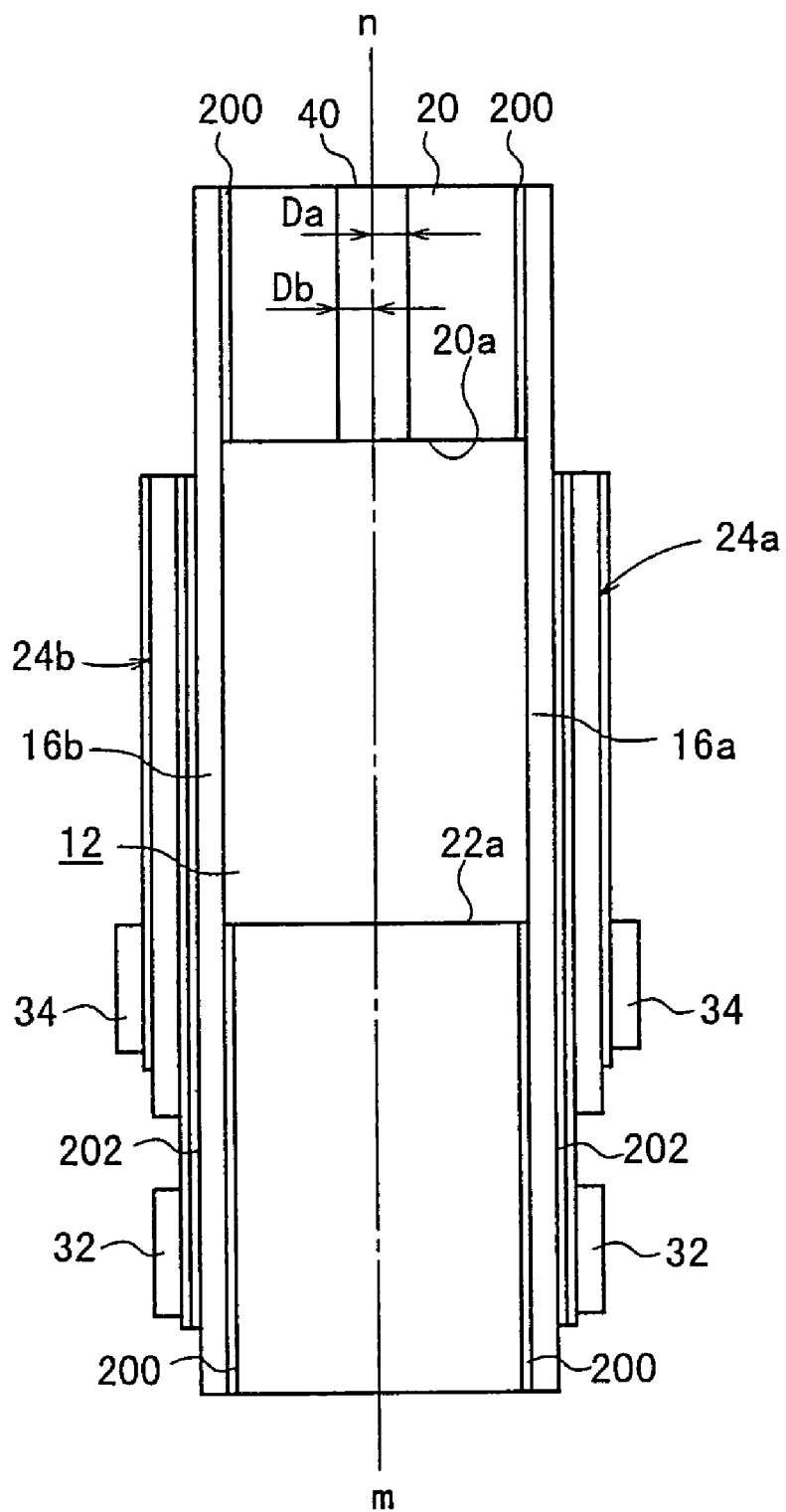
FIG. 12 illustrates a situation in which both of the piezoelectric/electrostrictive elements do not make the displacement action in the piezoelectric/electrostrictive device according to the first embodiment.

As shown in FIG. 1, the piezoelectric/electrostrictive device 10A according to the first embodiment described above includes mutually opposing end surfaces 36a, 36b which are formed in the movable section 20. Each of the end surfaces 36a, 36b is a surface substantially parallel to the side surface of the movable section 20, i.e., the surface for forming the element. The respective end surfaces 36a, 36b are separated from each other from the upper surface of the movable section 20 to the hole 12. In this arrangement, as shown in FIG. 12, for example, it is preferable that the distances Da, Db, which range from the central axis n of the movable section 20 to the respective end surfaces 36a, 36b, are substantially equal to one another.

As shown in FIG. 1, for example, a gap (air) 38 may be allowed to intervene between the end surfaces 36a, 36b. Alternatively, as in a piezoelectric/electrostrictive device 10Ag according to a seventh modified embodiment shown in FIG. 9 or as shown in FIG. 12, a member different from the constitutive member of the movable section 20, for example, a member 40 composed of, for example, resin or the like may be allowed to intervene between the end surfaces 36a, 36b.

In the piezoelectric/electrostrictive device 10A according to the first embodiment, the voltage is applied to the pair of electrodes 28, 30 via terminals (pads) 32, 34 of the respective electrodes 28, 30 formed on both side surfaces (element formation surfaces) of the fixation section 22 respectively. The respective terminals 32, 34 are positioned as follows. That is, the terminal 32 corresponding to the first electrode 28 is formed at the position deviated toward the rearward end of the fixation section 22. The terminal 34 corresponding to the second electrode 30 disposed on the side of the external space is formed at the position deviated toward the inner wall 22a of the fixation section 22.

In this embodiment, the piezoelectric/electrostrictive device 10A can be individually fixed by utilizing the surfaces respectively different from the surfaces on which the terminals 32, 34 are arranged. As a result, it is possible to obtain the high reliability for both of the fixation of the piezoelectric/electrostrictive device 10A and the electric connection between the circuit and the terminals 32, 34. In this arrangement, the electric connection between the terminals 32, 34 and the circuit is made, for example, by means of the flexible printed circuit (also referred to as FPC), the flexible flat cable (also referred to as FFC), and the wire bonding.

Figure 2:
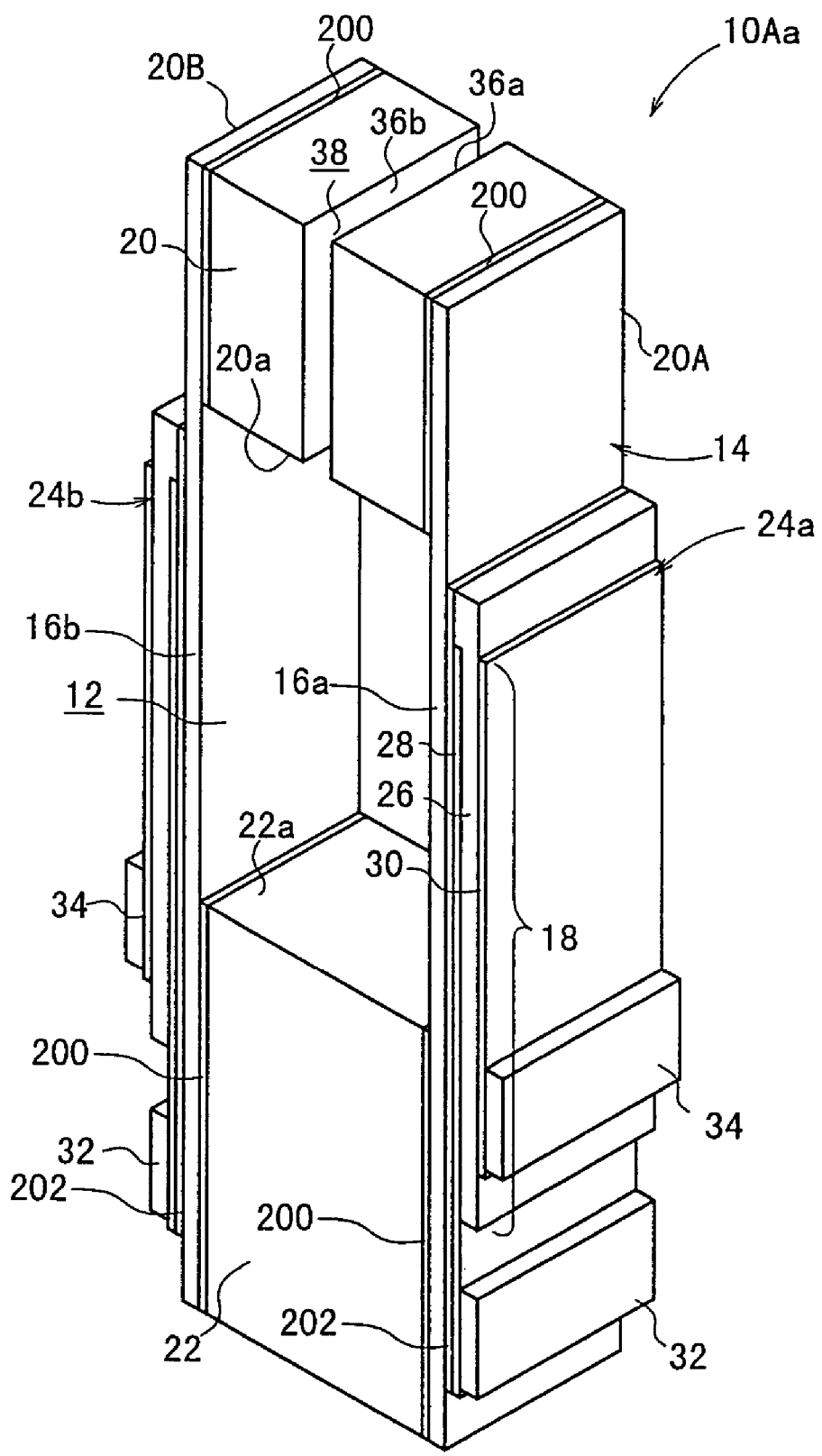
FIG. 2 shows a perspective view illustrating a first modified embodiment of the piezoelectric/electrostrictive device according to the first embodiment.
Figure 3:
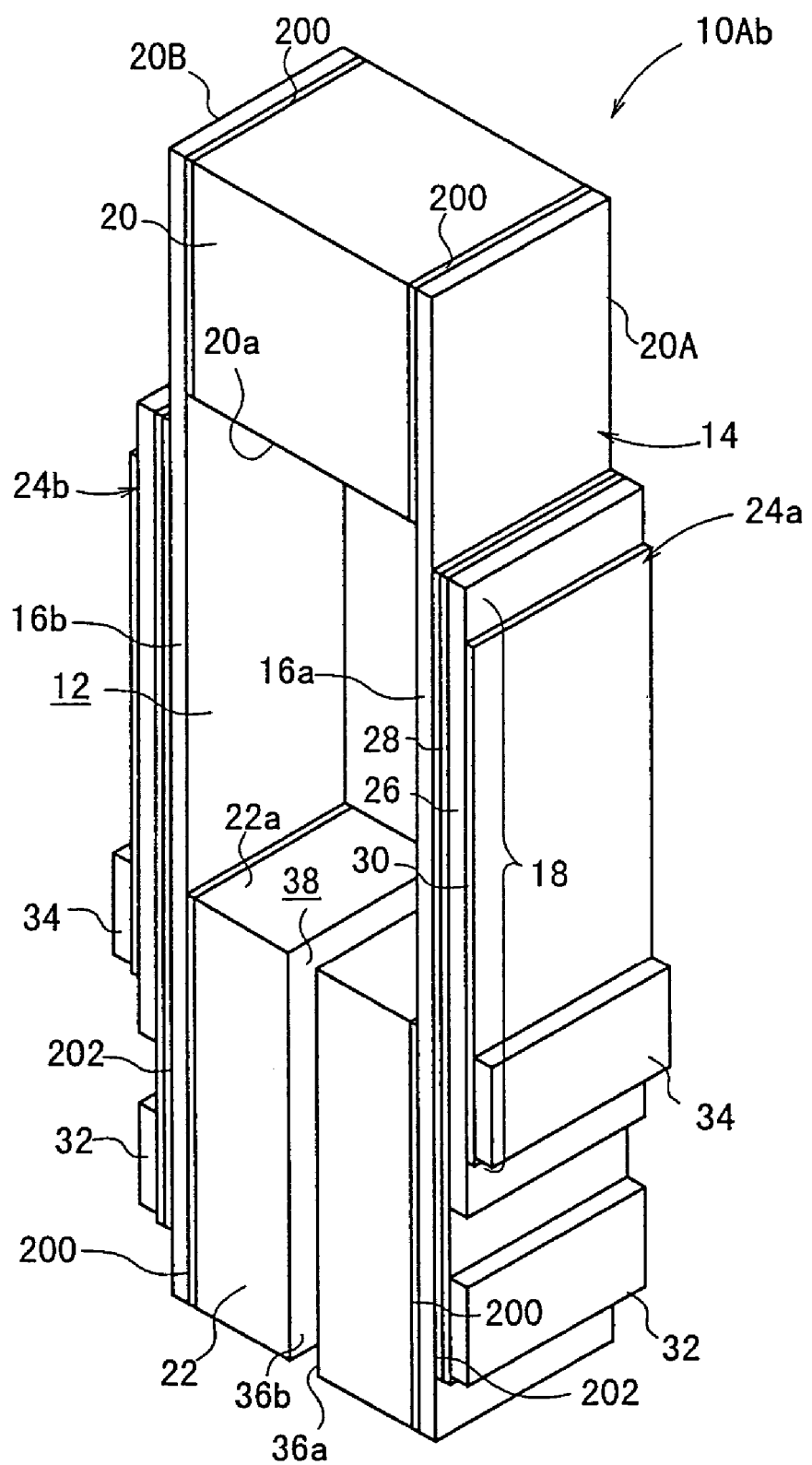
FIG. 3 shows a perspective view illustrating a second modified embodiment of the piezoelectric/electrostrictive device according to the first embodiment.

Structures other than the structure shown in FIG. 1 are available to construct the piezoelectric/electrostrictive element 24a, 24b. That is, as in a piezoelectric/electrostrictive device 10Aa according to a first modified embodiment shown in FIG. 2, it is also preferable that the respective forward ends of the pair of electrodes 28, 30 for constructing the piezoelectric/electrostrictive element 24a, 24b are aligned, and only the forward end of the piezoelectric/electrostrictive layer 26 is allowed to protrude toward the movable section 20. Alternatively, as in a piezoelectric/electrostrictive device 10Ab according to a second modified embodiment shown in FIG. 3, it is also preferable that the respective forward ends of the first electrode 28 and the piezoelectric/electrostrictive layer 26 are aligned, and only the forward end of the second electrode 30 is disposed at a position deviated toward the fixation section 22. The piezoelectric/electrostrictive device 10Ab shown in FIG. 3 is illustrative of the case in which mutually opposing end surfaces 36a, 36b are provided in the fixation section 22 in place of the movable section 20.

Figure 4:
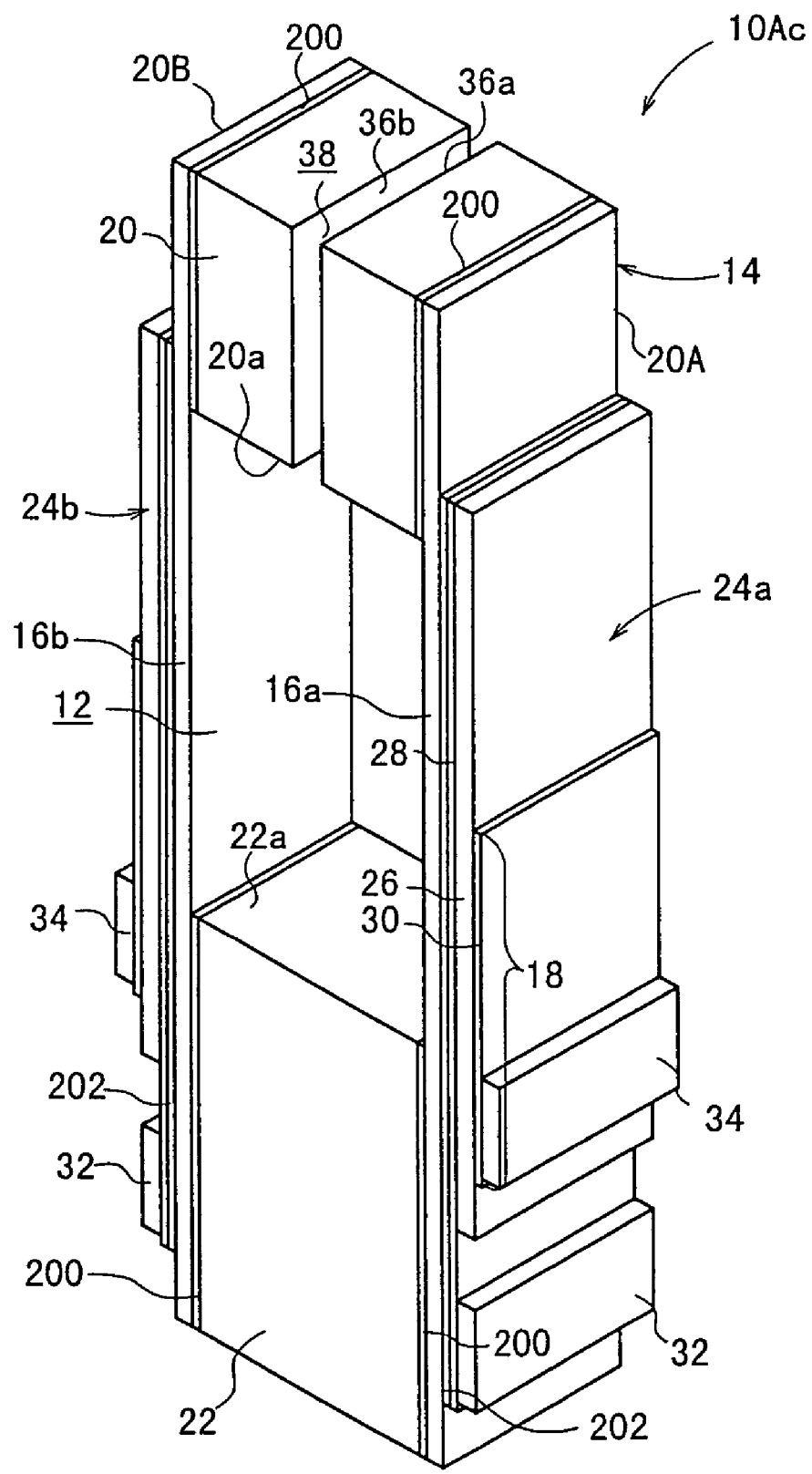
FIG. 4 shows a perspective view illustrating a third modified embodiment of the piezoelectric/electrostrictive device according to the first embodiment.

Alternatively, as in a piezoelectric/electrostrictive device 10Ac according to a third modified embodiment shown in FIG. 4, it is also preferable that the respective forward ends of the first electrode 28 and the piezoelectric/electrostrictive layer 26 are allowed to extend up to the side surface of the movable section 20, and the forward end of the second electrode 30 is located at an approximately central portion in the length direction (Z axis direction) of the thin plate section 16a, 16b.

In the embodiments described above, the piezoelectric/electrostrictive element 24a, 24b is constructed by the piezoelectric/electrostrictive layer 26 having the one-layered structure and the pair of electrodes 28, 30. Alternatively, it is also preferable that the piezoelectric/electrostrictive element 24a, 24b is constructed in a stacked form composed of a plurality of units each comprising the piezoelectric/electrostrictive layer 26 and the pair of electrodes 28, 30.

Figure 5:
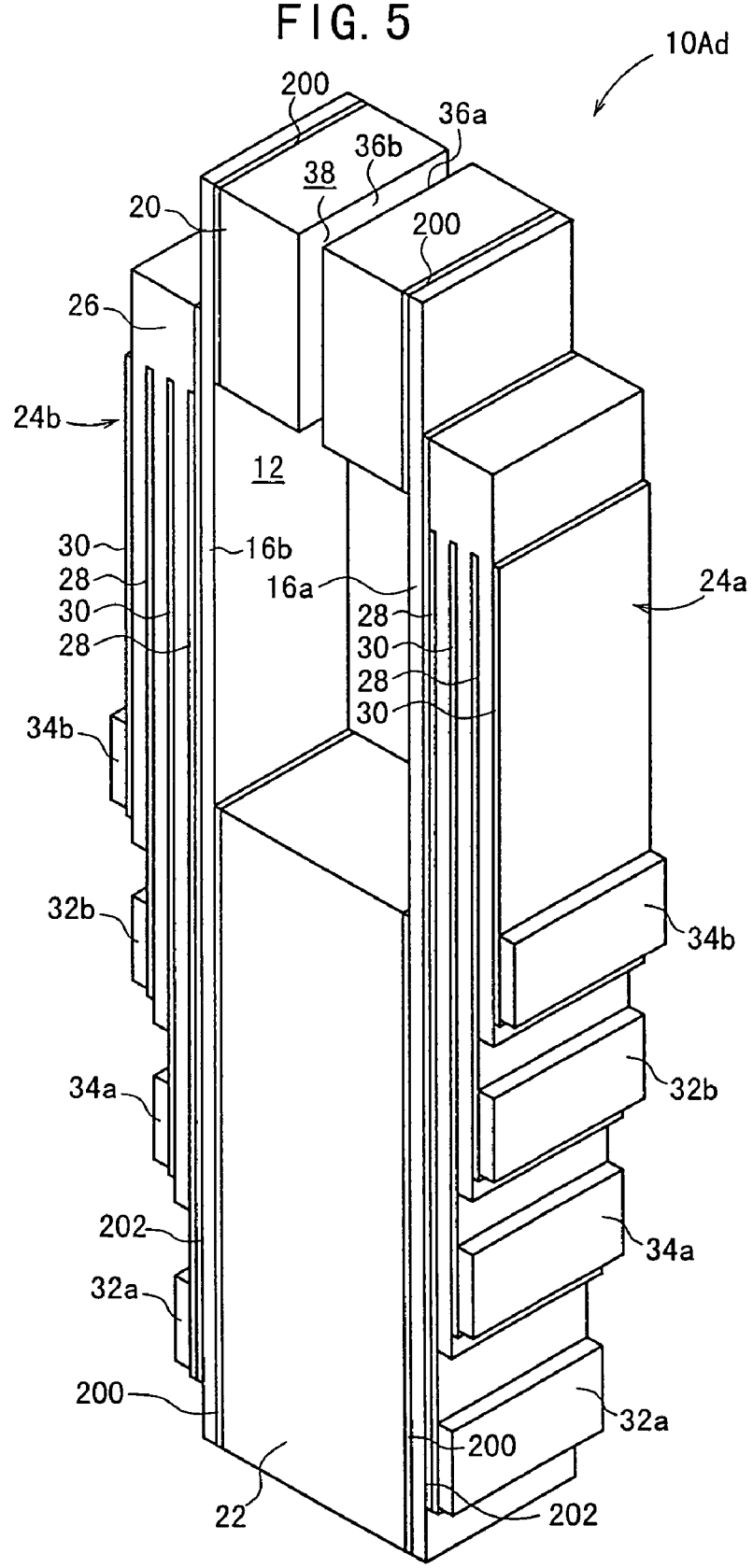
FIG. 5 shows a perspective view illustrating a fourth modified embodiment of the piezoelectric/electrostrictive device according to the first embodiment.

For example, as in a piezoelectric/electrostrictive device 10Ad according to a fourth modified embodiment shown in FIG. 5, each of the piezoelectric/electrostrictive layer 26 and the pair of electrodes 28, 30 resides in a multilayered structure. The first electrodes 28 and the second electrodes 30 are alternately stacked with each other to provide the piezoelectric/electrostrictive element 24a, 24b which has a multiple stage structure at a portion (substantial driving portion 18) at which the first electrodes 28 and the second electrodes 30 are overlapped with each other with the piezoelectric/electrostrictive layer 26 interposed therebetween. FIG. 5 is illustrative of the following case. That is, the piezoelectric/electrostrictive layer 26 has the three-layered structure. The first electrodes 28 are formed in a separate manner respectively on the lower surface of the first layer (side surface of the thin plate section 16a, 16b) and on the upper surface of the second layer. The second electrodes 30 are formed in a separate manner respectively on the upper surface of the first layer and on the upper surface of the third layer. Further, terminals 32a, 32b are provided on respective ends of the first electrodes 28 respectively, and terminals 34a, 34b are provided on respective ends of the second electrodes 30 respectively.

Figure 6:
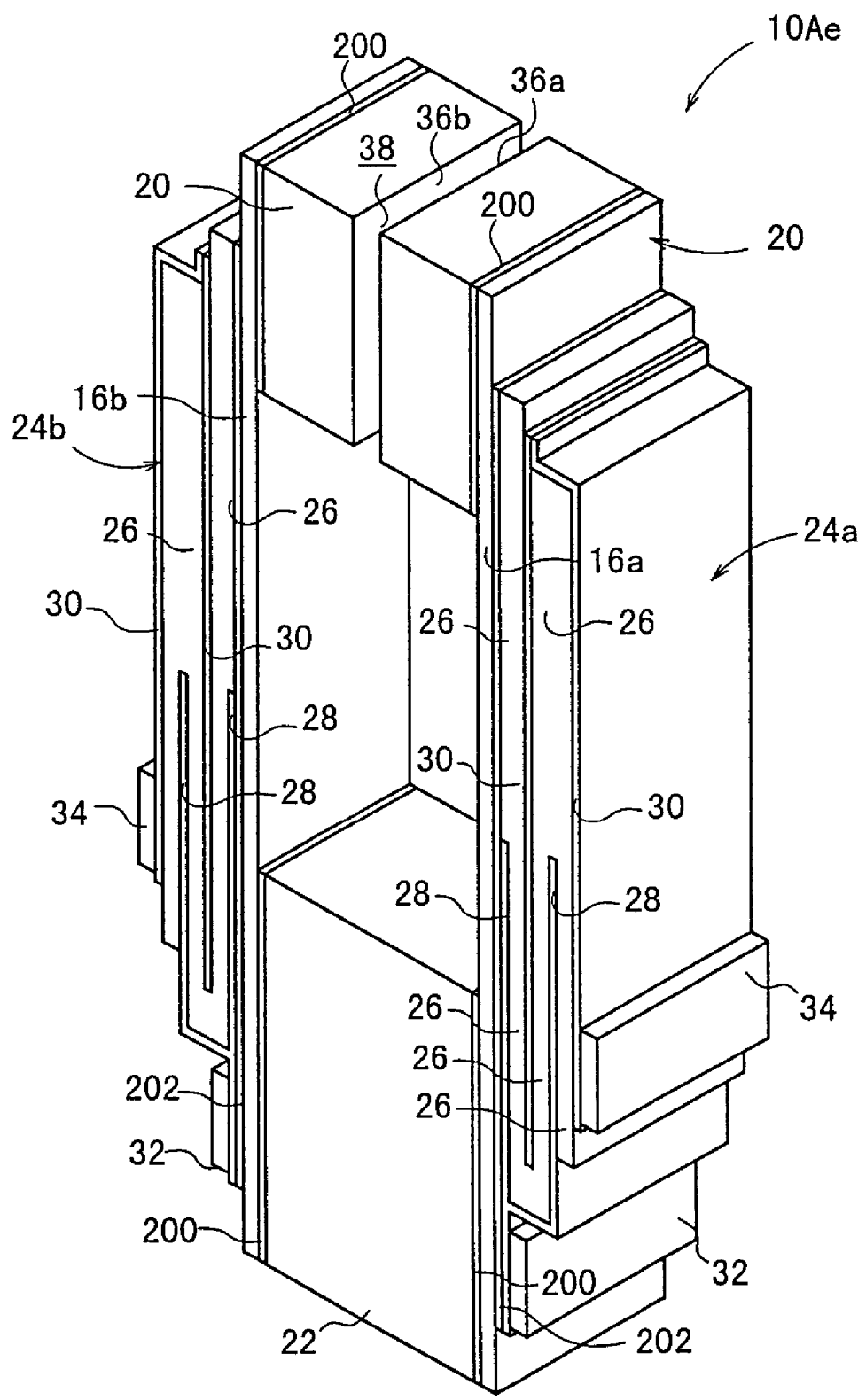
FIG. 6 shows a perspective view illustrating a fifth modified embodiment of the piezoelectric/electrostrictive device according to the first embodiment.

As in a piezoelectric/electrostrictive device 10Ae according to a fifth modified embodiment shown in FIG. 6, each of the piezoelectric/electrostrictive layer 26 and the pair of electrodes 28, 30 resides in a multilayered structure. The first electrode 28 and the second electrode 30 are alternately stacked with each other so that a substantially comb-shaped configuration is obtained in cross section to provide the piezoelectric/electrostrictive element 24a, 24b which has a multiple stage structure at a portion (substantial driving portion 18) at which the first electrode 28 and the second electrode 30 are overlapped with each other with the piezoelectric/electrostrictive layer 26 interposed therebetween. FIG. 6 is illustrative of the following case. That is, the piezoelectric/electrostrictive layer 26 has the three-layered structure. The first electrode 28 is formed in a comb-shaped configuration to be located on the lower surface of the first layer (side surface of the thin plate section 16a, 16b) and on the upper surface of the second layer. The second electrode 30 is formed in a comb-shaped configuration to be located on the upper surface of the first layer and on the upper surface of the third layer. In the case of this structure, each of the first electrode 28 and the second electrode 30 is continuous and common. Accordingly, it is possible to decrease the number of terminals 32, 34 as compared with the structure shown in FIG. 5. Therefore, it is possible to suppress the increase in size which would be otherwise involved in the multilayered structure of the piezoelectric/electrostrictive element 24a, 24b.

Figure 7:
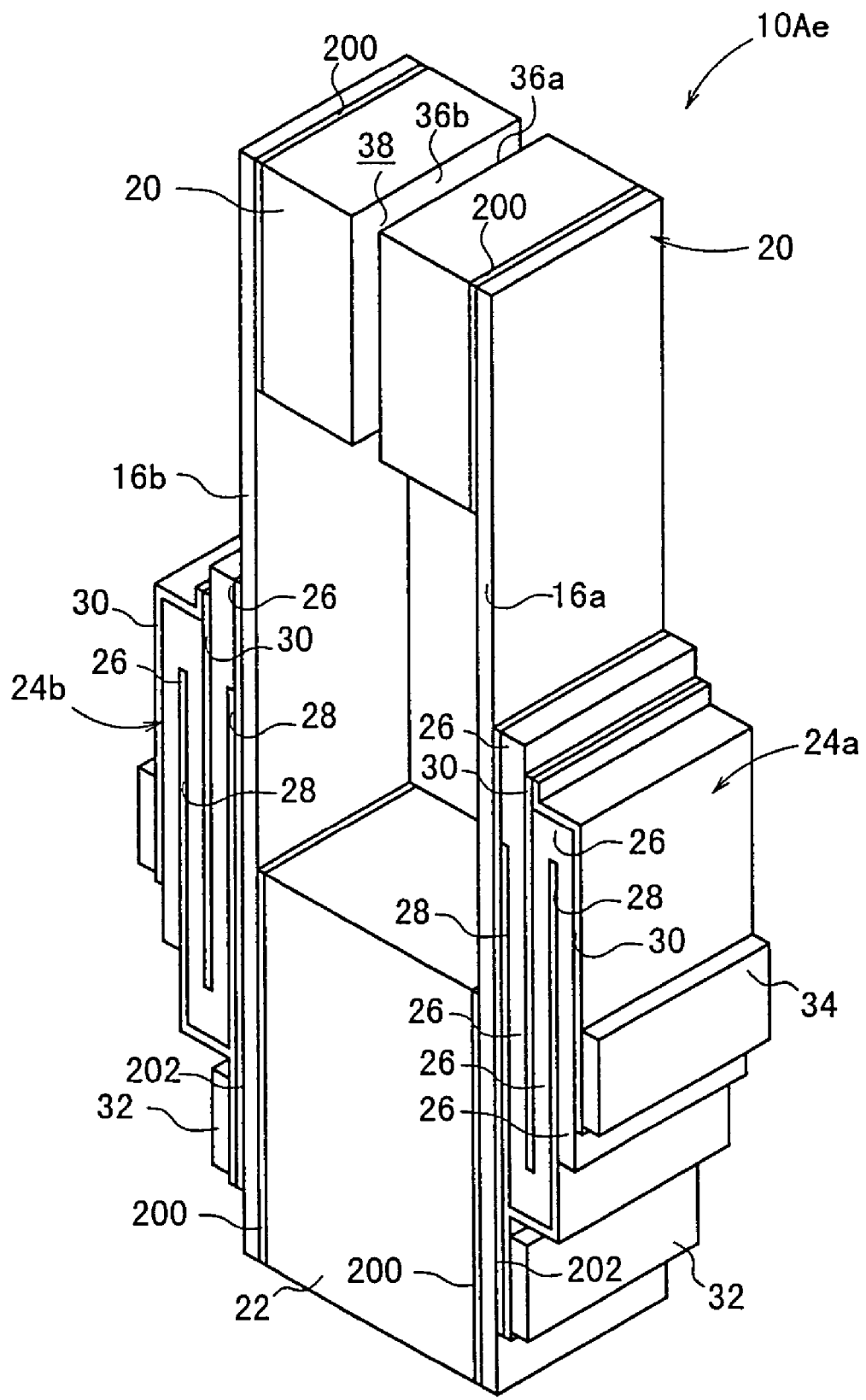
FIG. 7 shows a perspective view illustrating another embodiment of the piezoelectric/electrostrictive device concerning the fifth modified embodiment.

Another example of the piezoelectric/electrostrictive device 10Ae according to the fifth embodiment is shown in FIG. 7. In this case, it is also preferable to form the piezoelectric/electrostrictive element 24a, 24b so that the forward end thereof stays on the thin plate section 16a, 16b. FIG. 7 is illustrative of the case in which the forward end of the piezoelectric/electrostrictive element 24a, 24b is located at a substantially central portion in the length direction of the thin plate section. This arrangement is advantageous in that the movable section 20 can be displaced to a great extent.

Figure 8:
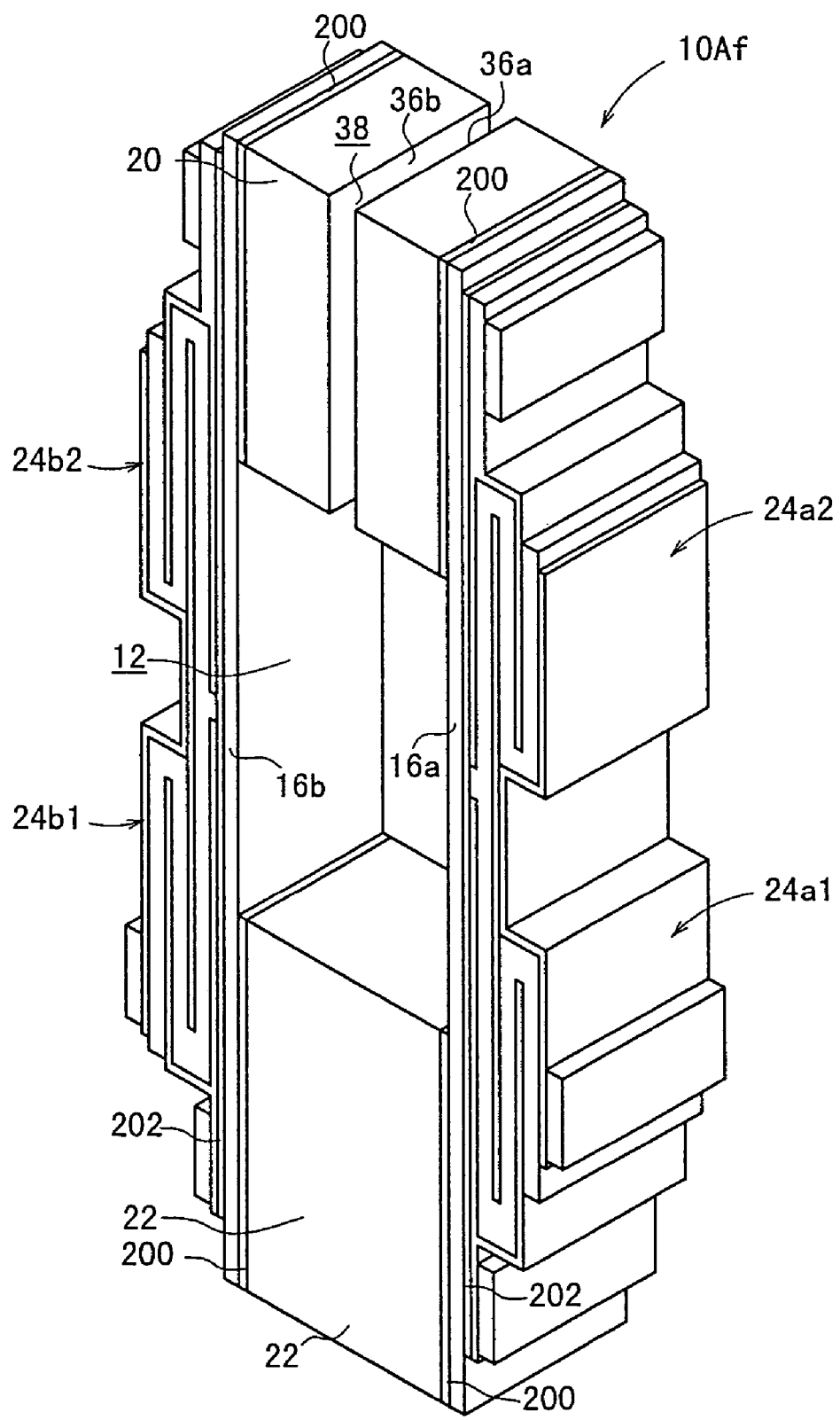
FIG. 8 shows a perspective view illustrating a sixth modified embodiment of the piezoelectric/electrostrictive device according to the first embodiment.

Alternatively, as in a piezoelectric/electrostrictive device 10Af according to a sixth modified embodiment shown in FIG. 8, it is also preferable that two piezoelectric/electrostrictive elements 24a1, 24b1 having the multiple stage structure are formed to extend over the fixation section 22 and the thin plate section 16a, 16b respectively, and another two piezoelectric/electrostrictive elements 24a2, 24b2 having the multiple stage structure are formed to extend over the movable section 20 and the thin plate section 16a, 16b respectively. In this arrangement, the movable section 20 can be displaced extremely greatly owing to the effect that the piezoelectric/electrostrictive element 24a, 24b has the multiple stage structure and the effect that the number of points of action to displace the movable section 20 is increased. Further, the piezoelectric/electrostrictive device 10Af is excellent in high speed response performance, which is preferred.

Figure 9:
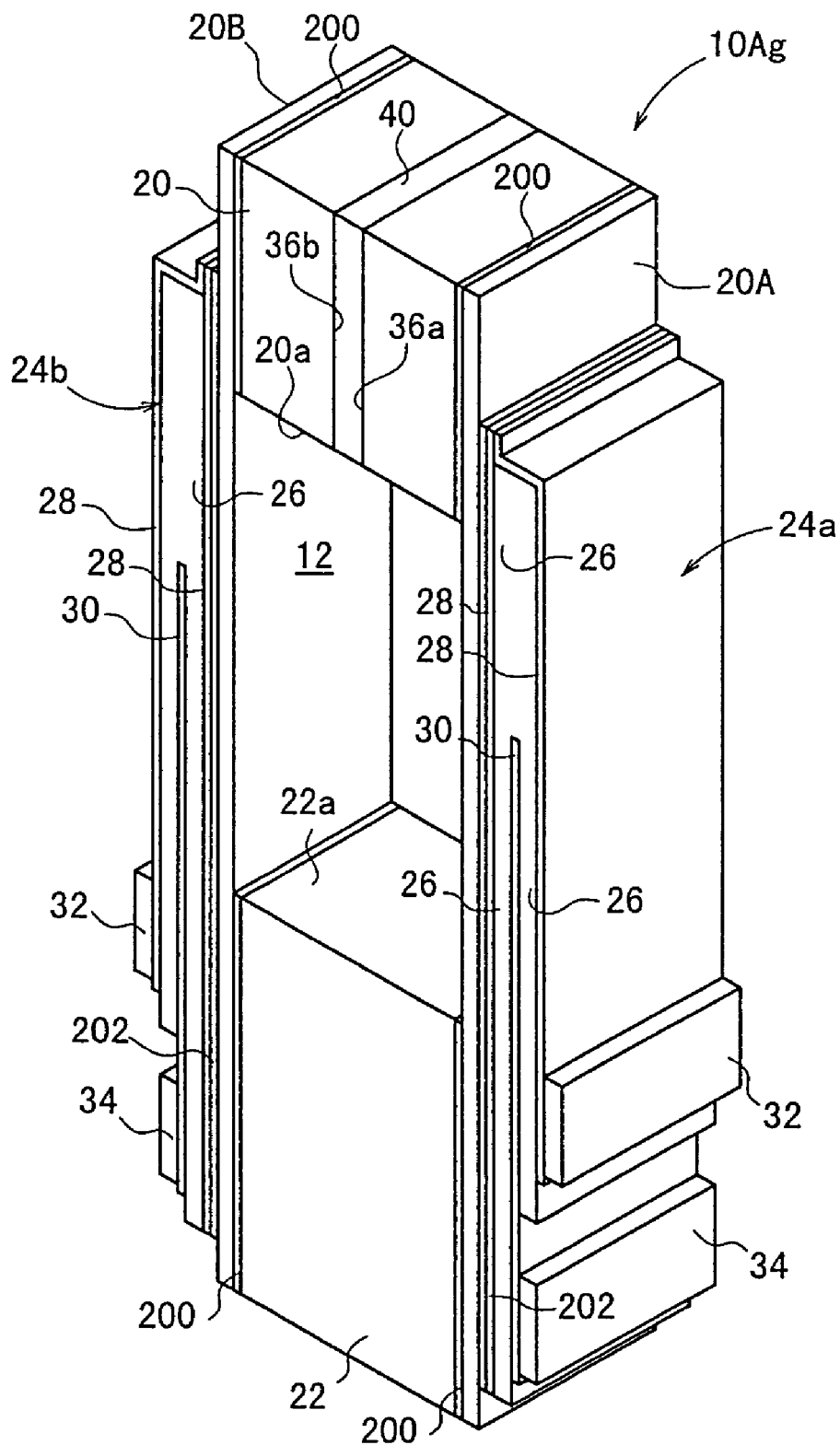
FIG. 9 shows a perspective view illustrating a seventh modified embodiment of the piezoelectric/electrostrictive device according to the first embodiment.

Alternatively, as in a piezoelectric/electrostrictive device 10Ag according to a seventh modified embodiment shown in FIG. 9, it is also preferable that the piezoelectric/electrostrictive layer 26 has the two-layered structure to provide the piezoelectric/electrostrictive element 24a, 24b having the multiple stage structure which is formed such that the first electrode 28 is located on the lower surface of the first layer (side surface of the thin plate section 16a, 16b) and on the upper surface of the second layer, and the second electrode 30 is located on the upper surface of the first layer. In this embodiment, the space between the end surfaces 36a, 36b of the movable section 20 is filled with a member which is different from the movable section 20.

The multiple stage structure of the piezoelectric/electrostrictive element 24a, 24b as described above increases the force generated by the piezoelectric/electrostrictive element 24a, 24b, and thus it is possible to obtain the large displacement. Further, the rigidity of the piezoelectric/electrostrictive device 10A itself is increased, and thus it is possible to realize the high resonance frequency. It is possible to achieve the high speed displacement action with ease.

When the number of stages is increased, it is possible to increase the driving force. However, the electric power consumption is also increased in accordance therewith. Therefore, when the device is practically produced and used, for example, it is preferable that the number of stages is appropriately determined depending on the way of use and the state of use. In the case of the piezoelectric/electrostrictive device 10A according to the first embodiment, even when the driving force is increased by providing the multiple stage structure of the piezoelectric/electrostrictive element 24a, 24b, the width of the thin plate section 16a, 16b (distance in the Y axis direction) is basically unchanged. Therefore, the device is extremely preferred to make application, for example, to the actuator for the purpose of the ringing control and the positioning of the magnetic head for the hard disk to be used in an extremely narrow gap. Further, when the device is used as a sensor (for example, an acceleration sensor), the device provides the following advantage, because the electrostatic capacity is increased, and the generated electric charge is increased, owing to the multiple stage structure. That is, the level of the electric signal generated by the sensor is increased, and it is easy to perform the processing in a signal processing circuit to be connected to the downstream stage of the sensor.

Figure 10:
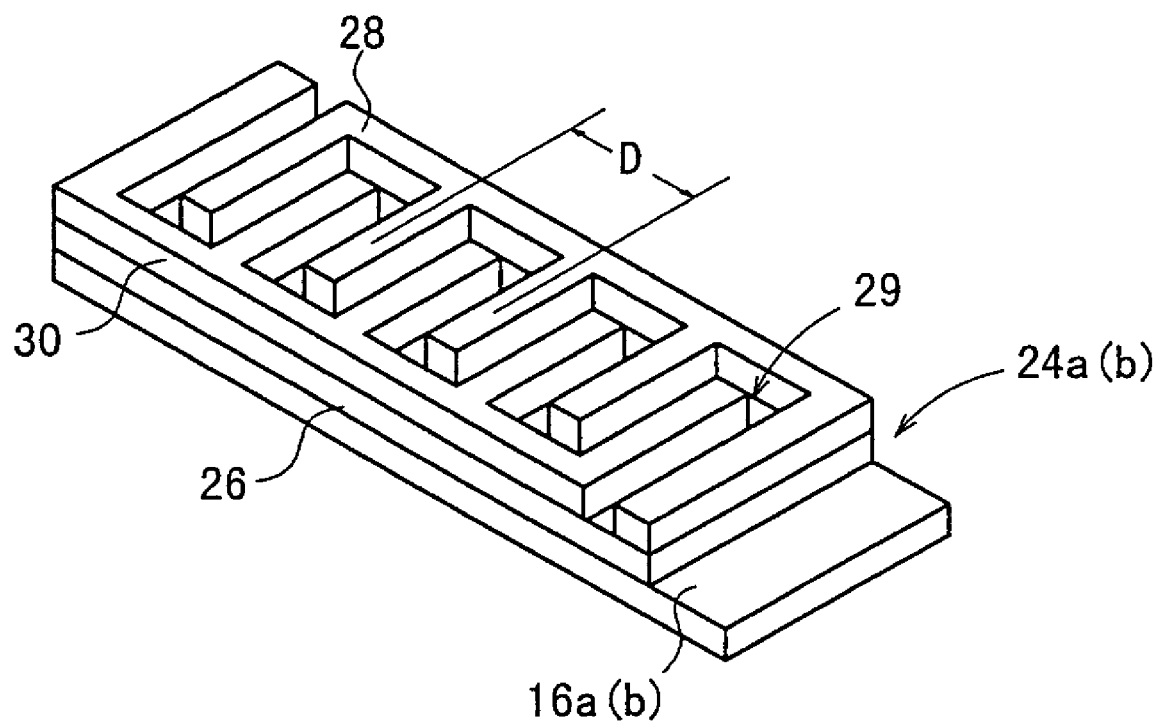
FIG. 10 shows, with partial omission, another embodiment of the piezoelectric/electrostrictive element.

The piezoelectric/electrostrictive element 24a, 24b is illustrative of the case of the so-called sandwich structure in which the piezoelectric/electrostrictive layer 26 is interposed between the pair of electrodes 28, 30. Alternatively, as shown in FIG. 10, a pair of comb-shaped electrodes 28, 30 may be formed on the first principal surface of the piezoelectric/electrostrictive layer 26 formed on at least the side surface of the thin plate section 16a, 16b. Further alternatively, as shown in FIG. 11, a pair of comb-shaped electrodes 28, 30 are formed and embedded in the piezoelectric/electrostrictive layer 26 formed on at least the side surface of the thin plate section 16a, 16b.

The structure shown in FIG. 10 is advantageous in that it is possible to suppress the electric power consumption to be low. The structure shown in FIG. 11 makes it possible to effectively utilize the inverse piezoelectric effect in the direction of the electric field having large generated force and strain, which is advantageous to cause the large displacement.

Specifically, the piezoelectric/electrostrictive element 24a, 24b shown in FIG. 10 comprises the pair of electrodes 28, 30 having the comb-shaped structure formed on the first principal surface of the piezoelectric/electrostrictive layer 26. In this structure, the first electrode 28 and the second electrode 30 are mutually opposed to one another in an alternate manner with a gap 29 having a constant width interposed therebetween. FIG. 10 is illustrative of the case in which the pair of electrodes 28, 30 are formed on the first principal surface of the piezoelectric/electrostrictive layer 26. Alternatively, the pair of electrodes 28, 30 may be formed between the thin plate section 16a, 16b and the piezoelectric/electrostrictive layer 26. Further alternatively, the pair of comb-shaped electrodes 28, 30 may be formed on the first principal surface of the piezoelectric/electrostrictive layer 26 and between the thin plate section 16a, 16b and the piezoelectric/electrostrictive layer 26 respectively.

Figure 11:
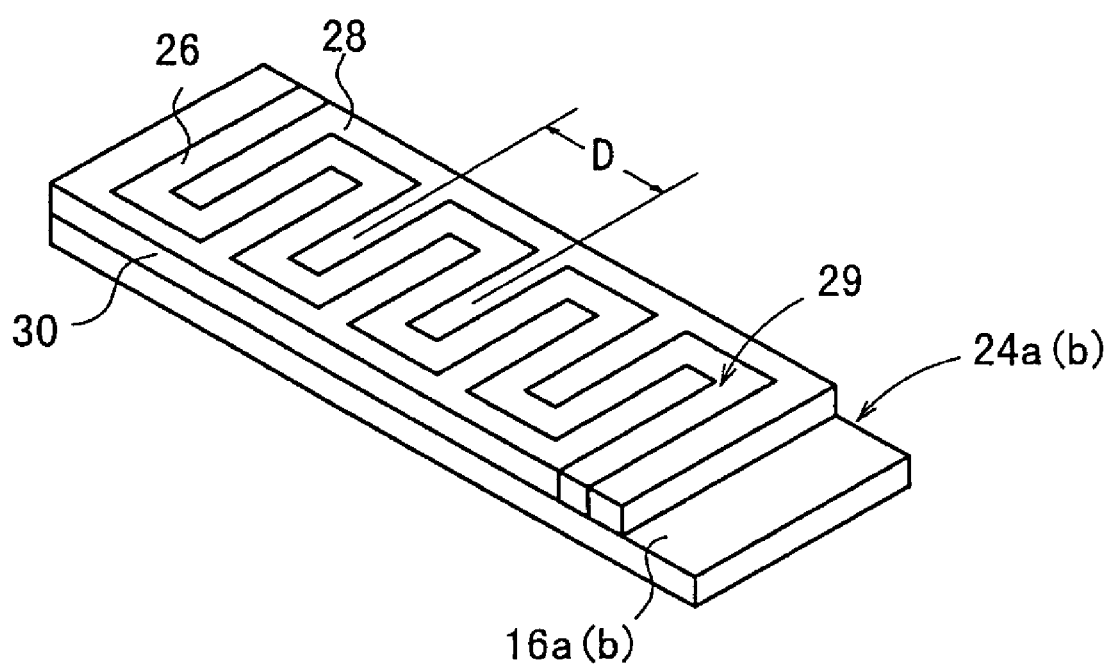
FIG. 11 shows, with partial omission, still another embodiment of the piezoelectric/electrostrictive element.

On the other hand, in the piezoelectric/electrostrictive element 24a, 24b shown in FIG. 11, the pair of electrodes 28, 30 having the comb-shaped structure are formed so that they are embedded in the piezoelectric/electrostrictive layer 26. In this structure, the first electrode 28 and the second electrode 30 are mutually opposed to one another in an alternate manner with a gap 29 having a constant width interposed therebetween.

The piezoelectric/electrostrictive elements 24a, 24b as shown in FIGS. 10 and 11 can be preferably used for the piezoelectric/electrostrictive device 10A according to the first embodiment as well. When the pair of comb-shaped electrodes 28, 30 are used as in the piezoelectric/electrostrictive elements 24a, 24b shown in FIGS. 10 and 11, the displacement of the piezoelectric/electrostrictive element 24a, 24b can be increased by decreasing the pitch D of the comb teeth of the respective electrodes 28, 30.

The operation of the piezoelectric/electrostrictive device 10A according to the first embodiment will now be explained. At first, for example, when the two piezoelectric/electrostrictive elements 24a, 24b are in the natural state, namely when both of the piezoelectric/electrostrictive elements 24a, 24b do not make the displacement action, then the major axis m of the piezoelectric/electrostrictive device 10A (major axis of the fixation section) is substantially coincident with the central axis n of the movable section 20 as shown in FIG. 12.

Starting from this state, for example, a sine wave Wa, which has a predetermined bias electric potential Vb, is applied to the pair of electrodes 28, 30 of the first piezoelectric/electrostrictive element 24a as shown in a waveform figure shown in FIG. 13A, while a sine wave Wb, which has a phase different from that of the sine wave Wa by about 180°, is applied to the pair of electrodes 28, 30 of the second piezoelectric/electrostrictive element 24b as shown in FIG. 13B.

Figure 14:
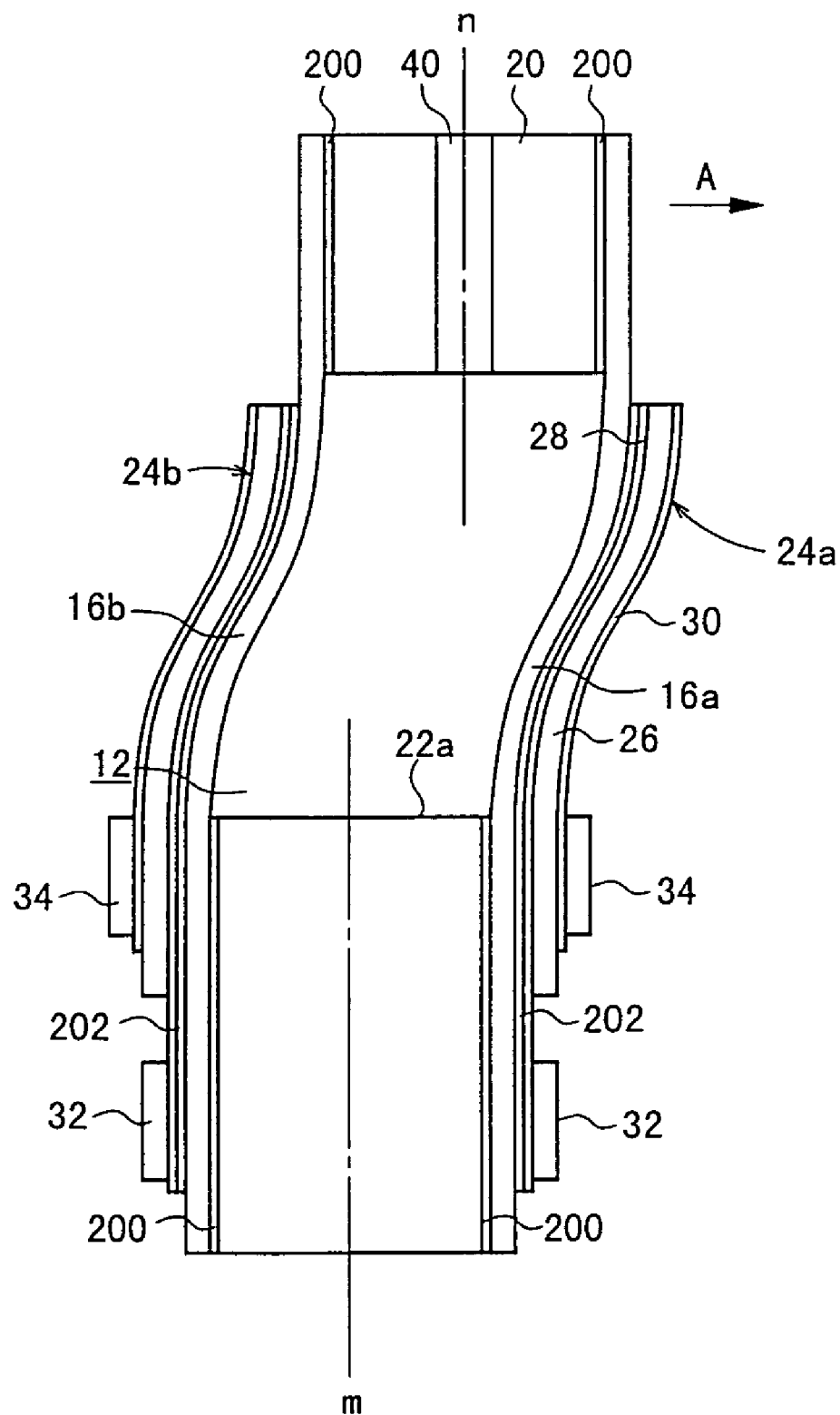
FIG. 14 illustrates a situation in which the piezoelectric/electrostrictive element makes the displacement action in the piezoelectric/electrostrictive device according to the first embodiment.

The piezoelectric/electrostrictive layer 26 of the first piezoelectric/electrostrictive element 24a makes the contraction displacement in the direction of the first principal surface at a stage at which, for example, a voltage having a maximum value is applied to the pair of electrodes 28, 30 of the first piezoelectric/electrostrictive element 24a. Accordingly, as shown in FIG. 14, for example, the stress is generated for the first thin plate section 16a to bend the thin plate section 16a, for example, in the rightward direction as shown by the arrow A. Therefore, the first thin plate section 16a is bent in the rightward direction. At this time, a state is given, in which no voltage is applied to the pair of electrodes 28, 30 of the second piezoelectric/electrostrictive element 24b. Therefore, the second thin plate section 16b follows the bending of the first thin plate section 16a, and it is bent in the rightward direction. As a result, the movable section 20 is displaced, for example, in the rightward direction with respect to the major axis m of the piezoelectric/electrostrictive device 10A. The displacement amount is changed depending on the maximum value of the voltage applied to each of the piezoelectric/electrostrictive elements 24a, 24b. For example, the larger the maximum value is, the larger the displacement amount is.

Especially, when a material having high coercive electric field is applied as the constitutive material for the piezoelectric/electrostrictive layer 26, it is also preferable that the bias electric potential is adjusted so that the level of the minimum value is a slightly negative level as depicted by waveforms indicated by two-dot chain lines in FIGS. 13A and 13B. In this case, for example, the stress, which is in the same direction as the bending direction of the first thin plate section 16a, is generated in the second thin plate section 16b by driving the piezoelectric/electrostrictive element (for example, the second piezoelectric/electrostrictive element 24b) to which the negative level is applied. Accordingly, it is possible to further increase the displacement amount of the movable section 20. In other words, when the waveforms indicated by the dashed lines in FIGS. 13A and 13B are used, the device is allowed to have such a function that the piezoelectric/electrostrictive element 24b or 24a, to which the negative level is applied, supports the piezoelectric/electrostrictive element 24*a* or 24*b* which principally makes the displacement action.

In the case of the piezoelectric/electrostrictive device 10Af shown in FIG. 8, the voltage (see the sine waveform Wa) shown in FIG. 13A is applied, for example, to the piezoelectric/electrostrictive element 24*a*1 and the piezoelectric/electrostrictive element 24*b*2 which are arranged on the diagonal line, and the voltage (see the sine waveform Wb) shown in FIG. 13B is applied to the other piezoelectric/electrostrictive element 24*a*2 and the other piezoelectric/electrostrictive element 24*b* 1.

As described above, in the piezoelectric/electrostrictive device 10A according to the first embodiment, the minute displacement of the piezoelectric/electrostrictive element 24*a*, 24*b* is amplified into the large displacement action by utilizing the bending of the thin plate section 16*a*, 16*b*, and it is transmitted to the movable section 20. Accordingly, it is possible to greatly displace the movable section 20 with respect to the major axis m of the piezoelectric/electrostrictive device 10A.

Especially, in the first embodiment, the movable section 20 is provided with the mutually opposing end surfaces 36*a*, 36*b*. In this arrangement, the gap 38 is provided between the mutually opposing end surfaces 36*a*, 36*b*, or the member 40, which is lighter than the constitutive member of the movable section 20, is allowed to intervene between the mutually opposing end surfaces 36*a*, 36*b*. Accordingly, it is possible to effectively realize the light weight of the movable section 20. Thus, it is possible to increase the resonance frequency without decreasing the displacement amount of the movable section 20.

The frequency herein indicates the frequency of the voltage waveform obtained when the movable section 20 is displaced rightwardly and leftwardly by alternately switching the voltage applied to the pair of electrodes 28, 30. The resonance frequency indicates the frequency at which the displacement action of the movable section 20 is maximum when the predetermined sine wave voltage is applied.

In the piezoelectric/electrostrictive device 10A according to the first embodiment, the hybrid structure is provided, in which the pair of thin plate sections 16*a*, 16*b* are made of metal, and the other components, i.e., the movable section 20 and the fixation section 22 are made of ceramics. It is unnecessary that all of the parts are formed with the piezoelectric/electrostrictive material which is a fragile material having a relatively heavy weight. Therefore, the device has the following advantages. That is, the device has high mechanical strength, and it is excellent in handling performance, shock resistance, and moisture resistance. Further, the operation of the device is scarcely affected by harmful vibration (for example, noise vibration and remaining vibration during high speed operation).

Further, in this embodiment, when the gap 38 is formed between the mutually opposing end surfaces 36*a*, 36*b*, the part 20A of the movable section 20 including the first end surface 36*a* and the another part 20B of the movable section 20 including the second end surface 36*b* are easily bent, resulting in strong resistance to the deformation. Accordingly, the piezoelectric/electrostrictive device 10A is excellent in handling performance.

The surface area of the movable section 20 or the fixation section 22 is increased owing to the presence of the mutually opposing end surfaces 36*a*, 36*b*. Therefore, as shown in FIG. 1, when the movable section 20 has the mutually opposing end surfaces 36*a*, 36*b*, the attachment area can be increased when another part is attached to the movable section 20. Thus, it is possible to improve the attachment performance for the part. It is now assumed that the part is secured, for example, with an adhesive or the like. In this case, the adhesive is fully distributed to the end surfaces 36*a*, 36*b* as well as to the first principal surface (attachment surface for the part) of the movable section 20. Therefore, it is possible to dissolve, for example, shortage of application of the adhesive. Thus, it is possible to reliably secure the part.

Figure 15:
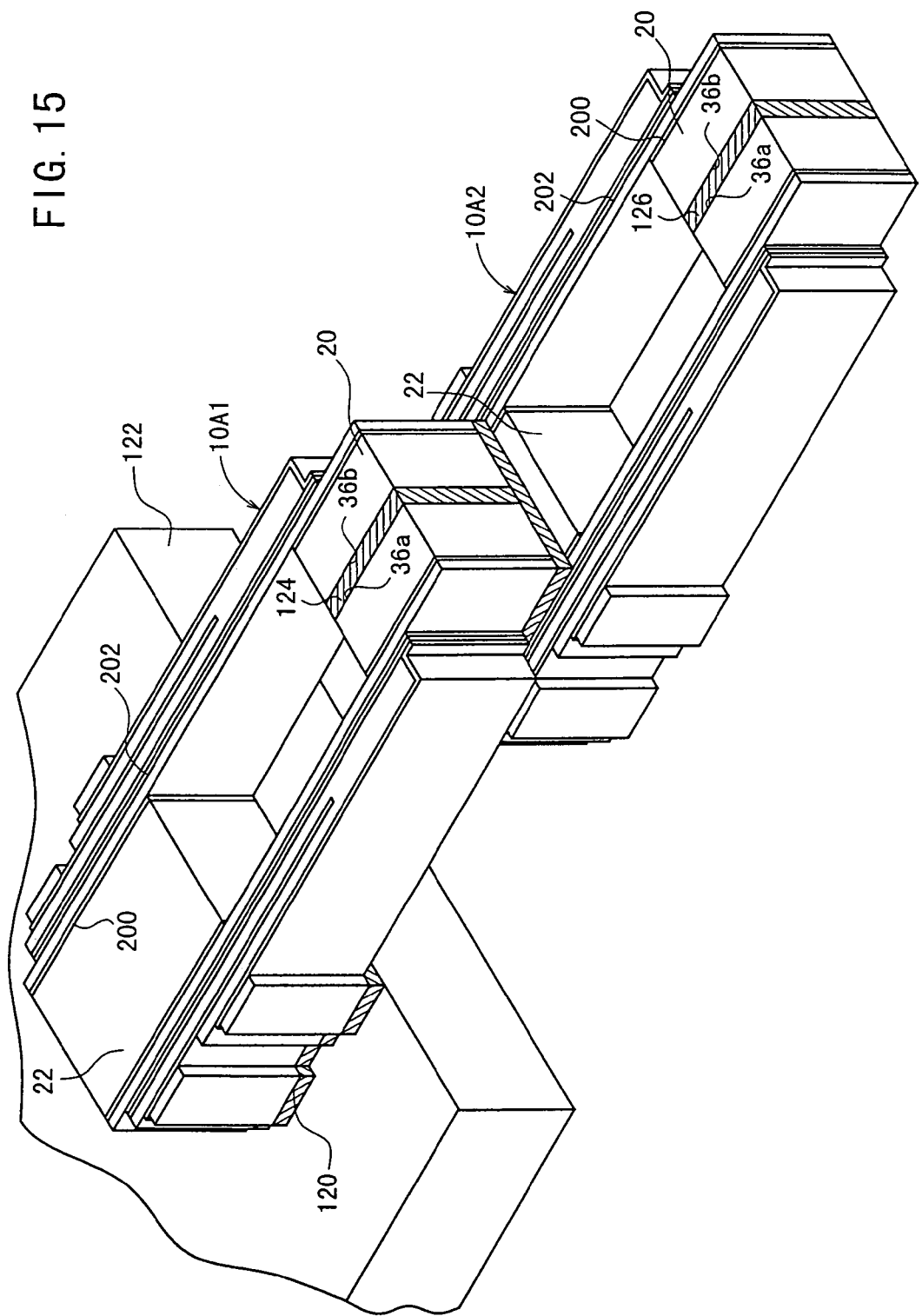
FIG. 15 shows a perspective view illustrating an arrangement in which a second piezoelectric/electrostrictive device is secured to a movable section of a first piezoelectric/electrostrictive device.

As an example of such an arrangement, FIG. 15 is illustrative of a case in which another piezoelectric/electrostrictive device according to the embodiment of the present invention (second piezoelectric/electrostrictive device 10A2) is secured to the movable section 20 of the piezoelectric/electrostrictive device according to the embodiment of the present invention (first piezoelectric/electrostrictive device 10A1).

The first piezoelectric/electrostrictive device 10A1 has its fixation section 22 which is secured to the surface of a base plate 122 by the aid of an adhesive 120. The fixation section 22 of the second piezoelectric/electrostrictive device 10A2 is secured to the movable section 20 of the first piezoelectric/electrostrictive device 10A 1 by the aid of an adhesive 124. That is, in this arrangement, the two piezoelectric/electrostrictive devices 10A1, 10A2 are arranged in series. A member 126 having a light weight, which is different from the movable section 20, is allowed to intervene between the mutually opposing end surfaces 36*a*, 36*b* of the movable section 20 of the second piezoelectric/electrostrictive device 10A2.

In this case, the adhesive 124 for gluing the second piezoelectric/electrostrictive device 10A2 is fully distributed up to the space between the end surfaces 36*a*, 36*b* of the movable section 20 of the first piezoelectric/electrostrictive device 10A1. Accordingly, the second piezoelectric/electrostrictive device 10A2 is tightly secured to the first piezoelectric/electrostrictive device 10A1. When the piezoelectric/electrostrictive device 10A2 is glued as described above, the light weight member (adhesive 124 in this case), which is different from the movable section 20, is allowed to intervene between the end surfaces 36*a*, 36*b* simultaneously with the adhesion. Therefore, this arrangement is advantageous in that the production step can be simplified.

On the other hand, as shown in FIG. 3, when the fixation section 22 has the mutually opposing end surfaces 36*a*, 36*b*, it is possible to tightly fix the piezoelectric/electrostrictive device 10Ab according to the second modified embodiment to a predetermined fixation portion, in addition to the effect obtained when the movable section 20 has the mutually opposing end surfaces 36*a*, 36*b* as described above. Thus, it is possible to improve the reliability.

In the first embodiment, the portion (substantial driving portion 18), at which the pair of electrodes 28, 30 are overlapped with each other with the piezoelectric/electrostrictive layer 26 interposed therebetween, is continuously formed over the range from the part of the fixation section 22 to the part of the thin plate section 16*a*, 16*b*. If the substantial driving portion 18 is formed to further extend over a part of the movable section 20, then it is feared that the displacement action of the movable section 20 is restricted by the substantial driving portion 18, and it is impossible to obtain the large displacement. However, in this embodiment, the substantial driving portion 18 is formed such that it does not range over the movable section 20. Therefore, it is possible to avoid the inconvenience of the restriction of the displacement action of the movable section 20, and it is possible to increase the displacement amount of the movable section 20.

On the other hand, when the piezoelectric/electrostrictive element 24a, 24b is formed on the part of the movable section 20, it is preferable that the substantial driving portion 18 is located over the range from the part of the movable section 20 to the part of the thin plate section 16a, 16b, because of the following reason. That is, if the substantial driving portion 18 is formed to extend up to a part of the fixation section 22, the displacement action of the movable section 20 is restricted as described above.

Next, explanation will be made for preferred illustrative constructions of the piezoelectric/electrostrictive device 10A according to the first embodiment.

At first, in order to ensure the displacement action of the movable section 20, it is preferable that the distance g, by which the substantial driving portion 18 of the piezoelectric/electrostrictive element 24a, 24b is overlapped with the fixation section 22 or the movable section 20, is not less than ½ of the thickness d of the thin plate section 16a, 16b.

The device is constructed such that the ratio a/b between the distance (distance in the X axis direction) a between the inner walls of the thin plate sections 16a, 16b and the width (distance in the Y axis direction) b of the thin plate section 16a, 16b is 0.5 to 20. The ratio a/b is preferably 1 to 15 and more preferably 1 to 10. The prescribed value of the ratio a/b is prescribed on the basis of the discovery that the displacement amount of the movable section 20 is increased to makes it possible to dominantly obtain the displacement in the X-Z plane.

On the other hand, it is desirable that the ratio e/a between the length (distance in the Z axis direction) e of the thin plate section 16a, 16b and the distance a between the inner walls of the thin plate sections 16a, 16b is preferably 0.5 to 10 and more preferably 0.5 to 5.

Further, it is preferable that the hole 12 is filled with a gel material, for example, silicon gel. Usually, the displacement action of the movable section 20 is restricted by the presence of such a filler material. However, in the first embodiment, it is intended to realize the light weight brought about by the formation of the end surfaces 36a, 36b on the movable section 20 and increase the displacement amount of the movable section 20. Therefore, the restriction of the displacement action of the movable section 20 due to the filler material is counteracted. Accordingly, it is possible to realize the effect owing to the presence of the filler material, namely the realization of the high resonance frequency and the maintenance of the rigidity.

It is preferable that the length (distance in the Z axis direction) f of the movable section 20 is short, because of the following reason. That is, it is possible to realize the light weight and increase the resonance frequency by shortening the length. However, in order to ensure the rigidity of the movable section 20 in the X axis direction and obtain its reliable displacement, it is desirable that the radio f/d with respect to the thickness d of the thin plate section 16a, 16b is not less than 2, and preferably not less than 5.

The actual size of each component is determined considering, for example, the joining area for attaching the part to the movable section 20, the joining area for attaching the fixation section 22 to another member, the joining area for attaching the electrode terminal or the like, and the strength, the durability, the necessary displacement amount, the resonance frequency, and the driving voltage of the entire piezoelectric/electrostrictive device 10A.

Specifically, for example, the distance a between the inner walls of the thin plate sections 16a, 16b is preferably 100 µm to 2000 µm and more preferably 200 µm to 1600 µm. The width b of the thin plate section 16a, 16b is preferably 50 µm to 2000 µm and more preferably 100 µm to 500 µm. The thickness d of the thin plate section 16a, 16b is preferably 2 µm to 100 µm and more preferably 10 µm to 80 µm, while it satisfies b>d in relation to the width b of the thin plate section 16a, 16b, in order to make it possible to effectively suppress the swaying displacement which is the displacement component in the Y axis direction.

The length e of the thin plate section 16a, 16b is preferably 200 µm to 3000 µm and more preferably 300 µm to 2000 µm. The length f of the movable section 20 is preferably 50 µm to 2000 µm and more preferably 100 µm to 1000 µm.

The arrangement as described above exhibits such an extremely excellent effect that the displacement in the Y axis direction does not exceeds 10% with respect to the displacement in the X axis direction, while the device can be driven at a low voltage by appropriately making adjustment within the range of the size range and the actual size, and it is possible to suppress the displacement component in the Y axis direction to be not more than 5%. In other words, the movable section 20 is displaced in one axis direction, i.e., substantially in the X axis direction. Further, the high speed response is excellent, and it is possible to obtain the large displacement at a relatively low voltage.

In the piezoelectric/electrostrictive device 10A, the shape of the device is not the plate-shaped configuration (thickness is small in the direction perpendicular to the displacement direction) unlike conventional one. Each of the movable section 20 and the fixation section 22 has the approximately rectangular parallelepiped-shaped configuration. The pair of thin plate sections 16a, 16b are provided so that the side surface of the movable section 20 is continuous to the side surface of the fixation section 22. Therefore, it is possible to selectively increase the rigidity of piezoelectric/electrostrictive device 10A in the Y axis direction.

That is, in the piezoelectric/electrostrictive device 10A, it is possible to selectively generate only the operation of the movable section 20 in the plane (XZ plane). It is possible to suppress the operation of the movable section 20 in the YZ plane (operation in the so-called swaying direction).

Next, explanation will be made for the respective constitutive components of the piezoelectric/electrostrictive device 10A according to the first embodiment.

As described above, the movable section 20 is the portion which is operated on the basis of the driving amount of the thin plate section 16a, 16b, and a variety of members are attached thereto depending on the purpose of use of the piezoelectric/electrostrictive device 10A. For example, when the piezoelectric/electrostrictive device 10A is used as a displacement element, a shield plate for an optical shutter or the like is attached thereto. Especially, when the piezoelectric/electrostrictive device 10A is used for the mechanism for positioning a magnetic head of a hard disk drive or for suppressing the ringing, a member required to be positioned is attached thereto, including, for example, the magnetic head, a slider provided with the magnetic head, and a suspension provided with the slider.

As described above, the fixation section 22 is the portion for supporting the thin plate sections 16a, 16b and the movable section 20. For example, in the case of the utilization to position the magnetic head of the hard disk drive, the entire piezoelectric/electrostrictive device 10A is fixed by supporting and securing the fixation section 22, for example, to a carriage arm attached to VCM (voice coil motor) or a fixation plate or a suspension attached to the carriage arm. As shown in FIG. 1, the terminals 32, 34 for driving the piezoelectric/electrostrictive elements 24a, 24b and other members are arranged on the fixation section 22 in some cases.

The material for constructing the movable section 20 and the fixation section 22 is not specifically limited provided that it has rigidity. However, it is possible to preferably use ceramics to which the ceramic green sheet-stacking method is applicable as described later on. Specifically, the material includes, for example, materials containing a major component of zirconia represented by stabilized zirconia and partially stabilized zirconia, alumina, magnesia, silicon nitride, aluminum nitride, and titanium oxide, as well as materials containing a major component of a mixture of them. However, in view of the high mechanical strength and the high toughness, it is preferable to use a material containing a major component of zirconia, especially stabilized zirconia and a material containing a major component of partially stabilized zirconia. The metal material is not limited provided that it has rigidity. However, the metal material includes, for example, stainless steel, nickel, brass, cupronickel, and bronze.

Those which are stabilized or partially stabilized as follows are preferably used as stabilized zirconia or partially stabilized zirconia as described above. That is, the compound to be used for stabilizing or partially stabilizing zirconia includes yttrium oxide, ytterbium oxide, cerium oxide, calcium oxide, and magnesium oxide. When at least one compound of them is added and contained, zirconia is partially or fully stabilized. However, as for the stabilization, the objective zirconia can be stabilized not only by adding one type of the compound but also by adding a combination of the compounds.

The amount of addition of each of the compounds is desirably as follows. That is, yttrium oxide or ytterbium oxide is added by 1 to 30 mole %, preferably 1.5 to 10 mole %. Cerium oxide is added by 6 to 50 mole %, preferably 8 to 20 mole %. Calcium oxide or magnesium oxide is added by 5 to 40 mole %, preferably 5 to 20 mole %. Especially, it is preferable to use yttrium oxide as a stabilizer. In this case, yttrium oxide is desirably added by 1.5 to 10 mole %, more preferably 2 to 4 mole %. For example, alumina, silica, or transition metal oxide may be added as an additive of sintering aid or the like in a range of 0.05 to 20% by weight. However, when the sintering integration based on the film formation method is adopted as a technique for forming the piezoelectric/electrostrictive element 24a, 24b, it is also preferable to add, for example, alumina, magnesia, and transition metal oxide as an additive.

In order to obtain the mechanical strength and the stable crystal phase, it is desirable that the average crystal grain size of zirconia is 0.05 to 3 μm, preferably 0.05 to 1 μm. As described above, ceramics can be used for the thin plate section 16a, 16b in the same manner as in the movable section 20 and the fixation section 22. Preferably, it is advantageous to construct the thin plate sections 16a, 16b with a substantially identical material in view of the reliability of the joined portion and the strength of the piezoelectric/electrostrictive device 10A in order to reduce any complicated procedure of the production.

As described above, the thin plate section 16a, 16b is the portion which is driven in accordance with the displacement of the piezoelectric/electrostrictive element 24a, 24b. The thin plate section 16a, 16b is the thin plate-shaped member having flexibility, and it functions to amplify the expansion and contraction displacement of the piezoelectric/electrostrictive element 24a, 24b arranged on the surface as the bending displacement and transmit the displacement to the movable section 20. Therefore, it is enough that the shape or the material of the thin plate section 16a, 16b provides the flexibility with the mechanical strength of such a degree that it is not broken by the bending displacement. It is possible to make appropriate selection considering the response performance and the operability of the movable section 20.

It is preferable that the thickness d of the thin plate section 16a, 16b is preferably about 2 μm to 100 μm. It is preferable that the combined thickness of the thin plate section 16a, 16b and the piezoelectric/electrostrictive element 24a, 24b is 7 μm to 500 μm. It is preferable that the thickness of the electrode 28, 30 is 0.1 to 50 μm, and the thickness of the piezoelectric/electrostrictive layer 26 is 3 to 300 μm. The width b of the thin plate section 16a, 16b is preferably 50 μm to 2000 μm.

On the other hand, as for the shape and the material for the thin plate section 16a, 16b, it is enough to use those having the flexibility and having the mechanical strength of such a degree that no breakage occurs due to the bending displacement. Metal is preferably used. In this case, as described above, it is preferable to use a metal material which has the flexibility and which is capable of the bending displacement. Specifically, it is preferable to use a metal material which has a Young's modulus of not less than 100 GPa.

Preferably, it is desirable that the thin plate section 16a, 16b is made of an iron-based material such as various spring steel materials, marageing stainless steel materials, and stainless steel materials including, for example, austenite-based stainless steel materials such as SUS301, SUS304, AISI653, and SUH660, ferrite-based stainless steel materials such as SUS430 and SUS434, maltensite-based stainless steel materials such as SUS410 and SUS630, and semiaustenite-based stainless steel materials such as SUS631 and AISI632. Alternatively, it is desirable that the thin plate section 16a, 16b is made of a non-ferrous material such as superelastic titanium alloy represented by titanium-nickel alloy, brass, cupronickel, aluminum, tungsten, molybdenum, beryllium copper, phosphor bronze, nickel, nickel-iron alloy, and titanium.

When ceramics is used for the thin plate section 16a, 16b in the same manner as the movable section 20a, 20b and the fixation section 22, it is preferable to use zirconia. Especially, a material containing a major component of stabilized zirconia and a material containing a major component of partially stabilized zirconia are used most preferably, because of the large mechanical strength even in the case of the thin wall thickness, the high toughness, and the small reactivity with the piezoelectric/electrostrictive layer 26 and the electrode material.

The piezoelectric/electrostrictive element 24a, 24b has at least the piezoelectric/electrostrictive layer 26 and the pair of electrodes 28, 30 for applying the electric field to the piezoelectric/electrostrictive layer 26. It is possible to use, for example, piezoelectric/electrostrictive elements of the unimorph type and the bimorph type. However, those of the unimorph type combined with the thin plate section 16a, 16b are suitable for the piezoelectric/electrostrictive device 10A as described above, because they are excellent in stability of the generated displacement amount and they are advantageous to realize the light weight.

For example, as shown in FIG. 1, it is possible to preferably use, for example, the piezoelectric/electrostrictive element comprising the first electrode 28, the piezoelectric/electrostrictive layer 26, and the second electrode 30 which are stacked in the layered configuration. Additionally, it is also preferable to provide the multiple stage structure as shown in FIGS. 5 to 9. In this arrangement, the positional discrepancy of the film (electrode film) for constructing the electrode 28, 30, i.e., for example, the positional discrepancy of the electrode 28 in the in-plane direction on the perpendicular projection plane disposed as every other layer is not more than 50 µm. This facts also holds for the electrode 30.

As shown in FIG. 1, the piezoelectric/electrostrictive element 24a, 24b is preferably formed on the outer surface side of the piezoelectric/electrostrictive device 10A in view of the fact that the thin plate sections 16a, 16b can be driven to a greater extent. However, the piezoelectric/electrostrictive element 24a, 24b may be formed on the inner surface side of the piezoelectric/electrostrictive device 10A, i.e., on the inner wall surface of the hole 12 depending on, for example, the form of use. Alternatively, the piezoelectric/electrostrictive elements 24a, 24b may be formed both on the outer surface side and on the inner surface side of the piezoelectric/electrostrictive device 10A.

Piezoelectric ceramics is preferably used for the piezoelectric/electrostrictive layer 26. However, it is also possible to use electrostrictive ceramics, ferroelectric ceramics, or anti-ferroelectric ceramics. However, when the piezoelectric/electrostrictive device 10A is used, for example, to position the magnetic head of the hard disk drive, it is important to provide the linearity concerning the displacement amount of the movable section 20 and the driving voltage or the output voltage. Therefore, it is preferable to use a material having small strain hysteresis. It is preferable to use a material having a coercive electric field of not more than 10 kV/mm.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture.

Especially, a material containing a major component of lead zirconate, lead titanate, and lead magnesium niobate, or a material containing a major component of sodium bismuth titanate is preferably used, in order to obtain the product having a stable composition with a high electromechanical coupling coefficient and a piezoelectric constant and with small reactivity with the thin plate sections 16a, 16b (ceramics) when the thin plate section 16a, 16b is made of ceramics, and the piezoelectric/electrostrictive layer 26 is sintered in an integrated manner.

It is also preferable to use ceramics obtained by adding, to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum, or compounds each containing at least one component to be finally formed into oxide, singly or in mixture.

For example, when lanthanum and/or strontium is contained in the major components of lead zirconate, lead titanate, and lead magnesium niobate, an advantage is obtained in some cases, for example, in such a way that the coercive electric field and the piezoelectric characteristic can be adjusted.

It is desirable to avoid the addition of a material such as silica which tends to form glass, because of the following reason. That is, the material such as silica tends to react with the piezoelectric/electrostrictive material during the heat treatment for the piezoelectric/electrostrictive layer. As a result, the composition is varied, and the piezoelectric characteristic is deteriorated.

On the other hand, it is preferable that the piezoelectric/electrostrictive element 24a, 24b and the pair of electrodes 28, 30 are made of metal which is solid at room temperature and which is excellent in conductivity. For example, it is possible to use metal simple substance or alloy of, for example, aluminum, titanium, chromium, iron, cobalt, nickel, copper, zinc, niobium, molybdenum, ruthenium, palladium, rhodium, silver, stannum, tantalum, tungsten, iridium, platinum, gold, and lead. It is also preferable to use a cermet material obtained by dispersing, in the metal described above, ceramics of the same material as that of the piezoelectric/electrostrictive layer 26 or the material different from that of the piezoelectric/electrostrictive layer 26.

The material for the electrodes 28, 30 of the piezoelectric/electrostrictive element 24a, 24b is selected and determined depending on the method for forming the piezoelectric/electrostrictive layer 26. For example, when the piezoelectric/electrostrictive layer 26 is formed by sintering on the first electrode 28 after the first electrode 28 is formed on the thin plate section 16a, 16b, it is necessary for the first electrode 28 to use high melting point metal such as platinum, palladium, platinum-palladium alloy, and silver-palladium alloy which does not change at the sintering temperature for the piezoelectric/electrostrictive layer 26. However, the electrode formation can be performed at a low temperature for the second electrode 30 which is formed on the piezoelectric/electrostrictive layer 26 when located at the outermost layer after forming the piezoelectric/electrostrictive layer 26. Therefore, it is possible for the second electrode 30 to use low melting point metal such as aluminum, gold, and silver.

When the stacked type piezoelectric/electrostrictive element 24 is affixed to the thin plate section 16a, 16b by the aid of the adhesive 202, it is preferable that the piezoelectric/electrostrictive layer 26 and the electrodes 28, 30 (electrode films) are stacked and integrated into one unit in a multi-layered configuration, and then they are collectively sintered. In this case, high melting point metal such as platinum, palladium, and alloy thereof is used for the electrodes 28, 30. It is preferable that the electrode 28, 30 is made of cermet as a mixture of the high melting point metal and the piezoelectric/electrostrictive material or another ceramics.

The thickness of the electrode 28, 30 also serves as a factor to considerably decrease the displacement of the piezoelectric/electrostrictive element 24a, 24b. Therefore, it is preferable, especially for the electrode formed after the sintering of the piezoelectric/electrostrictive layer 26, to use organic metal paste capable of obtaining a dense and thinner film after the sintering, for example, a material such as gold resinate paste, platinum resinate paste, and silver resinate paste.

Next, explanation will be made with reference to FIGS. 16A to 23 for several methods for producing the piezoelectric/electrostrictive device 10A according to the first embodiment.

In the piezoelectric/electrostrictive device 10A according to the first embodiment, the thin plate section 16a, 16b is made of metal, and the constitutive material for each of the movable section 20 and the fixation section 22 is ceramics. Therefore, it is preferable that the constitutive elements of the piezoelectric/electrostrictive device 10A concerning the fixation section 22 and the movable section 20, except for the thin plate sections 16a, 16b and the piezoelectric/electrostrictive elements 24a, 24b, are produced by using the ceramic green sheet-stacking method. On the other hand, it is preferable that the piezoelectric/electrostrictive elements 24a, 24b as well as the respective terminals 32, 34 are produced by using the film formation method, for example, for the thin film and the thick film.

The thin plate sections 16a, 16b are preferably secured to the side surfaces of the movable section 20 and the fixation section 22 by the aid of the adhesive 200. The piezoelectric/electrostrictive element 24a, 24b is preferably secured onto the thin plate section 16a, 16b by the aid of the adhesive 202.

According to the ceramic green sheet-stacking method in which the movable section 20 and the fixation section 22 of the piezoelectric/electrostrictive device 10A can be formed in an integrated manner, the time-dependent change of state scarcely occurs at the joined portions of the respective members. Therefore, this method provides the high reliability of the joined portion, and it is advantageous to ensure the rigidity.

In the piezoelectric/electrostrictive device 10A according to the first embodiment, the boundary portion between the thin plate section 16a, 16b and the fixation section 22 and the boundary portion between the thin plate section 16a, 16b and the movable section 20 function as supporting points for expressing the displacement. Therefore, the reliability of each of the boundary portions is an important point which dominates the characteristic of the piezoelectric/electrostrictive device 10A.

The production methods described below are excellent in reproducibility and formability. Therefore, it is possible to obtain the piezoelectric/electrostrictive device having a predetermined shape within a short period of time with good reproducibility.

A first production method for the piezoelectric/electrostrictive device 10A according to the first embodiment will be specifically explained below. The following definitions are now made. The stack, which is obtained by stacking the ceramic green sheets, is defined to be the ceramic green stack 158 (see, for example, FIG. 16B). The integrated matter, which is obtained by sintering the ceramic green stack 158, is defined to be the ceramic stack 160 (see, for example, FIG. 17A). The stuck or glued matter comprising the ceramic stack 160 and the metal plate is defined to be the hybrid stack 162 (see FIG. 18). The integrated matter comprising the movable section 20, the thin plate sections 16a, 16b, and the fixation section 22, which is obtained by cutting off unnecessary portions from the hybrid stack 162, is defined to be the substrate 14D (see FIG. 19).

In the first production method, the hybrid stack 162 is finally cut into chip units to produce a large number of piezoelectric/electrostrictive devices 10A. However, in order to simplify the explanation, description will be made principally for the case in which one individual of piezoelectric/electrostrictive device 10A is produced.

At first, for example, a binder, a solvent, a dispersing agent, and a plasticizer are added and mixed with a ceramic powder such as zirconia to prepare a slurry. The slurry is subjected to a defoaming treatment, and then a ceramic green sheet having a predetermined thickness is prepared in accordance with, for example, the reverse roll coater method and the doctor blade method.

Figure 16B:
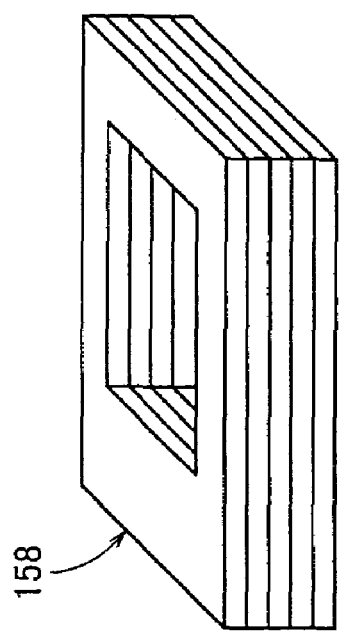
FIG. 16B illustrates a state in which a ceramic green stack is formed.
Figure 16A:
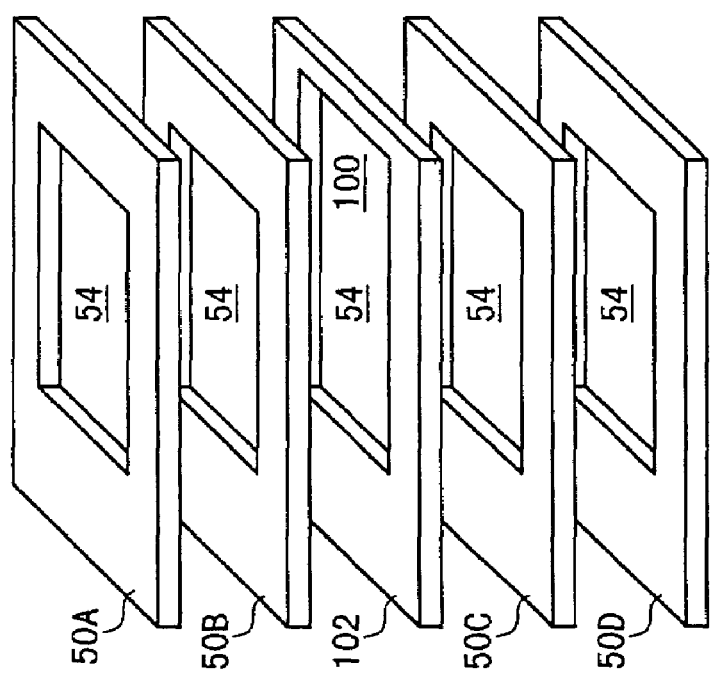
FIG. 16A illustrates a process for stacking necessary ceramic green sheets in a first production method.

Subsequently, the ceramic green sheet is processed into those having various shapes as shown in FIG. 16A in accordance with, for example, the punching out based on the use of the mold and the laser machining to prepare a plurality of ceramic green sheets for forming the substrate. Specifically, a plurality (for example, four) of ceramic green sheets 50A to 50D each of which is formed with a window 54 for forming at least the hole 12 thereafter, and a ceramic green sheet 102 which is continuously formed with a window 54 for forming the hole 12 thereafter and a window 100 for forming the movable section 20 having the mutually opposing end surfaces 36a, 36b are prepared.

After that, as shown in FIG. 16B, the ceramic green sheets 50A to 50D, 102 are stacked and secured under pressure to form a ceramic green stack 158. The stacking is performed while the ceramic green sheet 102 is positioned at the center. After that, the ceramic green stack 158 is sintered to obtain a ceramic stack 160 as shown in FIG. 17A. At this stage, the ceramic stack 160 is formed such that the hole 130 is formed by the windows 54, 100.

Subsequently, as shown in FIG. 17B, the piezoelectric/electrostrictive elements 24a, 24b, which are constructed as separate members, are respectively glued with an epoxy adhesive 202 to the surfaces of metal plates 152A, 152B to serve as the thin plate sections.

Subsequently, the metal plates 152A, 152B are glued to the ceramic stack 160 with an epoxy adhesive 200 so that the ceramic stack 160 is interposed between the metal plates 152A, 152B and the hole 130 is closed thereby to provide a hybrid stack 162 (see FIG. 18).

Figure 18:
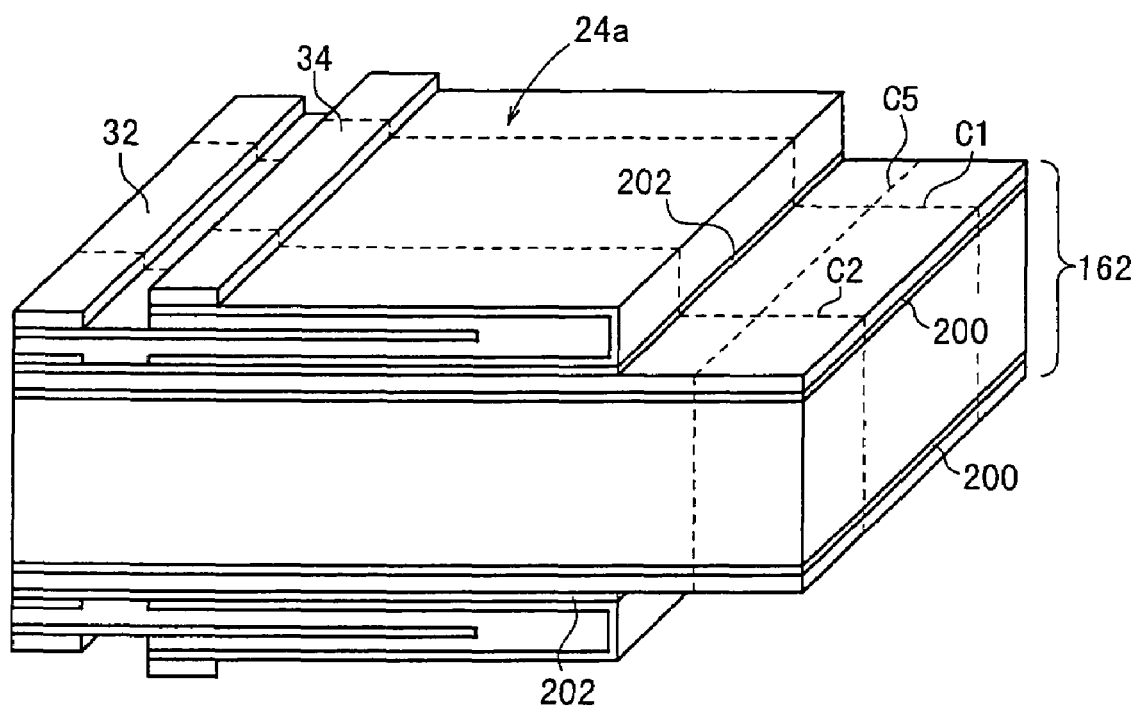
FIG. 18 illustrates a state in the first production method in which the metal plate is glued to the ceramic stack to provide a hybrid stack.
Figure 19:
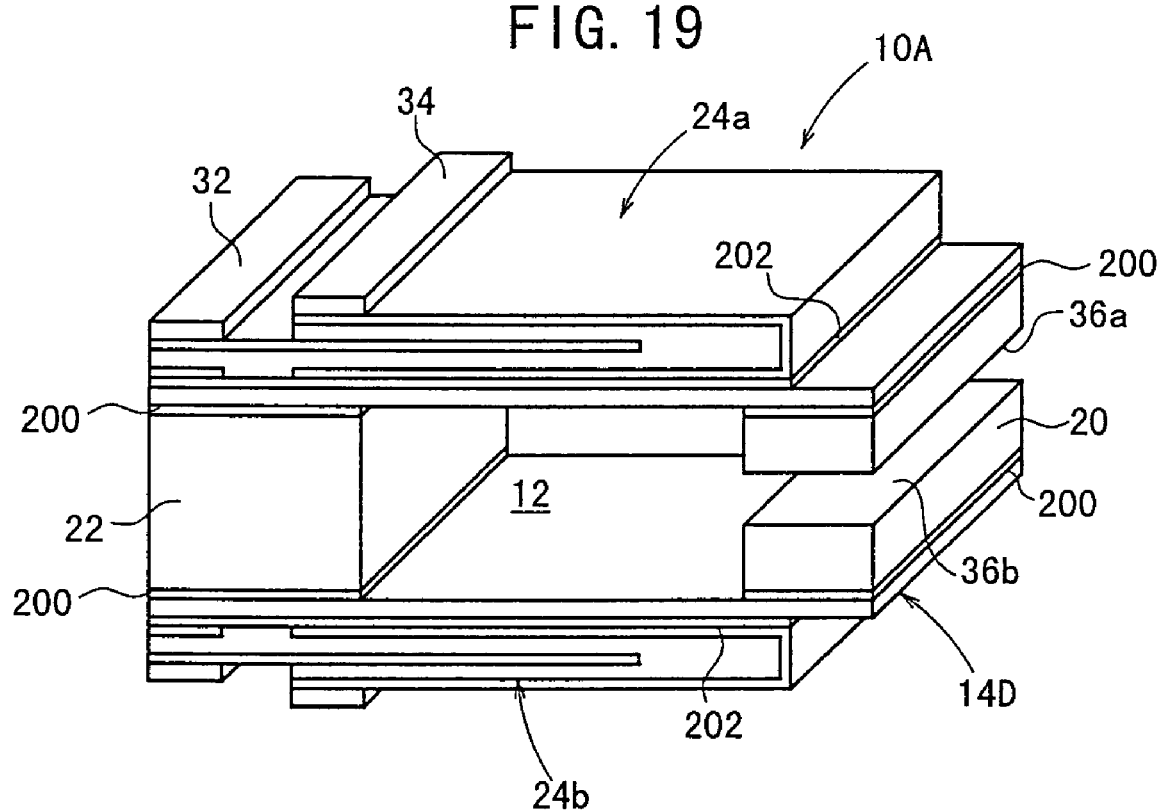
FIG. 19 illustrates a state in which the hybrid stack is cut along predetermined cutting lines to provide the piezoelectric/electrostrictive device according to the first embodiment.

Subsequently, as shown in FIG. 18, the hybrid stack 162, which is formed with the piezoelectric/electrostrictive elements 24a, 24b, is cut along cutting lines C1, C2, C5 to thereby cut off side portions and forward end portions of the hybrid stack 162. As a result of the cutoff, as shown in FIG. 19, the piezoelectric/electrostrictive device 10A according to the first embodiment is obtained, in which the piezoelectric/electrostrictive elements 24a, 24b are formed on the thin plate sections constituted by the metal plates, of the substrate 14D, and the movable section 20 having the mutually opposing end surfaces 36a, 36b is formed.

Figure 20B:
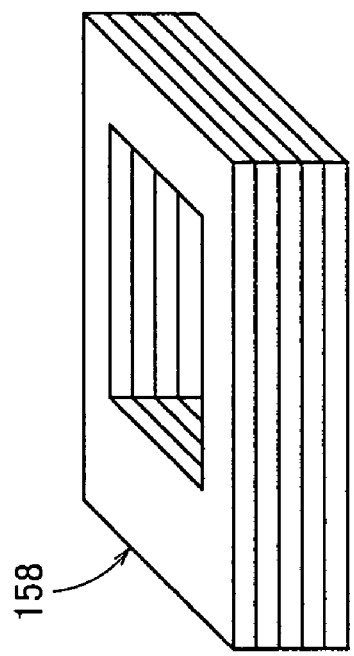
FIG. 20B illustrates a state in which a ceramic green stack is formed.
Figure 20A:
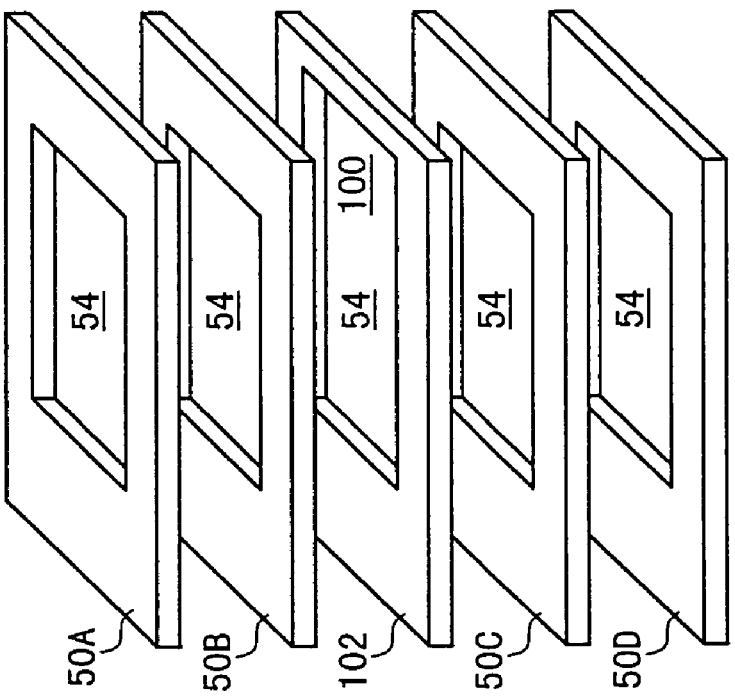
FIG. 20A illustrates a process for stacking necessary ceramic green sheets in a second production method.

On the other hand, in the second production method, at first, as shown in FIG. 20A, a plurality (for example, four) of ceramic green sheets 50A to 50D each of which is formed with a window 54 for forming at least the hole 12 thereafter, and a ceramic green sheet 102 which is continuously formed with a window 54 for forming the hole 12 thereafter and a window 100 for forming the movable section 20 having the mutually opposing end surfaces 36a, 36b are prepared.

After that, as shown in FIG. 20B, the ceramic green sheets 50A to 50D, 102 are stacked and secured under pressure to form a ceramic green stack 158. After that, the ceramic green stack 158 is sintered to obtain a ceramic stack 160 as shown in FIG. 21A. At this stage, the ceramic stack 160 is formed such that the hole 130 is formed by the windows 54, 100.

Subsequently, as shown in FIG. 21B, the metal plates 152A, 152B are glued to the ceramic stack 160 with the epoxy adhesive 200 so that the ceramic stack 160 is interposed between the metal plates 152A, 152B and the hole 130 is closed thereby to provide a hybrid stack 162. In this procedure, when the piezoelectric/electrostrictive elements 24a, 24b are affixed to the surfaces of the glued metal plates 152A, 152B, the hole 130 is optionally filled with a filler material 164 as shown in FIG. 21A so that a sufficient gluing pressure may be applied.

It is necessary to finally remove the filler material 164. Therefore, it is preferable to use a hard material which is easily dissolved in a solvent or the like. The material includes, for example, organic resin, wax, and brazing filler material. It is also possible to adopt a material obtained by mixing ceramic powder as a filler with organic resin such as acrylic.

Subsequently, as shown in FIG. 21B, the piezoelectric/electrostrictive elements 24a, 24b, which are constructed as separate members, are glued with the epoxy adhesive 202 to the surfaces of the metal plates 152A, 152B of the hybrid stack 162. The separate members of the piezoelectric/electrostrictive elements 24a, 24b can be formed, for example, in accordance with the ceramic green sheet-stacking method.

Figure 22:
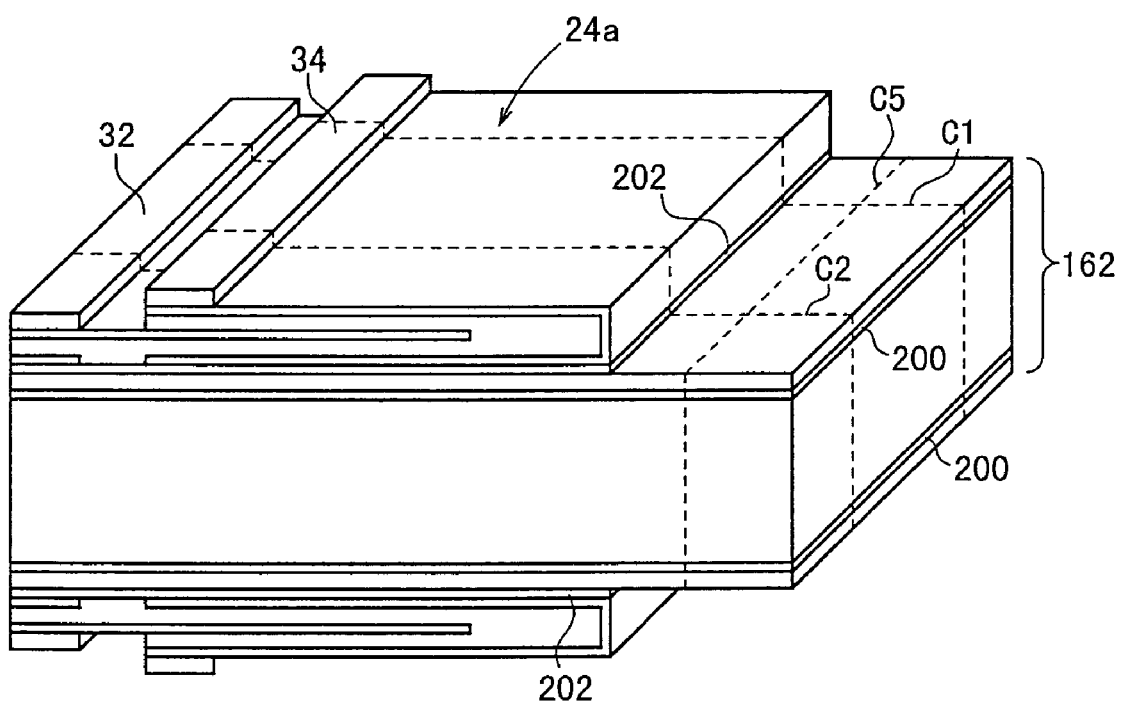
FIG. 22 illustrates a state in which piezoelectric/electrostrictive elements, which are constructed as separate members, are glued to the surfaces of the metal plates of the hybrid stack.
Figure 23:
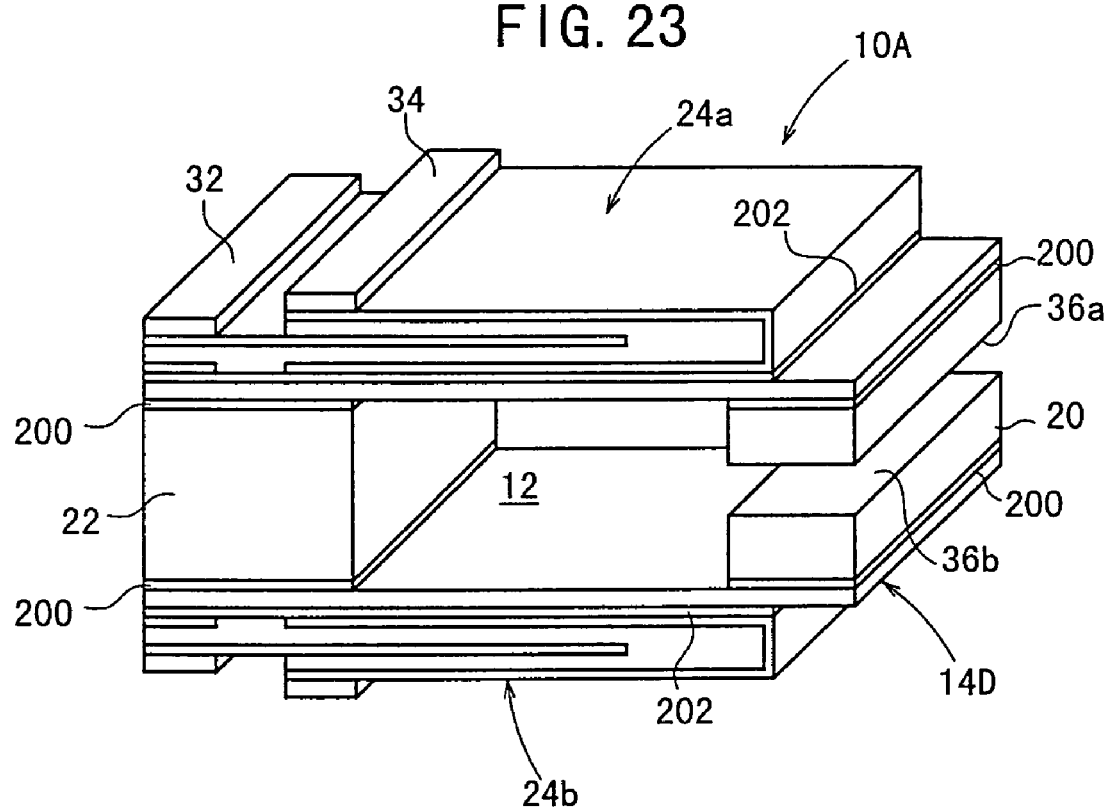
FIG. 23 illustrates a state in which the piezoelectric/electrostrictive device according to the first embodiment is produced by cutting the hybrid stack along predetermined cutting lines.

Subsequently, as shown in FIG. 22, the hybrid stack 162, which is formed with the piezoelectric/electrostrictive elements 24a, 24b, is cut along cutting lines C1, C2, C5 to thereby cut off side portions and forward end portions of the hybrid stack 162. As a result of the cutoff, as shown in FIG. 23, the piezoelectric/electrostrictive device 10A according to the first embodiment is obtained, in which the piezoelectric/electrostrictive elements 24a, 24b are formed on the thin plate sections constituted by the metal plates, of the substrate 14D, and the movable section 20 having the mutually opposing end surfaces 36a, 36b is formed.

When all of the substrate section is made of metal, for example, the portions corresponding to the ceramic stack 160 shown in FIG. 17A are formed by means of molding. Further, bulk-shaped members may be formed in accordance with the method of grinding machining, wire electric discharge machining, mold stamping, or chemical etching, or thin metal materials may be stacked to form the substrate section in accordance with the cladding method.

Next, a piezoelectric/electrostrictive device 10B according to the second embodiment will be explained with reference to FIGS. 24 to 52.

Figure 24:
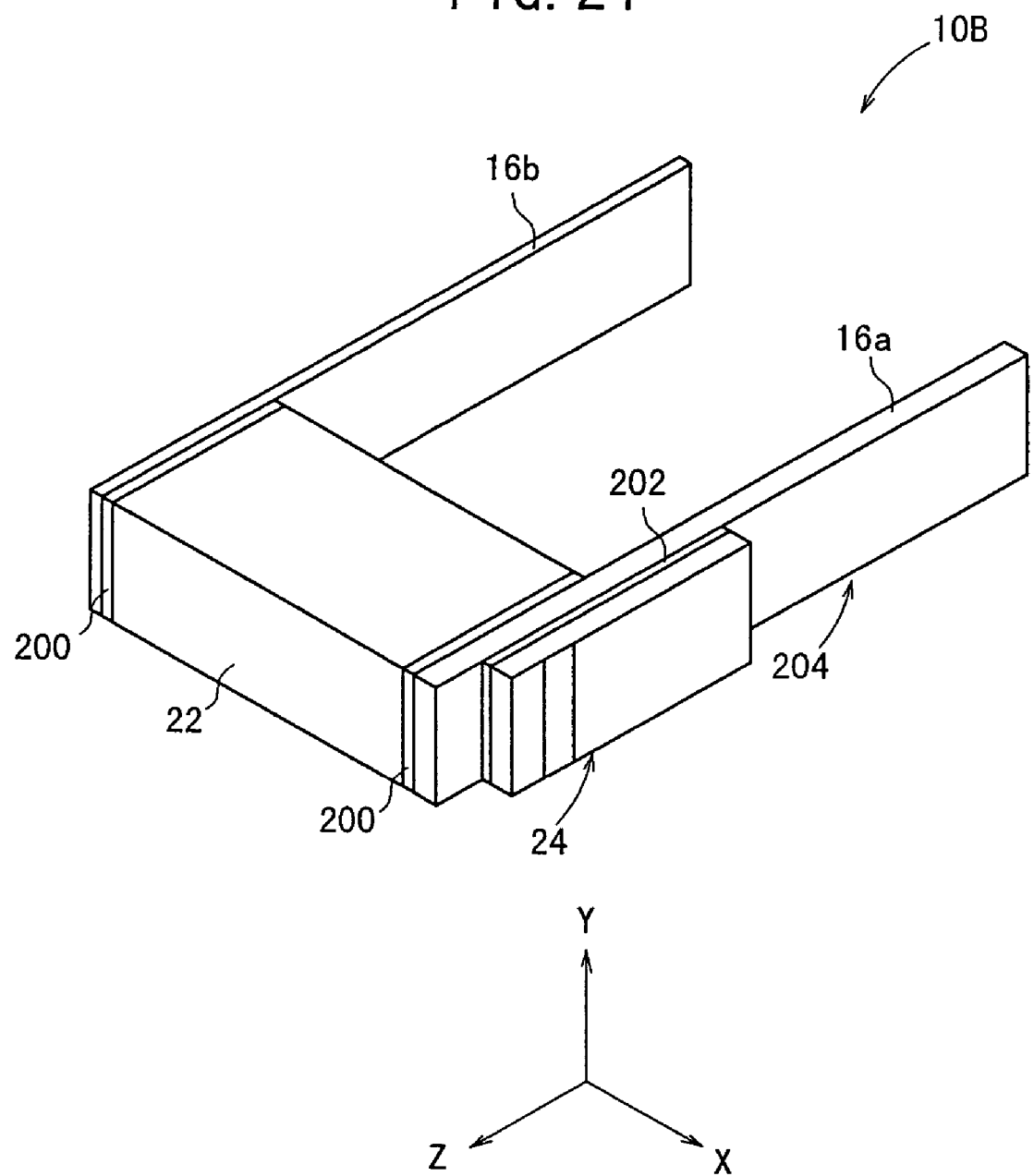
FIG. 24 shows a perspective view illustrating an arrangement of a piezoelectric/electrostrictive device according to a second embodiment.
Figure 25:
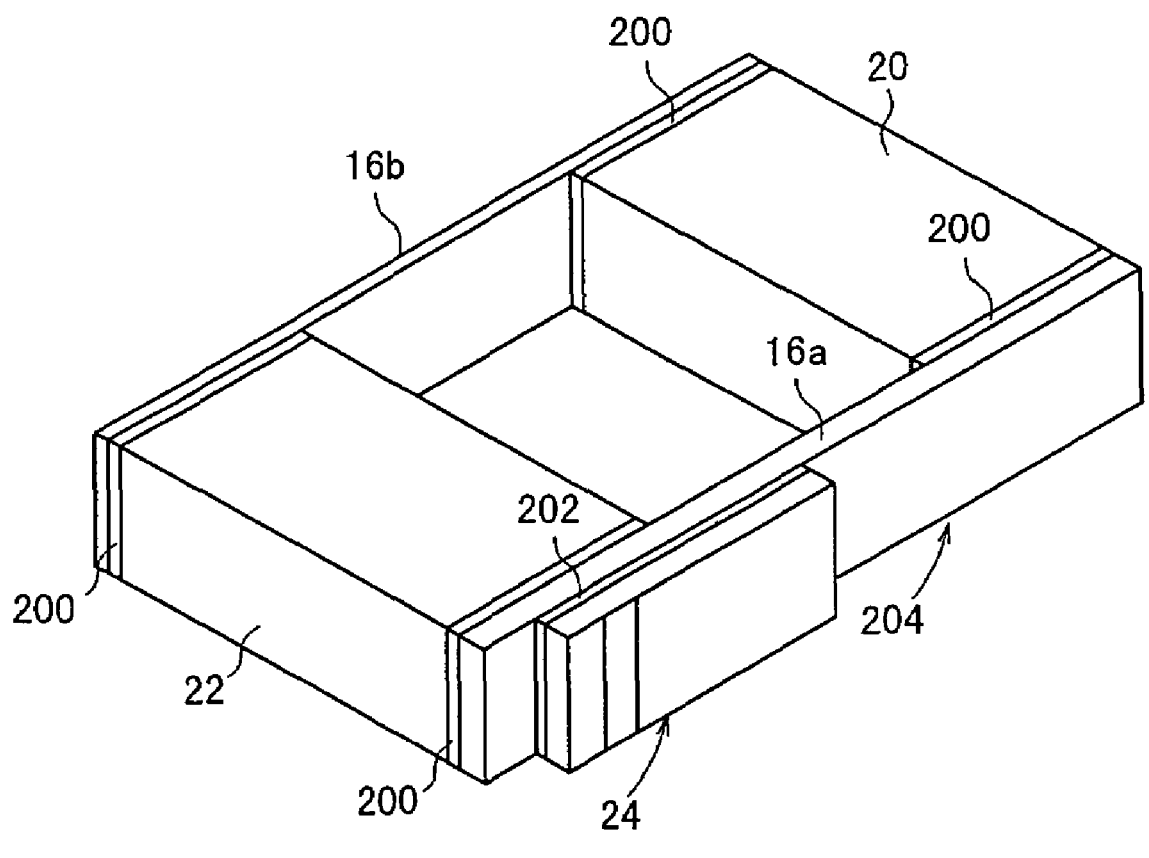
FIG. 25 shows a perspective view illustrating another arrangement of the piezoelectric/electrostrictive device according to the second embodiment.

As shown in FIG. 24, the piezoelectric/electrostrictive device 10B according to the second embodiment comprises a pair of mutually opposing thin plate sections 16a, 16b, and a fixation section 22 for supporting the thin plate sections 16a, 16b. A stacked type piezoelectric/electrostrictive element 24 is arranged on one thin plate section 16a of the pair of thin plate sections 16a, 16b. In FIGS. 24 and 25, the stacked type piezoelectric/electrostrictive element 24 is illustrated in a simplified manner, because its structure is complicated. Details are shown in magnified views of FIGS. 26 to 29.

The fixation section 22 is secured, for example, by the aid of an adhesive 200 between the respective rearward ends of the pair of thin plate sections 16a, 16b. The forward ends of the pair of thin plate sections 16a, 16b are open ends.

As shown in FIG. 25, for example, the movable section 20 or various parts and members are secured, for example, by the aid of the adhesive 200 between the respective forward ends of the pair of thin plate sections 16a, 16b. The example shown in FIG. 25 is illustrative of the case in which the movable section 20, which is constructed by the same member as that of the fixation section 22, is secured by the aid of the adhesive 200 between the respective forward ends of the pair of thin plate sections 16a, 16b.

Each of the pair of thin plate sections 16a, 16b is made of metal. The fixation section 22 and the movable section 20 are made of ceramics or metal. Especially, in the examples shown in FIGS. 24 and 25, the thickness of the first thin plate section 16a on which the stacked type piezoelectric/electrostrictive element 24 is formed, of the pair of thin plate sections 16a, 16b is larger than the thickness of the second thin plate section 16b.

The stacked type piezoelectric/electrostrictive element 24 is affixed to the thin plate section 16b by the aid of an adhesive 202 such as organic resin, glass, brazing, soldering, and eutectic bonding. That is, the stacked type piezoelectric/electrostrictive element 24 is secured by the adhesive 202 to the thin plate section 16a made of metal to thereby construct an actuator section 204 which is the driving source of the piezoelectric/electrostrictive device 10B.

In the piezoelectric/electrostrictive device 10B, the forward end (portion to which the movable section 20 is attached) of the thin plate section 16a (16a and 16b in the example shown in FIG. 25) is displaced in accordance with the driving of the actuator section 204. Alternatively, the displacement of the forward end of the thin plate section 16a is electrically detected by the aid of the actuator section (transducer section in the case of the use as a sensor) 204. In this case, the device is utilized as a sensor.

Figure 26:
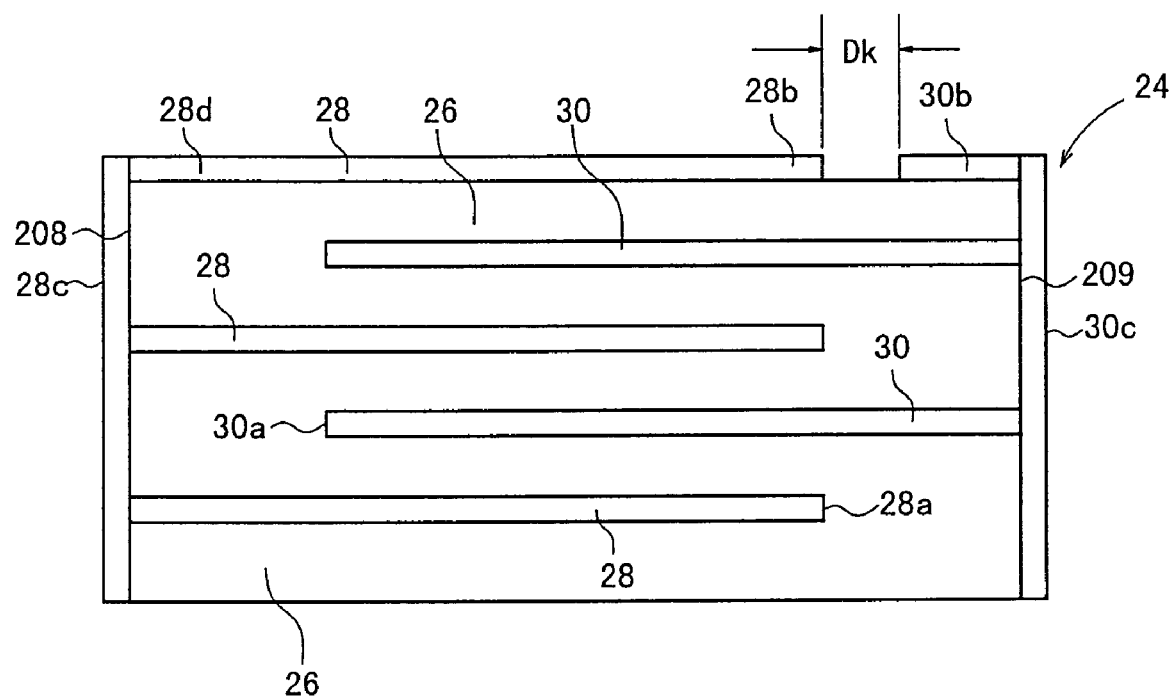
FIG. 26 shows a magnified view illustrating an exemplary arrangement of a stacked type piezoelectric/electrostrictive element.

As shown in FIG. 26, for example, the stacked type piezoelectric/electrostrictive element 24 is constructed as follows. That is, each of the piezoelectric/electrostrictive layer 26 and the pair of electrodes 28, 30 has the multilayered structure, and the first electrodes 28 and the second electrodes 30 are alternately stacked respectively to give the multiple stage structure at the portion at which the first electrodes 28 and the second electrodes 30 are overlapped with each other with the piezoelectric/electrostrictive layer 26 intervening therebetween.

In FIG. 26, each of the piezoelectric/electrostrictive layer 26 and the pair of electrodes 28, 30 has the multilayered structure. The first electrode 28 and the second electrode 30 are alternately stacked with each other to give the substantially comb-shaped configuration. The multiple stage structure is formed at the portion at which the first electrode 28 and the second electrode 30 are overlapped with each other with the piezoelectric/electrostrictive layer 26 interposed therebetween.

Specifically, the stacked type piezoelectric/electrostrictive element 24 has the approximately rectangular parallelepiped-shaped configuration, comprising a plurality of piezoelectric/electrostrictive layers 26 and a plurality of electrode films 28, 30. The electrode films 28, 30, which contact with the upper and lower surfaces of each of the piezoelectric/electrostrictive layers 26, are alternately led to opposite end surfaces 208, 209 respectively. End surface electrodes 28c, 30c, which electrically connect the respective electrode films 28, 30 alternately led to the opposite end surfaces 208, 209, are electrically connected to terminals 28b, 30b which are formed on the surface of the outermost layer of the piezoelectric/electrostrictive layer 26 and which are arranged while being separated from each other by a predetermined distance Dk.

It is preferable that the predetermined distance Dk between the terminals 28b, 30b is not less than 20 μm. Further, the material of the electrode films 28, 30 to make contact with the upper and lower surfaces of the piezoelectric/electrostrictive layer may be different from the material of the end surface electrodes 28c, 30c. Further, at least one of the terminals (terminal 28b in the example shown in FIG. 26) and the end surface electrode 28c corresponding to the terminal 28b may be electrically connected with a thin film electrode film (outer surface electrode) 28d which is thinner than the terminal 28b and the end surface electrode 28c.

The surface electrode film 28d, the end surface electrodes 28c, 30c, and the terminals 28b, 30b, which are formed before sintering the piezoelectric/electrostrictive layer 26, may be thin, and they may have low heat resistance, as compared with the electrode layers 28, 30 which are formed before sintering the piezoelectric/electrostrictive layer 26 or which are sintered simultaneously.

FIG. 26 is illustrative of the following case. That is, the piezoelectric/electrostrictive layer 26 has the five-layered structure. The first electrodes 28 are formed in the comb-shaped configuration so that they are disposed on the upper surface of the first layer, the upper surface of the third layer, and the upper surface of the fifth layer. The second electrodes 30 are formed in the comb-shaped configuration so that they are disposed on the upper surface of the second layer and the upper surface of the fourth layer.

Figure 28:
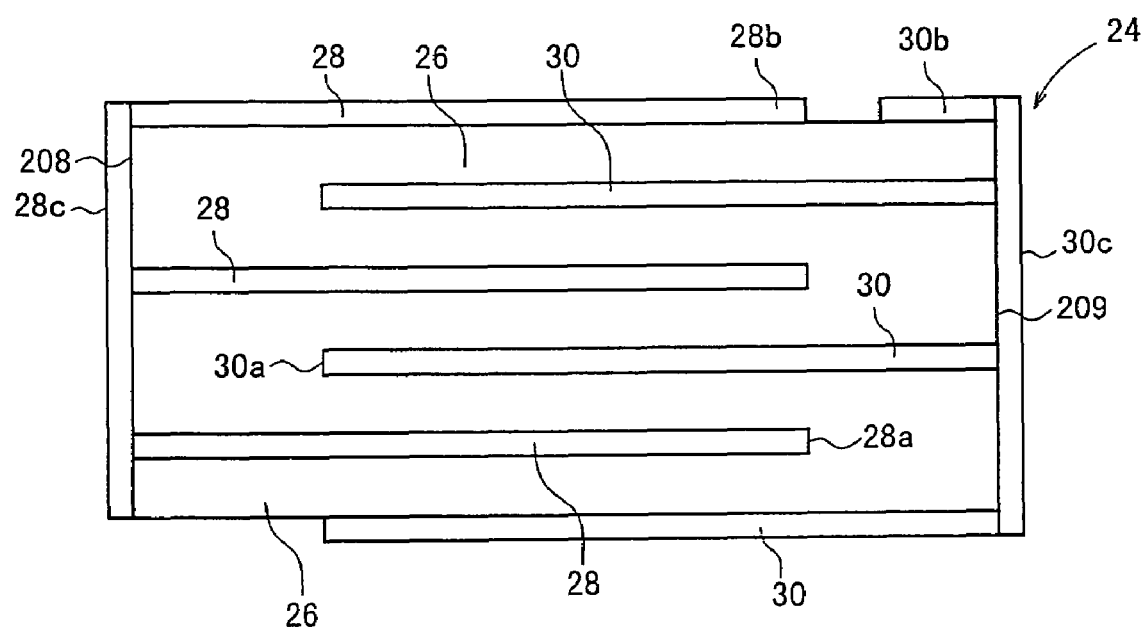
FIG. 28 shows a magnified view illustrating another exemplary arrangement of a stacked type piezoelectric/electrostrictive element.

FIG. 28 is illustrative of the following case. That is, the piezoelectric/electrostrictive layer 26 has the five-layered structure as well. The first electrodes 28 are formed in the comb-shaped configuration so that they are disposed on the upper surface of the first layer, the upper surface of the third layer, and the upper surface of the fifth layer. The second electrodes 30 are formed in the comb-shaped configuration so that they are disposed on the lower surface of the first layer, the upper surface of the second layer, and the upper surface of the fourth layer.

In the case of the structures described above, it is possible to suppress the increase in number of terminals by connecting the mutual first electrodes 28 and the mutual second electrodes 30 with each other to be common. Therefore, it is possible to suppress the increase in size, which would be otherwise caused when the stacked type piezoelectric/electrostrictive element 24 is used.

As described above, the driving force of the actuator section 204 is increased by using the stacked type piezoelectric/electrostrictive element 24, and thus it is possible to obtain the large displacement. Further, it is possible to realize the high resonance frequency by increasing the rigidity of the piezoelectric/electrostrictive device 10B itself. Thus, it is easy to achieve the high speed of the displacement action.

When the number of stages is increased, it is possible to increase the driving force of the actuator section 204. However, the electric power consumption is also increased in accordance therewith. Therefore, when the present invention is carried out, the number of stages may be appropriately determined depending on the way of use and the state of use. In the case of the piezoelectric/electrostrictive device 10B according to the second embodiment, the width of the thin plate section 16a, 16b (distance in the Y axis direction) is basically unchanged, even when the driving force of the actuator section 204 is increased, owing to the use of the stacked type piezoelectric/electrostrictive element 24. Therefore, the device is extremely preferred to make application, for example, to the actuator for the purpose of the ringing control and the positioning of the magnetic head for the hard disk to be used in an extremely narrow gap.

The stacked type piezoelectric/electrostrictive element 24 is preferably formed at the following position with respect to the thin plate section 16a. That is, the forward end 208 of the multilayered member for constructing the stacked type piezoelectric/electrostrictive element 24 is disposed at the position not including at least the fixation section 22 as viewed in plan view (position included in the hole 12 formed between the movable section 20 and the fixation section 22 in the example shown in FIG. 25). The rearward end 209 of the multilayered member for constructing the stacked type piezoelectric/electrostrictive element 24 is disposed at the position including at least the fixation section 22 as viewed in plan view. The end 28a of the electrode 28 is formed at the position including at least the fixation section 22 as viewed in plan view, and the end 30a of the electrode 30 is formed at the position not including at least the fixation section 22 as viewed in plan view (position included in the hole 12 formed between the movable section 20 and the fixation section 22 as well in the example shown in FIG. 25).

The voltage is applied to the pair of electrodes 28, 30 via ends (hereinafter referred to as "terminals 28b, 30b") of the respective electrodes 28, 30 formed on the fifth layer of the piezoelectric/electrostrictive layer 30. The respective terminals 28b, 30b are formed to be separated from each other in such a degree that they can be electrically insulated from each other.

The spacing distance Dk between the terminals 28b, 30b is preferably not less than 20 μm, and it is preferably not less than 50 μm when the thickness of the terminal 28b, 30b is 1 μm to 30 μm. The terminals 28b, 30b may be made of the same material as that of the internal electrodes 28, 30, or they may be made of a material different therefrom. For example, the same material may be used when the terminals 28b, 30b are sintered simultaneously with the piezoelectric/electrostrictive layer 26. The different materials may be used when the sintering is performed separately.

It is preferable for the end surface electrodes 28c, 30c that the internal electrodes 28, 30 and the piezoelectric/electrostrictive layer 26 are sintered, and then their end surfaces are subjected to, for example, grinding and polishing to effect the electric connection between the internal electrodes and the end surface electrodes. The material of the end surface electrodes 28c, 30c may be the same as, or different from that of the internal electrodes 28, 30. For example, it is preferable that platinum paste is utilized for the internal electrodes 28, 30, gold resinate is utilized for the outer surface electrode 28d, and gold paste is utilized for the end surface electrodes 28c, 30c and the terminals 28b, 30b. However, it is also possible to adopt approximately the same construction as that of the piezoelectric/electrostrictive device according to the first embodiment described above.

In this arrangement, the piezoelectric/electrostrictive device 10B can be independently fixed by utilizing the surface other than the surface on which the terminals 28b, 30b are arranged. As a result, it is possible to obtain high reliability for both of the fixation of the piezoelectric/electrostrictive device 10B and the electric connection between the circuit and the terminals 28b, 30b. In this arrangement, the electric connection between the terminals 28b, 30b and the circuit is made, for example, by means of the flexible printed circuit, the flexible flat cable, and the wire bonding.

As described above, in the piezoelectric/electrostrictive device 10B according to the second embodiment, the actuator section 204 is constructed by securing the stacked type piezoelectric/electrostrictive element 24 onto the thin plate section 16a made of metal by the aid of the adhesive 202. Therefore, it is possible to greatly displace the thin plate section 16a(and 16b) even when the areal size of the stacked type piezoelectric/electrostrictive element 24 is not widened as viewed in plan view. Further, the thin plate section 16a (and 16b) is made of metal. Therefore, the device is excellent in strength and toughness, and it is possible to respond to the quick displacement action as well.

In other words, in the second embodiment, it is possible to sufficiently respond to the variation of environment of use and the severe state of use. The device is excellent in shock resistance. It is possible to realize the long life time of the piezoelectric/electrostrictive device 10B, and it is possible to improve the handling performance of the piezoelectric/electrostrictive device 10B. Further, the thin plate section can be greatly displaced at a relatively low voltage. The rigidity of the thin plate section 16a (and 16b) is high, the film thickness of the actuator section 204 is thick, and the rigidity of the actuator section 204 is high. Accordingly, it is possible to achieve the realization of the high speed (realization of the high resonance frequency) of the displacement action of the thin plate section 16a (and 16b).

Usually, in order to drive, at a high speed, the actuator section 204 constructed by combining the thin plate section 16a and the piezoelectric/electrostrictive element 24 which makes strain deformation, it is necessary to increase the rigidity of the actuator section 204. In order to obtain large displacement, it is necessary to decrease the rigidity of the actuator section 204.

However, in the piezoelectric/electrostrictive device 10B according to the second embodiment, the thin plate sections 16a, 16b, which constitute the actuator section 204, are opposed to one another to provide the pair of thin plate sections 16a, 16b. The fixation section 22 is secured by the adhesive 200 between the respective rearward ends of the pair of thin plate sections 16a, 16b to construct the multiple stage structure of the piezoelectric/electrostrictive element 24. The position of the piezoelectric/electrostrictive element 24, the material and the size of the constitutive members are appropriately selected to construct the piezoelectric/electrostrictive device 10B. Therefore, it is possible to effect the both of the contradicting characteristics described above. When the object, which has the substantially the same degree of size as that of the fixation section 22, intervenes between the open ends of the pair of thin plate sections 16a, 16b, the minimum resonance frequency of the structure is not less than 20 kHz. Further, the relative displacement amount concerning the object and the fixation section 22 can be not less than 0.5 µm at a substantial applied voltage of 30 V at a frequency which is not more than ¼ of the resonance frequency.

As a result, it is possible to greatly displace the pair of thin plate sections 16a, 16b. Further, it is possible to achieve the realization of the high speed (realization of the high resonance frequency) of the displacement action of the piezoelectric/electrostrictive device 10B, especially of the pair of thin plate sections 16a, 16b.

In the piezoelectric/electrostrictive device 10B according to the second embodiment, the minute displacement of the piezoelectric/electrostrictive element 24 is amplified into the large displacement action by utilizing the bending of the thin plate sections 16a, 16b, and it is transmitted to the movable section 20. Therefore, the movable section 20 can be greatly displaced with respect to the major axis m (see FIG. 14) of the piezoelectric/electrostrictive device 10B.

In the piezoelectric/electrostrictive device 10B according to the second embodiment, it is unnecessary that all of the parts are formed with the piezoelectric/electrostrictive material which is a fragile material having a relatively heavy weight. Therefore, the device has the following advantages. That is, the device has the high mechanical strength, and it is excellent in handling performance, shock resistance, and moisture resistance. Further, the operation of the device is scarcely affected by harmful vibration (for example, noise vibration and remaining vibration during high speed operation).

Further, as shown in FIG. 24, the forward ends of the pair of thin plate sections 16a, 16b are the open ends. Accordingly, when various members or parts are attached to the piezoelectric/electrostrictive device 10B, it is possible to utilize the forward ends of the pair of thin plate sections 16a, 16b. The member or the part can be attached in such a way that the member or the part is interposed by the forward ends. In this case, it is possible to provide a large attachment area for the member or the part, and it is possible to improve the attachment performance for the part. Further, the member or the part to be attached is consequently included in the pair of thin plate sections 16a, 16b. Therefore, it is possible to decrease the size of the piezoelectric/electrostrictive device in the Y direction after attaching the member or the part. Thus, the device is advantageous to realize the compact size.

Of course, as shown in FIG. 25, when the movable section 20 is secured between the respective forward ends of the pair of thin plate sections 16a, 16b, then various members or parts are secured, for example, by the aid of an adhesive to the first principal surface of the movable section 20.

In the second embodiment, the forward end 208 of the multilayered member for constructing the stacked type piezoelectric/electrostrictive element 24 is disposed at the position not including at least the fixation section 22 as viewed in plan view. The rearward end of the multilayered member is disposed at the position including at least the fixation section 22 as viewed in plan view. The end 28a of the electrode 28 is disposed at the position including at least the fixation section 22 as viewed in plan view. The end 30a of the electrode 30 is disposed at the position not including the fixation section 22 as viewed in plan view.

For example, if the respective ends of the pair of electrodes 28, 30 are formed at the position included in the movable section 20, then it is feared that the displacement action of the pair of thin plate sections 16a, 16b is restricted by the stacked type piezoelectric/electrostrictive element 24, and it is impossible to obtain the large displacement. However, in the second embodiment, the foregoing positional relationship is adopted. Therefore, it is possible to avoid the inconvenience of the restriction of the displacement action of the movable section 20, and it is possible to increase the displacement amount of the pair of thin plate sections 16a, 16b.

Next, explanation will be made for preferred illustrative constructions of the piezoelectric/electrostrictive device 10B according to the second embodiment. The preferred illustrative constructions are approximately the same as those of the piezoelectric/electrostrictive device according to the first embodiment described above. Therefore, explanation will be made for only the preferred illustrative constructions inherent in the piezoelectric/electrostrictive device 10B according to the second embodiment.

At first, in the piezoelectric/electrostrictive device 10B according to the second embodiment, the shape of the device 10B is not the plate-shaped configuration like the conventional one. When the movable section 20 is provided, the movable section 20 and the fixation section 22 form the rectangular parallelepiped-shaped configuration. The pair of thin plate sections 16a, 16b are provided so that the side surfaces of the movable section 20 and the fixation section 22 are continuous to give the rectangular annular configuration. Therefore, it is possible to selectively enhance the rigidity of the piezoelectric/electrostrictive device 10B in the Y axis direction.

That is, in the piezoelectric/electrostrictive device 10B, it is possible to selectively generate only the action of the movable section 20 in the plane (in the XZ plane). It is possible to suppress the action of the pair of thin plate sections in the YZ plane (action in the so-called swaying direction).

It is desirable that the thin plate sections 16a, 16b are made of metal. The fixation section 22 and the movable section 20 may be made of materials of different types, but they are more preferably made of metal. For example, organic resin, brazing material, or solder may be used to glue the thin plate sections 16a, 16b to the fixation section 22 and glue the thin plate sections 16a, 16b to the movable section 20. However, it is more preferable to form an integrated structure formed by diffusion joining or welding between metal materials. It is more desirable to use metal subjected to the cold rolling process, because of the high strength owing to the presence of a great degree of dislocation.

Figure 30:
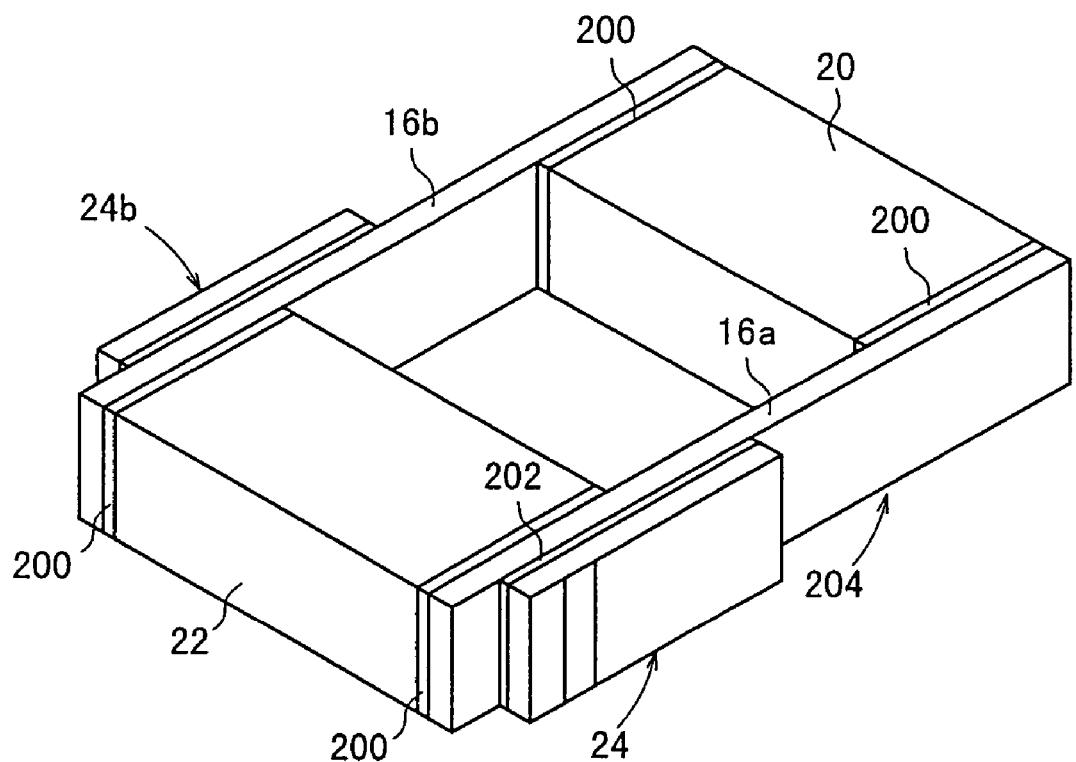
FIG. 30 shows a perspective view illustrating still another arrangement of the piezoelectric/electrostrictive device according to the second embodiment.

In the second embodiment, the stacked type piezoelectric/electrostrictive element 24 is formed on only one thin plate section 16a. Therefore, the device can be produced inexpensively as compared with a device (modified embodiment) in which the stacked type piezoelectric/electrostrictive elements 24a, 24b are formed on the pair of thin plate sections 16a, 16b respectively as shown in FIG. 30. Further, in the second embodiment, when the observation is made in a state in which the movable section 20 is secured, then the thin plate section 16a having the large thickness, on which the stacked type piezoelectric/electrostrictive element 24 is formed, is directly displaced, and the thin plate section 16bhaving the thin thickness, on which the stacked type piezoelectric/electrostrictive element 24 is not formed, is displaced in cooperation therewith. Accordingly, it is possible to cause the displacement to a greater extent.

The formation of the stacked type piezoelectric/electrostrictive element 24 on the thin plate section 16a can be realized by gluing the stacked type piezoelectric/electrostrictive element 24 to the thin plate section 16a, for example, with organic resin, brazing material, or solder. When the element is glued at a low temperature, it is desirable to use organic resin. When the element is allowed to be glued at a high temperature, it is preferable to use, for example, brazing material, solder, and glass. However, the coefficient of thermal expansion is generally differs among the thin plate section 16a, the stacked type piezoelectric/electrostrictive element 24, and the adhesive 202. Therefore, it is desirable that the gluing temperature is low in order not to generate any stress in the stacked type piezoelectric/electrostrictive element 24 due to the difference in coefficient of thermal expansion. In the case of organic resin, the gluing can be generally effected at a temperature of not more than 180° C. Therefore, organic resin is preferably adopted. More preferably, it is desirable to use a room temperature setting adhesive. When the fixation of the thin plate section 16a, 16b and the piezoelectric/electrostrictive element 24 is performed simultaneously with, or after the fixation of the movable section 20, the fixation section 22 and the thin plate section 16a, 16b, if the fixation section 22 or the movable section 20 has the open type structure, then it is possible to effectively reduce the strain which would be otherwise caused between the different types of materials.

In order not to exert any thermal stress on the stacked type piezoelectric/electrostrictive element 24, it is preferable that the stacked type piezoelectric/electrostrictive element 24 is glued to the thin plate section 16a with organic resin, and the fixation is performed in separate steps for the thin plate sections 16a, 16b, the fixation section 22, and the movable section 20.

Figure 31:
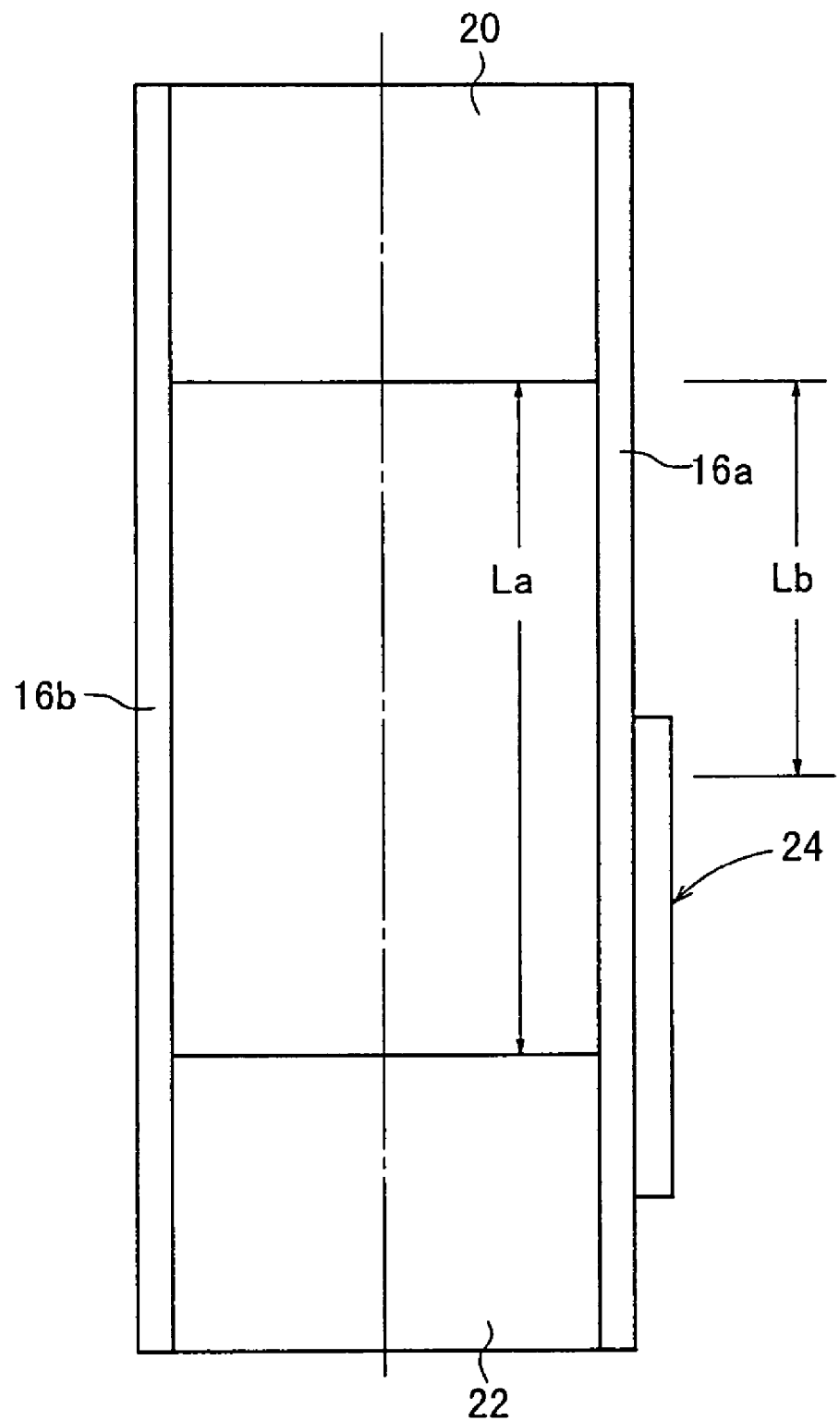
FIG. 31 illustrates the preferred dimensional relationship concerning the piezoelectric/electrostrictive device according to the second embodiment.

As shown in FIG. 31, when the part of the piezoelectric/electrostrictive element 24 is located at the fixation section 22, it is preferable that (1-Lb/La) is not less than 0.4, and more preferably 0.5 to 0.8 provided that La represents a shortest distance concerning the pair of thin plate sections 16a, 16b between a boundary portion with respect to the movable section 20 and a boundary portion with respect to the fixation section 22, and Lb represents a shortest distance of distances from the boundary portion between the thin plate section 16a and the movable section 20 to any one of the ends 28a, 30a of the pair of electrodes 28, 30 of the stacked type piezoelectric/electrostrictive element 24. If (1-Lb/La) is not more than 0.4, it is impossible to make large displacement. When (1-Lb/La) is 0.5 to 0.8, it is easy to successively achieve both of the displacement and the resonance frequency. However, in this case, it is more appropriate to use a structure in which the stacked type piezoelectric/electrostrictive element 24 is formed on only one thin plate section 16a. This fact also holds when the part of the piezoelectric/electrostrictive element 24 is located at the movable section 20.

It is preferable that the total thickness of the stacked type piezoelectric/electrostrictive element 24 is not less than 40 μm. If the total thickness is less than 40 μm, it is difficult to glue the stacked type piezoelectric/electrostrictive element 24 to the thin plate section 16a. It is desirable that the total thickness is not more than 180 μm. If the total thickness exceeds 180 μm, it is difficult to realize a compact size of the piezoelectric/electrostrictive device 10B.

Figure 29:
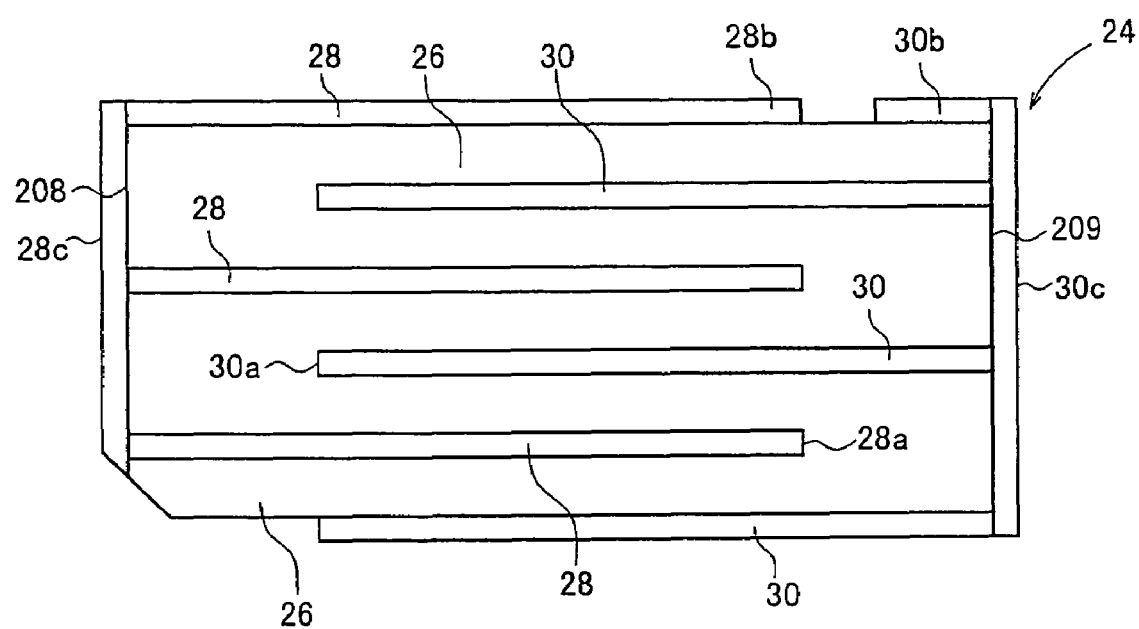
FIG. 29 shows a magnified view illustrating a preferred exemplary arrangement of the stacked type piezoelectric/electrostrictive element shown in FIG. 28.

As for the portion of the stacked type piezoelectric/electrostrictive element 24 to make contact with the thin plate section 16a, when the metal such as brazing material and solder layer is used as the adhesive 202, it is preferable that the electrode layer exists at the lowermost layer in view of the wettability as shown in FIGS. 28 and 29. FIGS. 28 and 29 show the state in which the electrode film for constructing the second electrode 30 is arranged.

Figure 27:
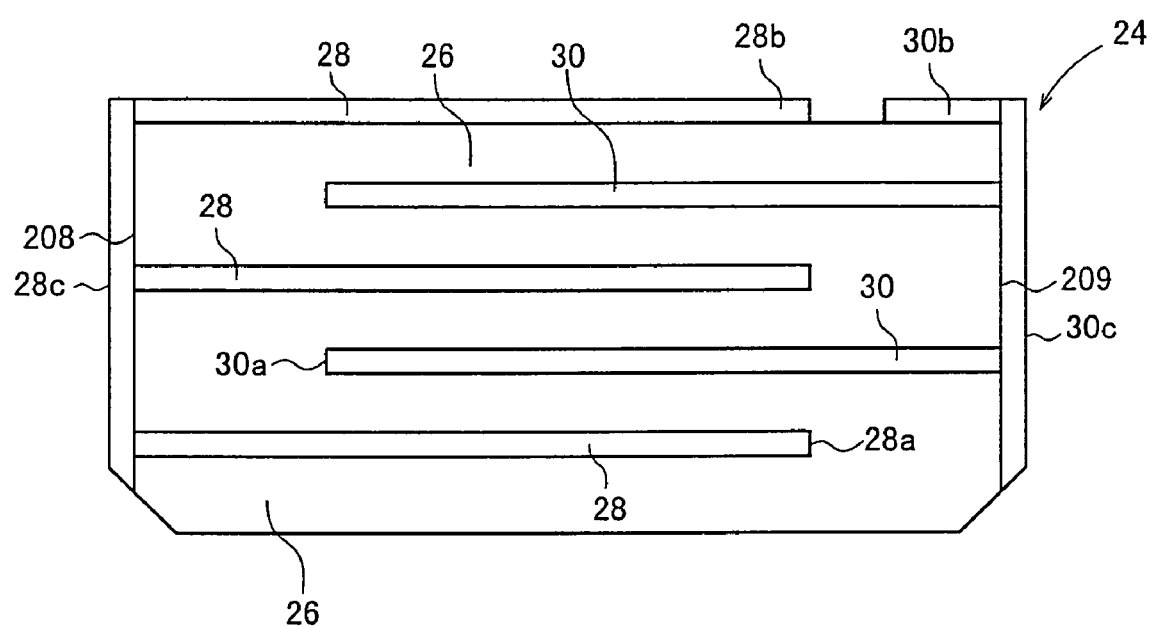
FIG. 27 shows a magnified view illustrating a preferred exemplary arrangement of the stacked type piezoelectric/electrostrictive element shown in FIG. 26.

When the stacked type piezoelectric/electrostrictive element 24 as shown in FIG. 26 and FIG. 28 is glued to the thin plate section 16a by the aid of the metal layer such as the brazing material and the solder layer, it is preferable to chamfer the angular portion at which at least one electrode 28 exists, of the lower surface of the stacked type piezoelectric/electrostrictive element 24 as shown in FIG. 27 and FIG. 29, because of the following reason. That is, it is intended to prevent the pair of electrodes 28, 30 from formation of short circuit which would be otherwise formed via the metal layer and the thin plate section 16a. FIG. 27 is illustrative of a case in which two angular portions, at which the pair of electrodes 28, 30 exist, are chamfered. FIG. 29 is illustrative of a case in which an angular portion, at which the first electrode 28 exists, is chamfered.

Those preferably used as the adhesive 202 for gluing the stacked type piezoelectric/electrostrictive element 24 to the thin plate section 16a and the adhesive 200 for gluing the thin plate sections 16a, 16b, for example, to the fixation section 22 include two-part type reactive adhesives such as those based on epoxy and isocyanate, instantaneous adhesives such as those based on cyanoacrylate, and hot melt adhesives such as those based on ethylene-vinyl acetate copolymer. Especially, it is preferable to use those having Shore D hardness of not less than 80 as the adhesive 202 for gluing the stacked type piezoelectric/electrostrictive element 24 to the thin plate section 16a.

It is desirable that an organic adhesive containing a filler such as metal and ceramics is used as the adhesive 202 for gluing the thin plate section 16a, 16b and the piezoelectric/electrostrictive element 24 (24a, 24b). In this case, it is desirable that the thickness of the adhesive 202 is not more than 100 μm, because of the following reason. That is, when the filler is contained, then the substantial thickness of the resin component is decreased, and it is possible to maintain a high hardness of the adhesive.

It is also preferable to use inorganic adhesives as the adhesive 200, 202, other than the organic adhesives described above. The inorganic adhesive includes, for example, glass, cement, solder, and brazing material.

On the other hand, as for the shape and the material quality for the thin plate sections 16a, 16b, it is enough to have the flexibility, with the mechanical strength of such a degree that no breakage is caused due to bending deformation. Metal is preferably adopted. In this case, as described above, it is preferable to use a metal material which has the flexibility and which is capable of the bending displacement. Specifically, it is preferable to use a metal material which has a Young's modulus of not less than 100 GPa.

Preferably, it is desirable that the thin plate section 16a, 16b is made of an iron-based material such as various spring steel materials, marageing stainless steel materials, and stainless steel materials including, for example, austenite-based stainless steel materials such as SUS301, SUS304, AISI653, and SUH660, ferrite-based stainless steel materials such as SUS430 and SUS434, maltensite-based stainless steel materials such as SUS410 and SUS630, and semiaustenite-based stainless steel materials such as SUS631 and AISI632. Alternatively, it is desirable that the thin plate section 16a, 16b is made of a non-ferrous material such as superelastic titanium alloy represented by titanium-nickel alloy, brass, cupronickel, aluminum, tungsten, molybdenum, beryllium copper, phosphor bronze, nickel, nickel-iron alloy, and titanium.

Next, explanation will be made with reference to FIGS. 32 to 40 for several production methods for manufacturing the piezoelectric/electrostrictive device 10B according to the second embodiment.

Figure 32:
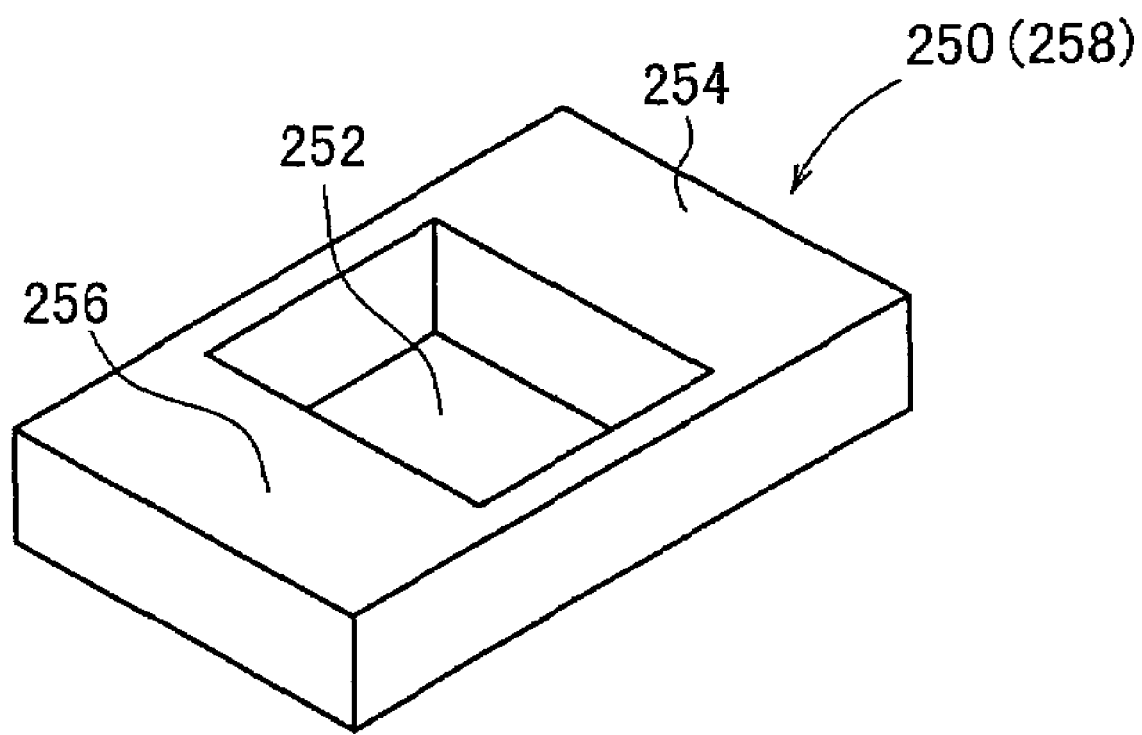
FIG. 32 illustrates a state in a third production method in which a rectangular hole is bored through a central portion of a stainless steel plate to manufacture a substrate having a rectangular annular structure.

In the third production method, as shown in FIG. 32, a rectangular hole 252 having a size of width: 1 mm×length: 8 mm is firstly bored through a central portion of a stainless steel plate 250 having a size of width: 1.6 mm×length: 10 mm×thickness: 0.9 mm to manufacture a substrate 258 having a rectangular annular structure with support sections 254, 256 arranged on both sides of the hole 252 respectively.

Figure 33:
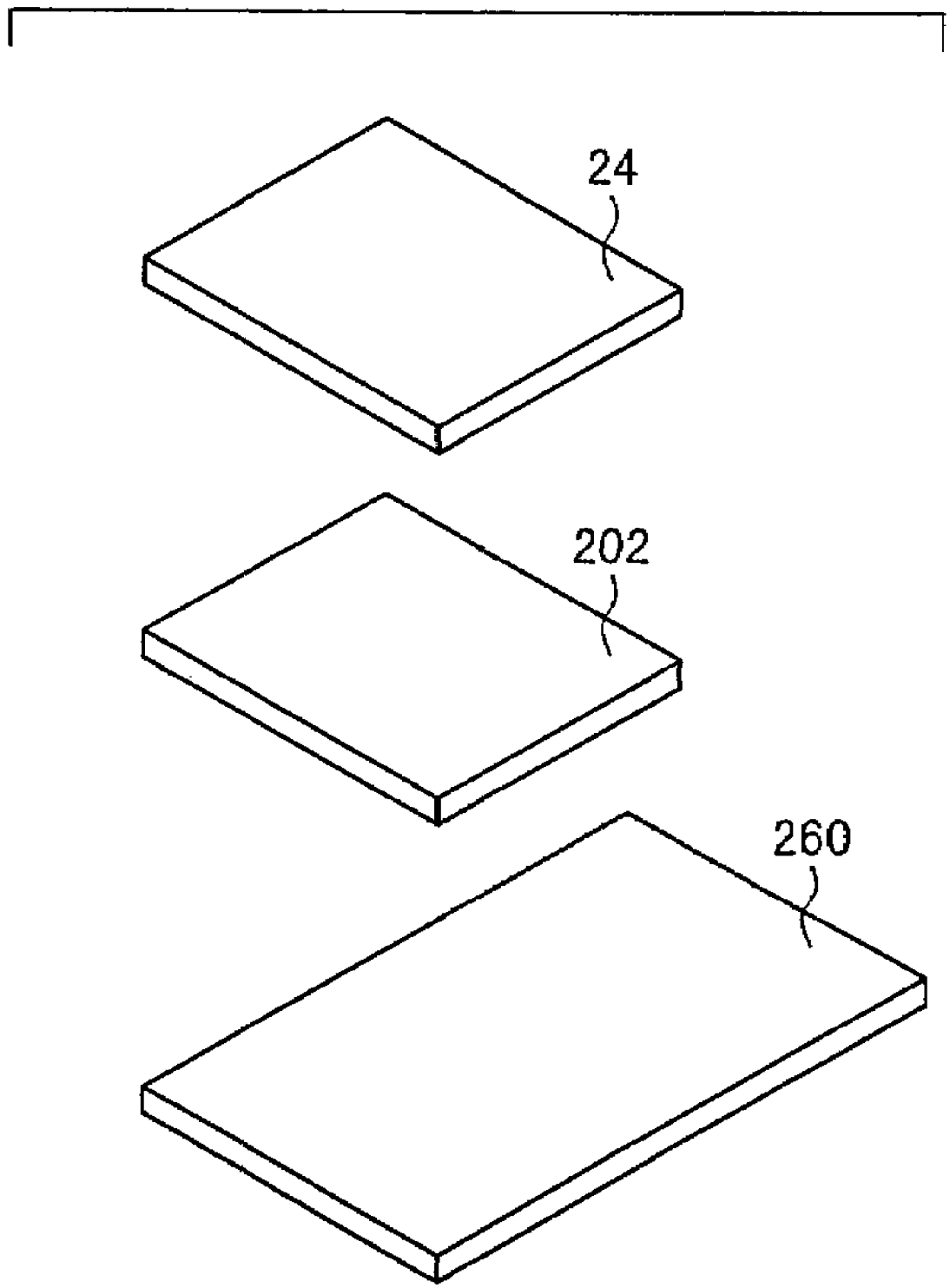
FIG. 33 illustrates a state in which an adhesive is formed on the first stainless steel thin plate.

After that, as shown in FIG. 33, a first stainless steel thin plate 260 having a size of width: 1.6 mm×length: 10 mm×thickness: 0.05 and a second stainless steel thin plate 262 having a size of width: 1.6 mm×length: 10 mm×thickness: 0.02 (see FIG. 35) are prepared.

Figure 34:
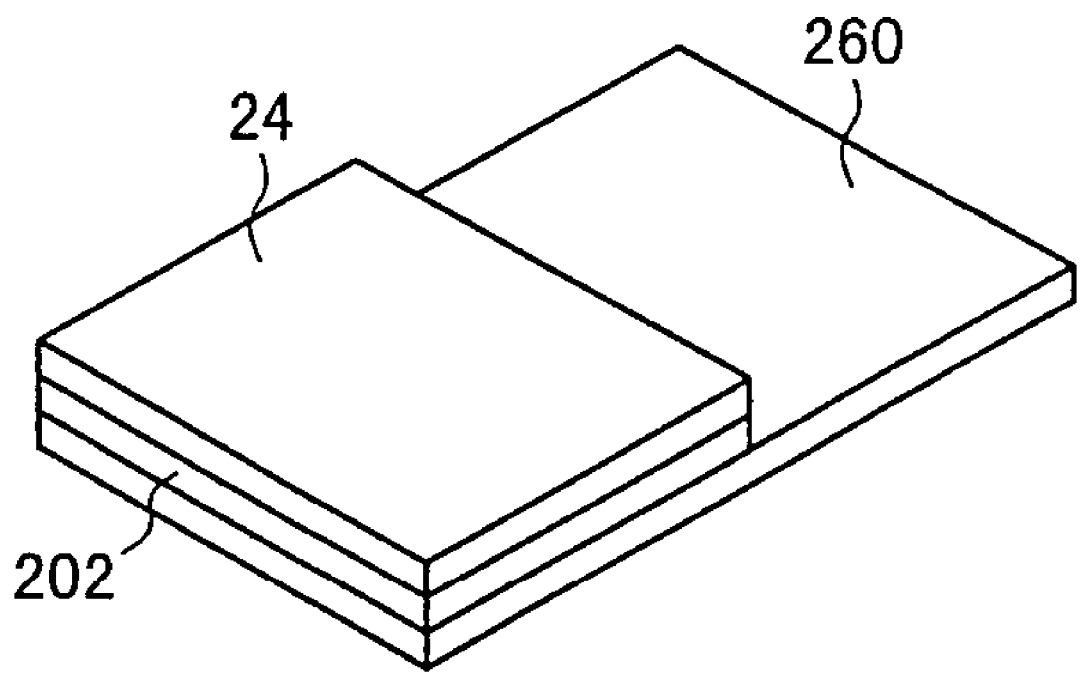
FIG. 34 illustrates a state in which the stacked type piezoelectric/electrostrictive element is glued to the first stainless steel thin plate with the adhesive intervening therebetween.

After that, as shown in FIG. 33, the adhesive 202 (for example, an adhesive made of epoxy resin) is formed by the screen printing on a portion of the upper surface of the first stainless steel thin plate 260 on which the stacked type piezoelectric/electrostrictive element 24 is formed. After that, as shown in FIG. 34, the stacked type piezoelectric/electrostrictive element 24 is glued to the first stainless steel thin plate 260 by the aid of the adhesive 202.

Figure 35:
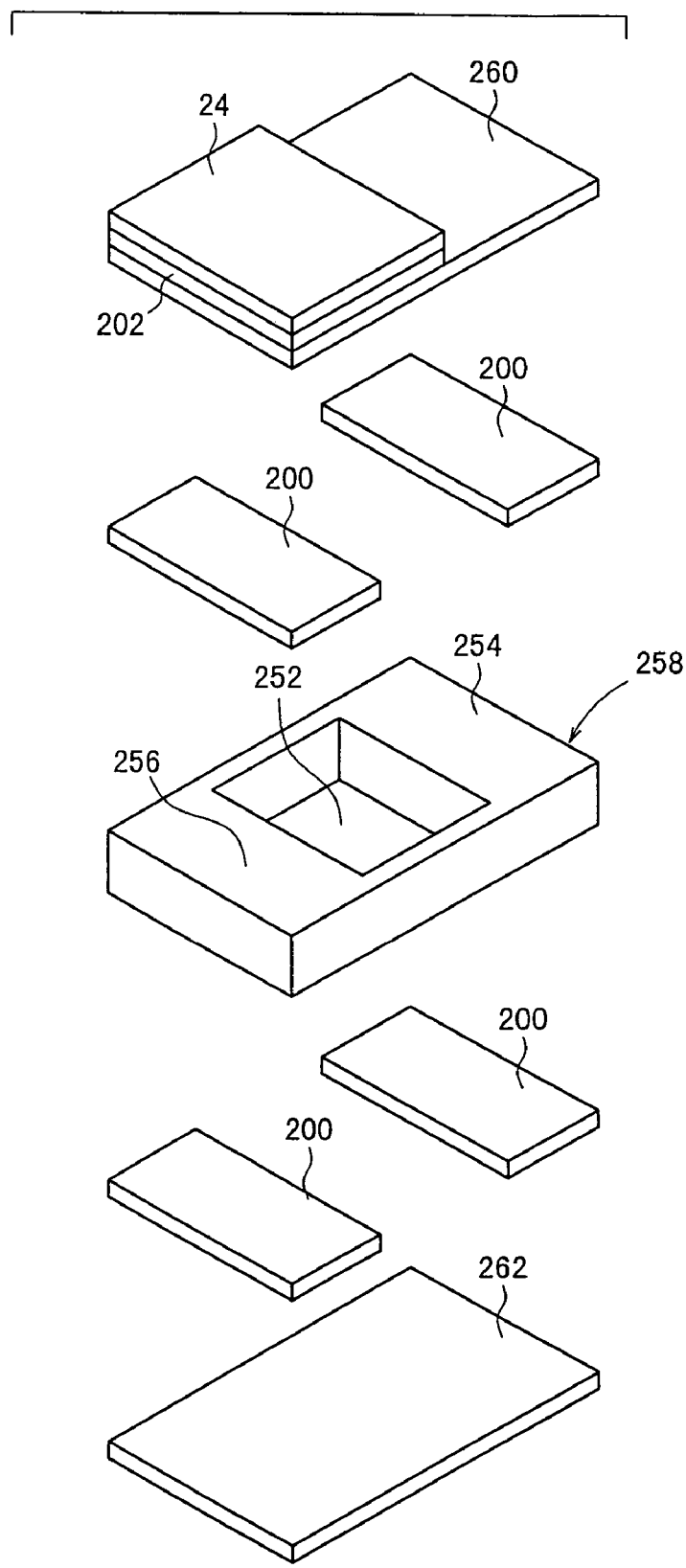
FIG. 35 illustrates a state in which the first and second stainless steel thin plates are glued to the substrate by the aid of the adhesive.

After that, as shown in FIG. 35, the adhesive 200 (for example, an adhesive made of epoxy resin) is formed by the screen printing on the respective support sections 254, 256 of the substrate 258.

After that, the first stainless steel thin plate 260, on which the stacked type piezoelectric/electrostrictive element 24 has been already formed, is glued to the first surface of each of the support sections 254, 256 by the aid of the adhesive 200. The second stainless steel thin plate 262 is glued to the second surface of each of the support sections 254, 256 by the aid of the adhesive 200. Further, the pressure is applied to the first and second stainless steel thin plates 260, 262 in a direction to interpose the substrate 258 to manufacture a master device block 270 shown in FIG. 36. The applied pressure is 0.1 to 10 kgf/cm².

Figure 36:
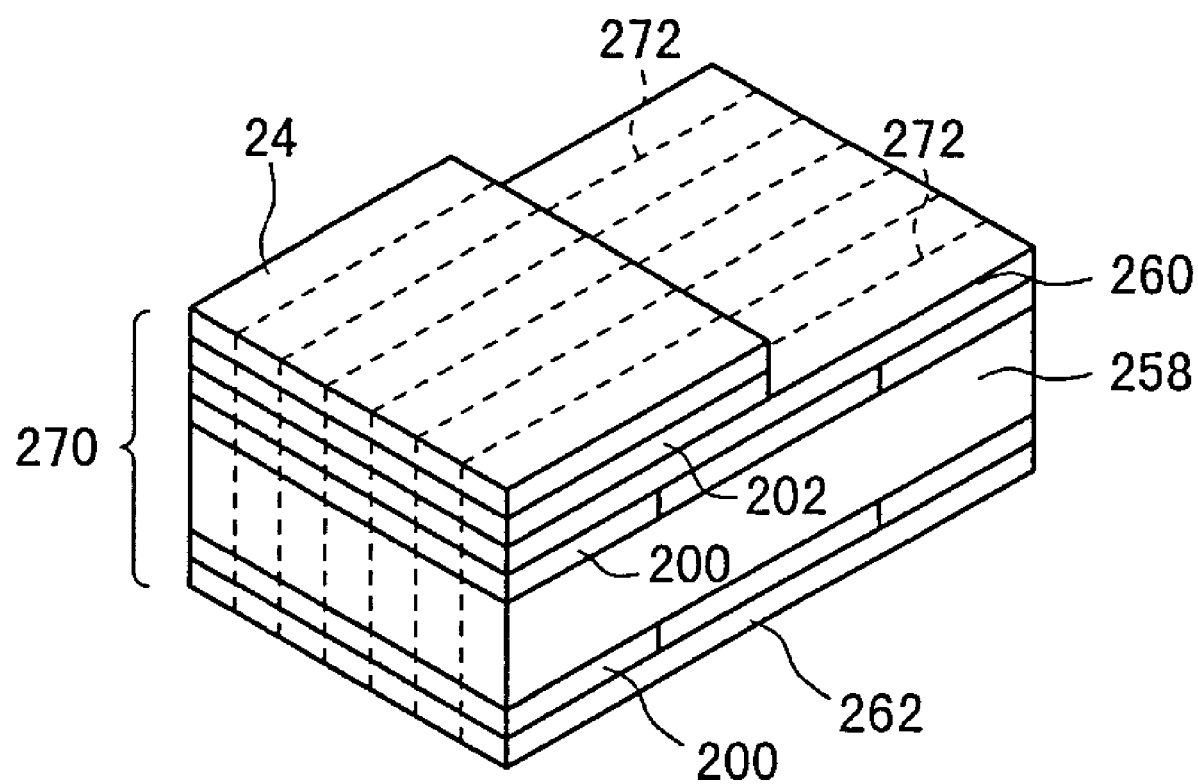
FIG. 36 illustrates a state in which a manufactured master device block is cut.

After that, as shown in FIG. 36, the master device block 270 is cut into portions along cutting lines 272 to divide the block into the individual piezoelectric/electrostrictive devices 10B as shown in FIG. 25. The cutting process was performed by using a wire saw having a wire diameter of 0.1 mm and a spacing distance of 0.2 mm. When the wire saw is used, it is possible to prescribe substantially the same size for the width of the piezoelectric/electrostrictive element 24, the width of the thin plate section 16a, and the width of the adhesives 200, 202, although these components are made of different materials respectively.

Figure 37:
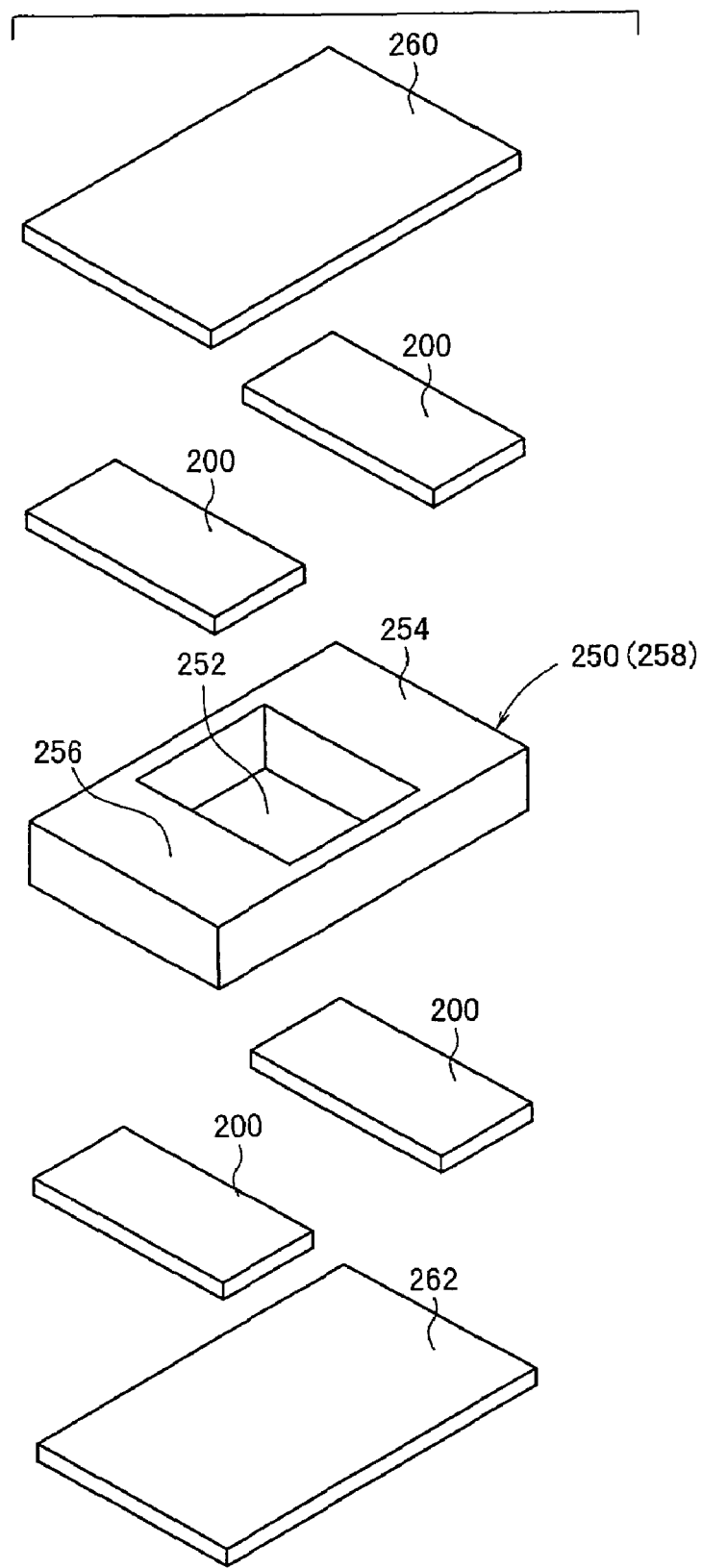
FIG. 37 illustrates a state in a fourth production method in which a rectangular hole is bored through a central portion of a stainless steel plate to manufacture a substrate having a rectangular annular structure, and first and second stainless steel thin plates are glued to the substrate by the aid of an adhesive.

Next, in the fourth production method, as shown in FIG. 37, a rectangular hole 252 having a size of width: 1 mm×length: 8 mm is bored through a central portion of a stainless steel plate 250 having a size of width: 1.6 mm×length: 10 mm×thickness: 0.9 mm to manufacture a substrate 258 having a rectangular annular structure with support sections 254, 256 arranged on both sides of the hole 252 respectively.

After that, the adhesive 200 (for example, an adhesive made of epoxy resin) is formed by the screen printing on the respective support sections 254, 256 of the substrate 258.

Figure 38:
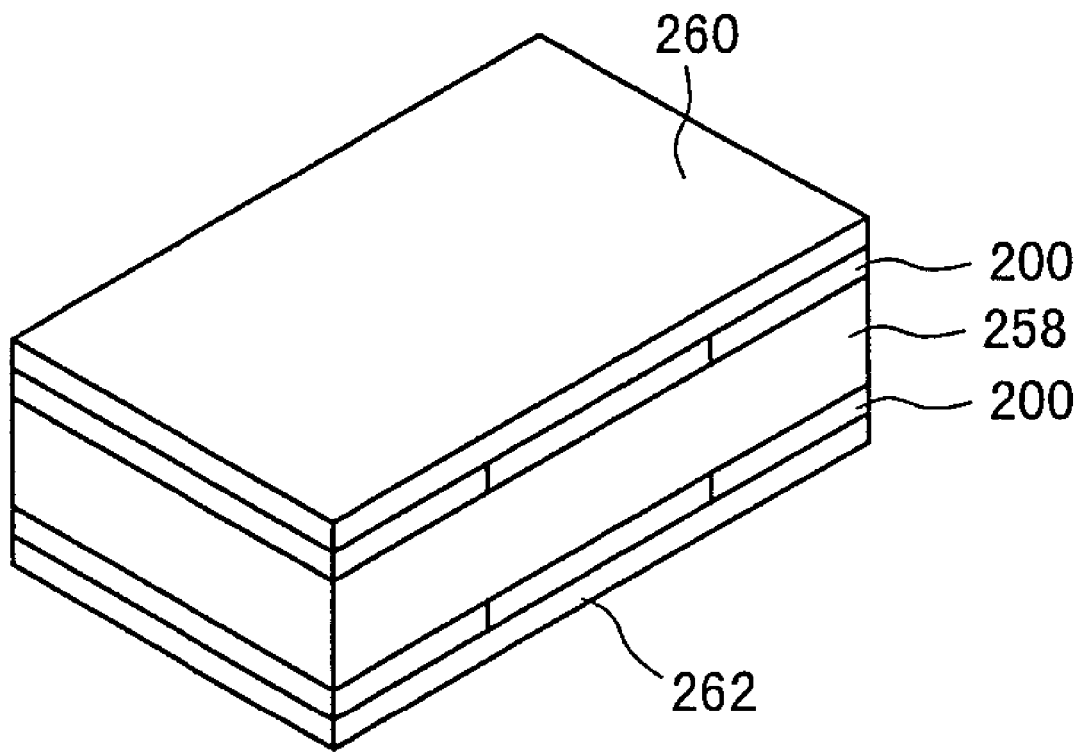
FIG. 38 illustrates a state in which the first and second stainless steel thin plates are glued by the aid of the adhesive.
Figure 39:
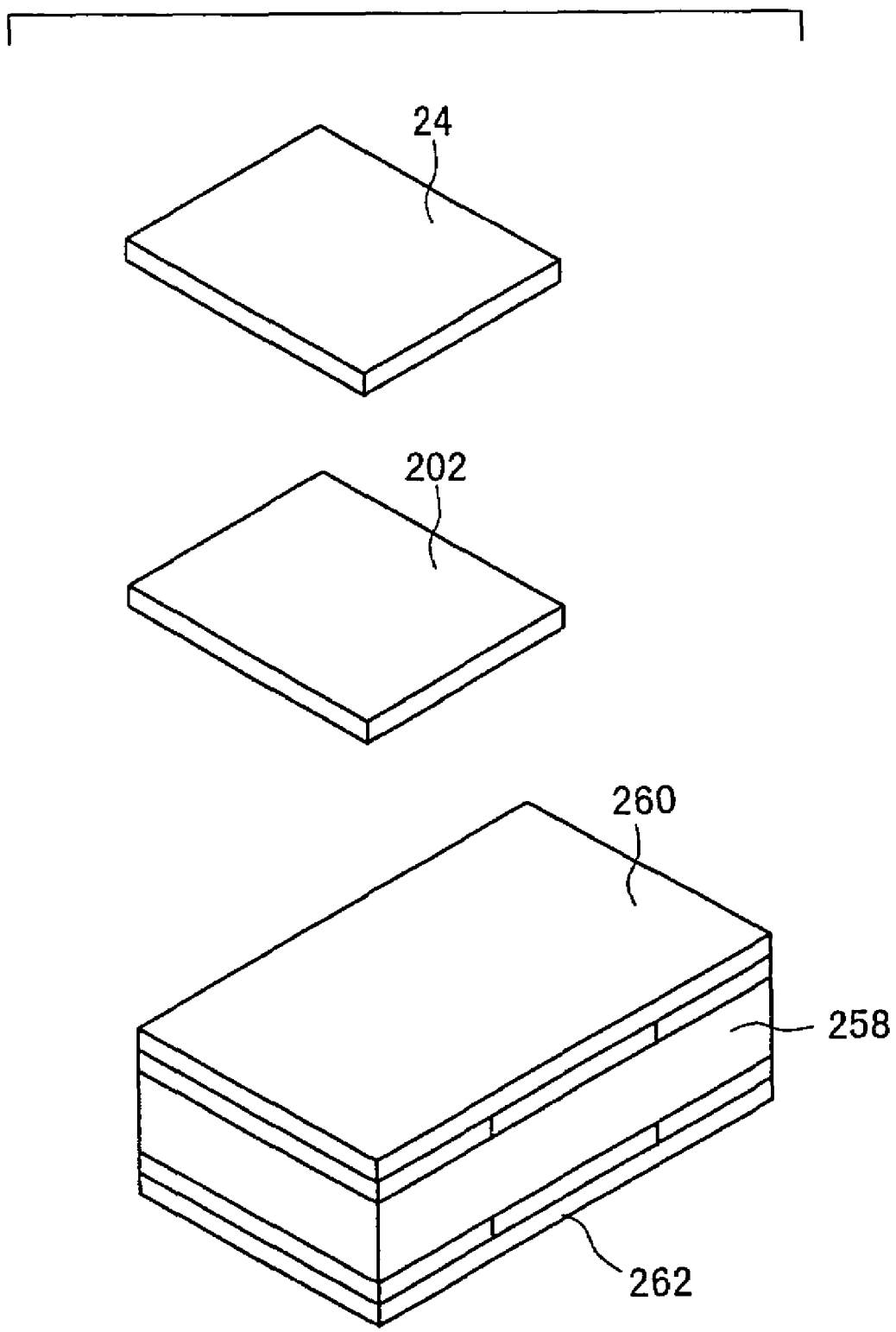
FIG. 39 illustrates a state in which the adhesive is formed on the first stainless steel thin plate.

After that, as shown in FIG. 38, a first stainless steel thin plate 260 having a size of width: 1.6 mm×length: 10 mm×thickness: 0.05 is glued to the first surface of each of the support sections 254, 256 by the aid of the adhesive 200. A second stainless steel thin plate 262 having a size of width: 1.6 mm×length: 10 mm×thickness: 0.02 is glued to the second surface of each of the support sections 254, 256 by the aid of the adhesive 200. Further, the pressure is applied to the first and second stainless steel thin plates 260, 262 in a direction to interpose the substrate 258. The applied pressure is 0.1 to 10 kgf/cm².

After that, the adhesive 202 (for example, an adhesive made of epoxy resin) is formed by the screen printing on a portion of the upper surface of the first stainless steel thin plate 260 on which the stacked type piezoelectric/electrostrictive element 24 is formed.

Figure 40:
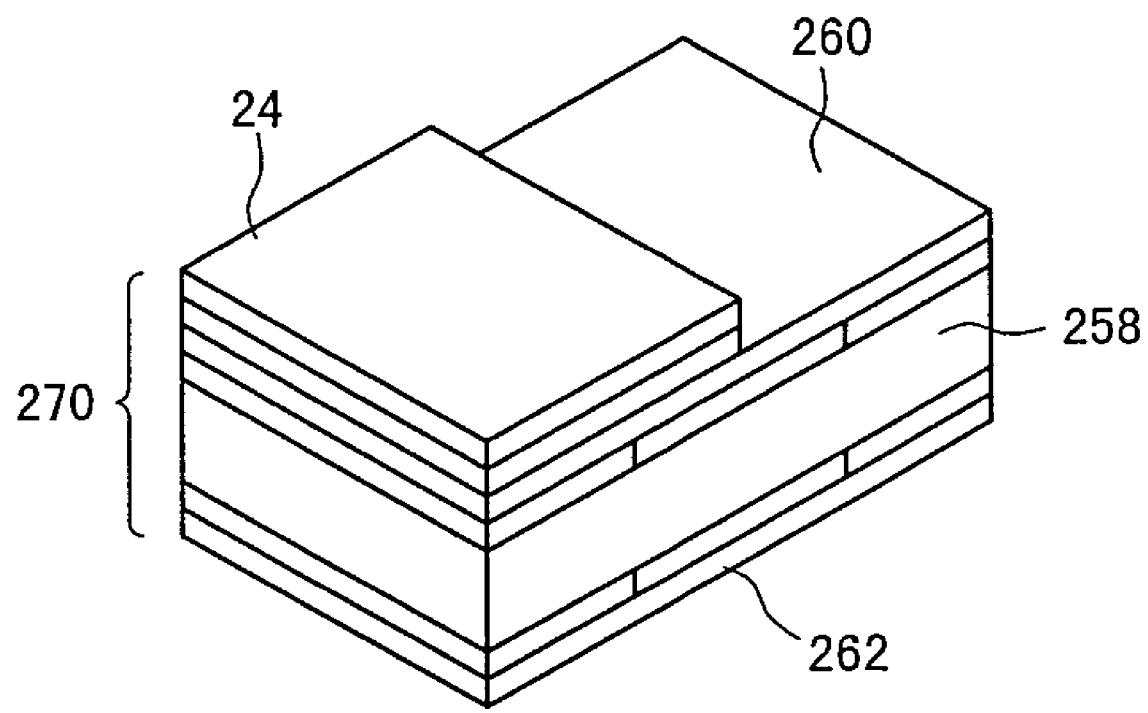
FIG. 40 illustrates a state in which a stacked type piezoelectric/electrostrictive element is glued to the first stainless steel thin plate by the aid of the adhesive.

After that, as shown in FIG. 40, the stacked type piezoelectric/electrostrictive element 24 is glued to the first stainless steel thin plate 260 by the aid of the adhesive 202 to manufacture a master device block 270.

After that, as shown in FIG. 36, the master device block 270 is cut into portions along cutting lines 272 to divide the block into the individual piezoelectric/electrostrictive devices 10B as shown in FIG. 25.

A part (for example, the fixation section 22) of the piezoelectric/electrostrictive device 10B produced in accordance with the first and second production methods was fixed. A bias voltage of 15 V and a sine wave voltage of ±15 V were applied between the pair of electrodes 28, 30 of the stacked type piezoelectric/electrostrictive element 24 to measure the displacement of the movable section 20. As a result, the displacement was ±1.2 μm. The frequency was swept with a sine wave voltage of ±0.5 V to measure the minimum resonance frequency to exhibit the maximum displacement. As a result, the minimum resonance frequency was 50 kHz.

In the third and fourth production methods described above, the substrate 258 is constructed to have the rectangular annular structure having the support section 254 to be formed into the movable section 20 thereafter and the support section 256 to be formed into the fixation section 22 thereafter. Alternatively, as shown in FIG. 41, a rectangular annular structure is also available, in which a hole 252 is widened to have a frame-shaped section 254a for supporting first and second stainless steel thin plates 260, 262 (section for substantially defining the thickness of a portion to allow at least the movable section 20 to intervene thereafter) and a support section 256 to be formed into the fixation section 22 thereafter.

Figure 44:
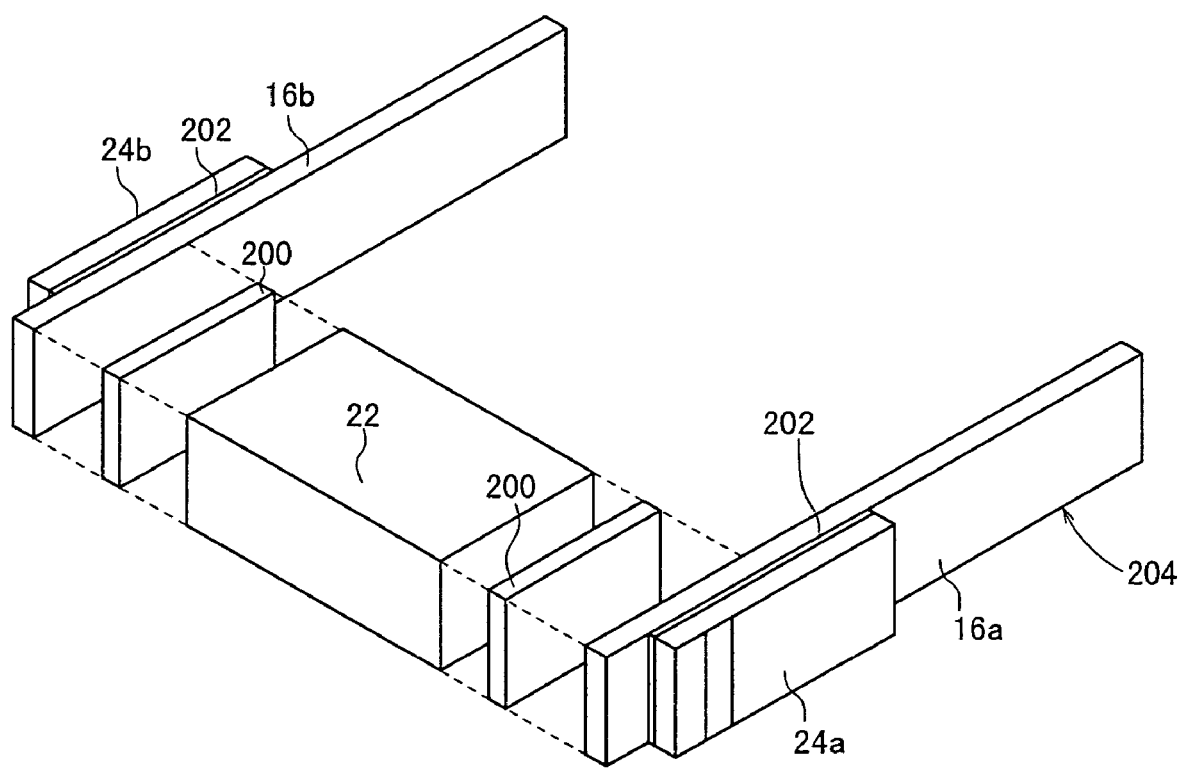
FIG. 44 illustrates an example in which no bump is provided on respective stainless steel thin plates.

In this case, the substrate 258 is secured by the aid of the adhesive 200 so that the substrate 258 is interposed between the first and second stainless steel thin plates 260, 262 to manufacture a master device block 270 similar to one shown in FIG. 36, followed by being cut along cutting lines 272 as shown in FIG. 36. Accordingly, as shown in FIG. 44, for example, it is possible to produce a piezoelectric/electrostrictive device in which the movable section 20 does not exist between the forward ends of the thin plate sections 16a, 16b.

Next, explanation will be made with reference to FIGS. 42 to 46 for a fifth production method which is different from the third and fourth production methods described above.

The fifth production method is also applicable to a case in which support sections 254, 256 are glued to a first stainless steel thin plate 260 and a second stainless steel thin plate 262 to manufacture a master device block 270 in the same manner as in the third and fourth production methods described above, followed by being divided into individual piezoelectric/electrostrictive devices. The fifth production method is also applicable to a case in which the piezoelectric/electrostrictive device 10B is produced by securing the fixation section 22 (and the movable section 20, if desirable) prepared separately to a unit prepared separately as each actuator section 204 comprising the stacked type piezoelectric/electrostrictive element 24a, 24b formed on the thin plate sections 16a, 16b.

In the following description, the support section 254 to be formed into the movable section 20 thereafter and the movable section 20 are conveniently referred to as "movable section 20", the support section 256 to be formed into the fixation section 22 thereafter and the fixation section 22 are conveniently referred to as "fixation section 22", and the first and second stainless steel thin plates 260, 262 to be formed into the thin plate sections 16a, 16b thereafter and the thin plate sections 16a, 16b are conveniently referred to as "thin plate sections 16a, 16b".

Figure 42:
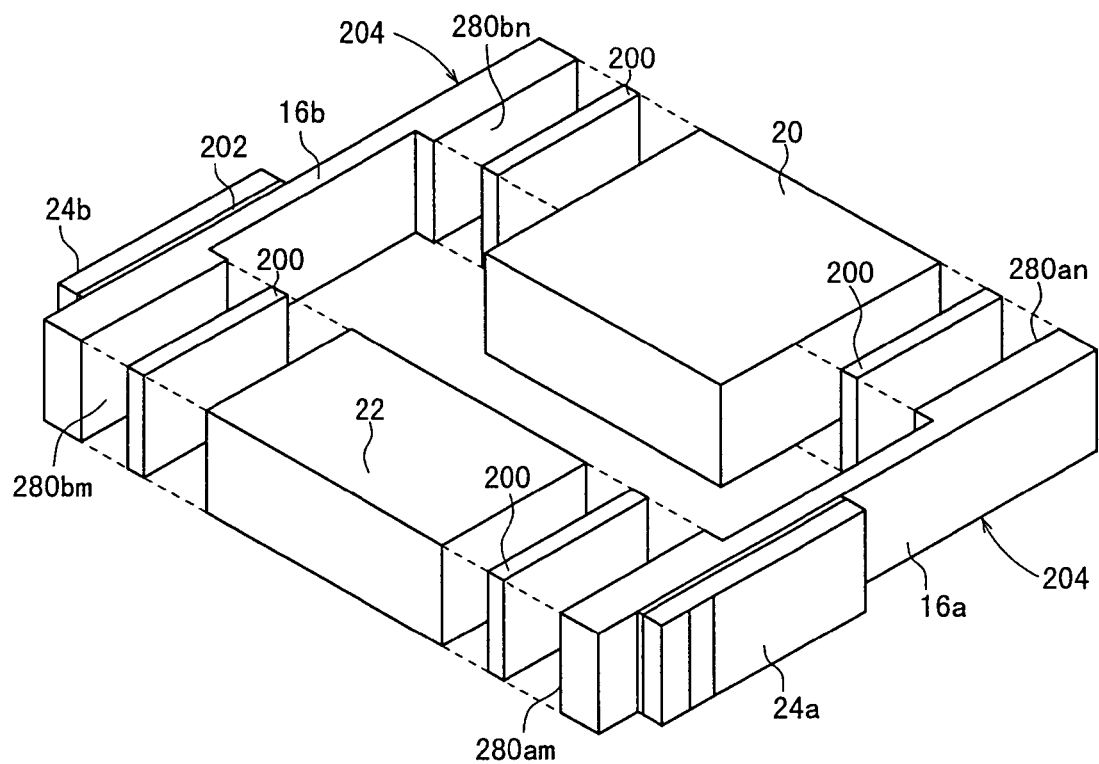
FIG. 42 illustrates an example in which bumps are provided at portions of respective stainless steel thin plates to which a support section to be formed into a movable section thereafter and a support section to be formed into a fixation section thereafter are glued respectively.

As shown in FIG. 42, when the thin plate sections 16a, 16b are glued by the aid of adhesive 200 to the movable section 20 and the fixation section 22 respectively, if the adhesive having fluidity is used, then it is preferable to provide bumps 280am, 280an, 280bm, 280bn for the respective thin plate sections 16a, 16b in order to define the places for forming the adhesive 200. Of course, when the adhesive having high viscosity is used, it is unnecessary to provide such a bump. The bumps 280am, 280an, 280bm, 280bn may be also formed by stacking plate-shaped members.

Figure 43:
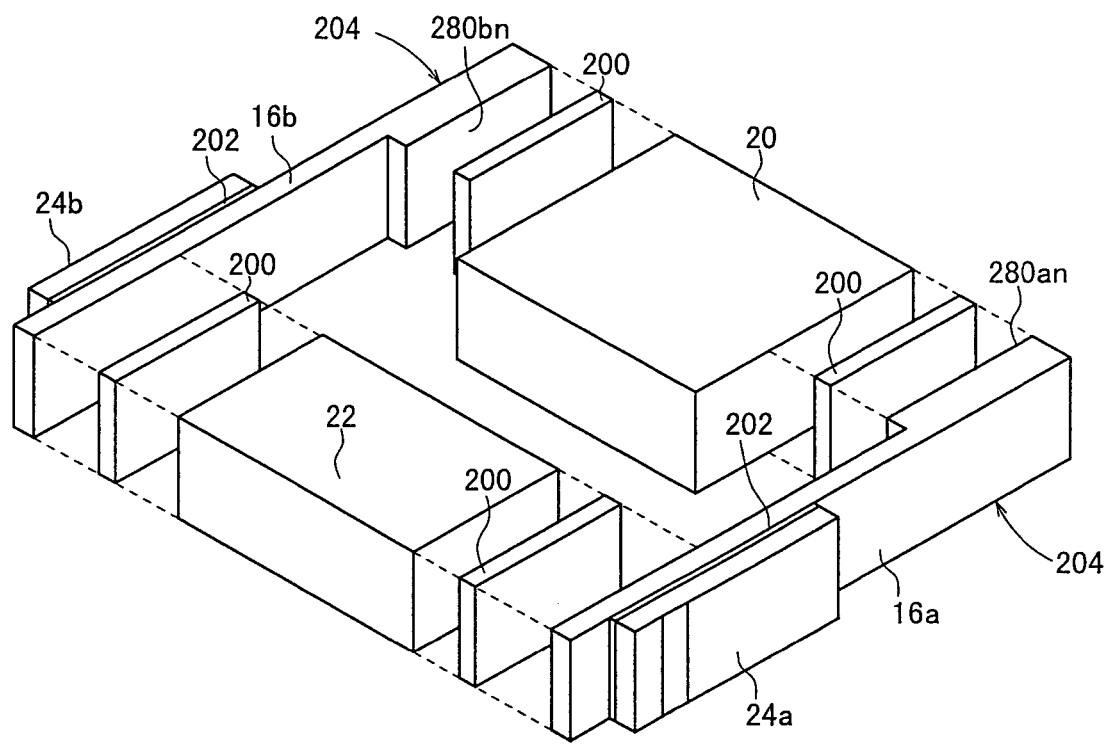
FIG. 43 illustrates an example in which bumps are provided at portions of respective stainless steel thin plates to which a support section to be formed into a fixation section thereafter is glued.

FIG. 43 is illustrative of a case in which the adhesive having high fluidity is used as the adhesive 200 for gluing the movable section 20 and the respective thin plate sections 16a, 16b, and the adhesive having high viscosity is used as the adhesive 200 for gluing the fixation section 22 and the respective thin plate sections 16a, 16b, wherein the bumps 280an, 280bn are provided at portions of the thin plate sections 16a, 16b for which the adhesive having high fluidity is used.

FIG. 44 is illustrative of a case in which the adhesive having high viscosity is used as the adhesive 200 for gluing the fixation section 22, and the thin plate sections 16a, 16b, depicting a structure in which the bump 280am, 280an, 280bm, 280bn as described above is not provided.

Figure 45:
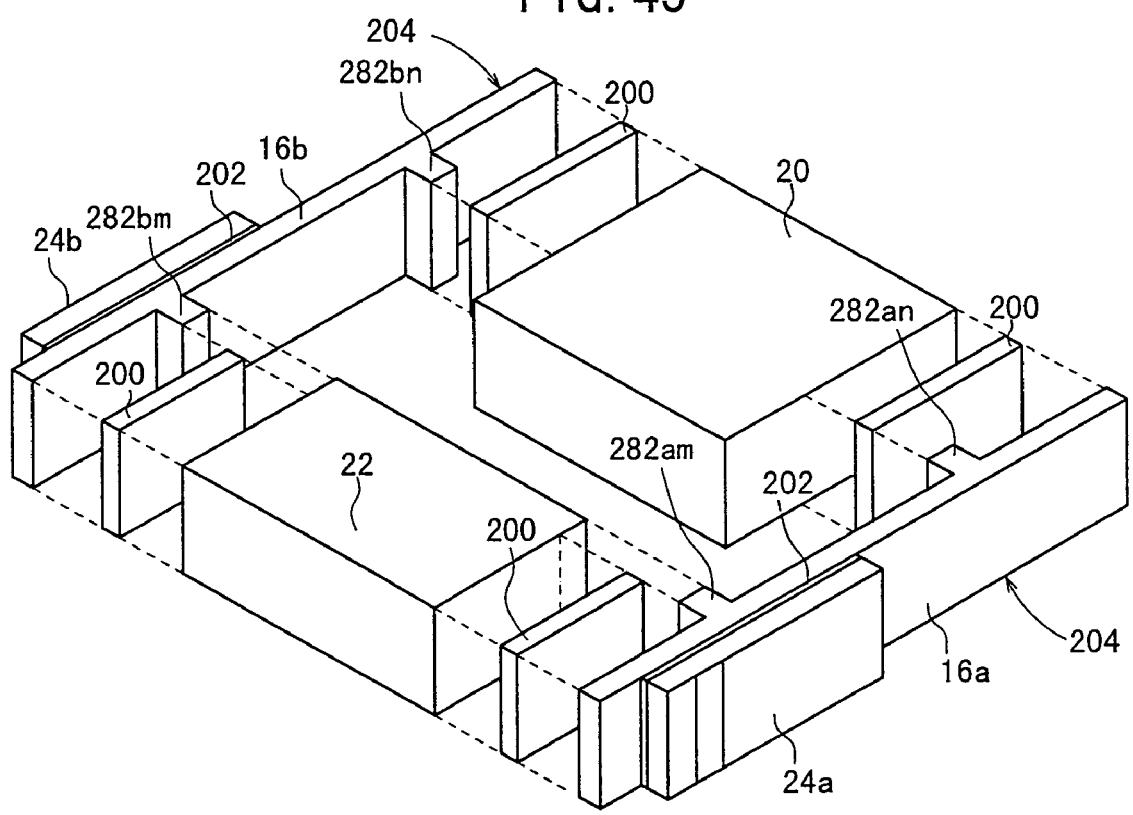
FIG. 45 illustrates an example in which projections for forming compartments for gluing are provided at portions of respective stainless steel thin plates to which a support section to be formed into a movable section thereafter and a support section to be formed into a fixation section thereafter are glued respectively.

FIG. 45 is illustrative of a case in which the adhesive having high fluidity is commonly used as the adhesive 200 for gluing the fixation section 22, the movable section 20, and the thin plate sections 16a, 16b, especially depicting an example which is provided with projections 282am, 282an, 282bm, 282bn for comparting regions for forming the adhesive 200 on the thin plate sections 16a, 16b.

Figure 46:
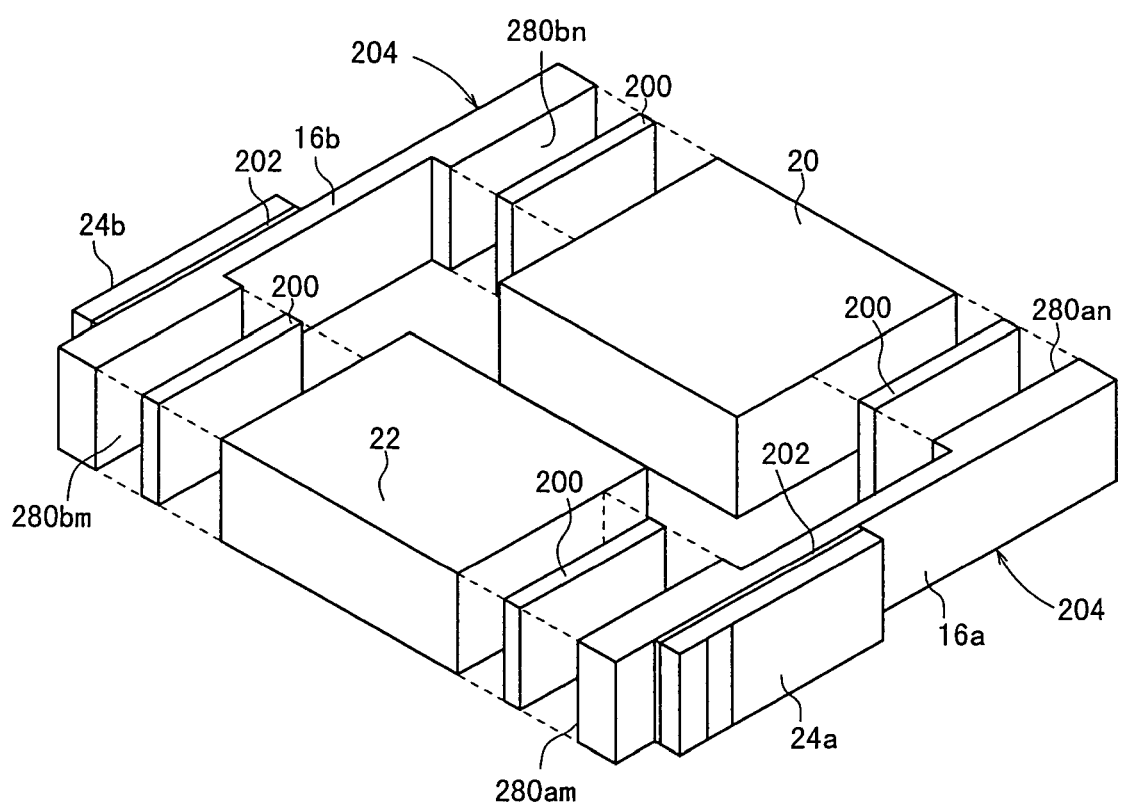
FIG. 46 illustrates a case concerning the example shown in FIG. 42, in which the size of the support section to be formed into the fixation section, especially the areal size of the surface of the stainless steel thin plate opposed to the bump is larger than the areal size of the bump.

As shown in FIG. 46 concerning the example shown in FIG. 42, it is also preferable that the size of the fixation section 22, especially the areal size of the surface opposed to the bump 280 of each of the thin plate sections 16a, 16b is made to be larger than the areal size of the bump 280am, 280bm. Accordingly, the substantial driving portion (portion between the bumps 280am and 280an and portion between the bumps 280bm and 280bn) of the thin plate sections 160a, 160b can be defined by the bump 280am, 280bm. As shown in FIG. 42, when the areal size of the surface opposed to the bump 280am, 280bm of each of the thin plate sections 16a, 16b concerning the fixation section 22 is made to be substantially the same as the areal size of the bump 280am, 280bm, it is feared that the dispersion in size concerning the fixation section 22 and the bump 280am, 280bm affects the length of the substantial driving portion. FIG. 46 is illustrative of the case in which the size of the fixation section 22 is increased toward the movable section 20. Alternatively, it is also preferable that the size of the fixation section 22 is increased outwardly oppositely to the direction toward the movable section 20.

In FIGS. 42 to 46, the bumps 280am, 280bm, 280an, 280bn or the projections 282am, 282bm, 282an, 282bn are integrated with the thin plate sections. However, these components may be provided by stacking appropriately processed plates by the aid of an adhesive, in the same manner as in FIG. 19 or FIG. 23. In the case of the provision by means of the integration, the bumps 280am, 280bm, 280an, 280bn or the projections 282am, 282bm, 282an, 282bn can be integrally provided for the thin plate sections 16a, 16b, for example, by means of etching or cutting.

The embodiment described above is illustrative of the case in which the adhesive 200, 202 is formed by means of the screen printing. Alternatively, it is possible to use, for example, dipping, dispenser, and transfer.

Next, explanation will be made with reference to FIGS. 47 to 52 for various illustrative constructions concerning the adhesive 202 which intervenes, for example, between the thin plate section 16a and the stacked type piezoelectric/electrostrictive element 24 and the adhesive 200 which intervenes between the thin plate sections 16a, 16b, the movable section 20, and the fixation section 22.

Figure 47:
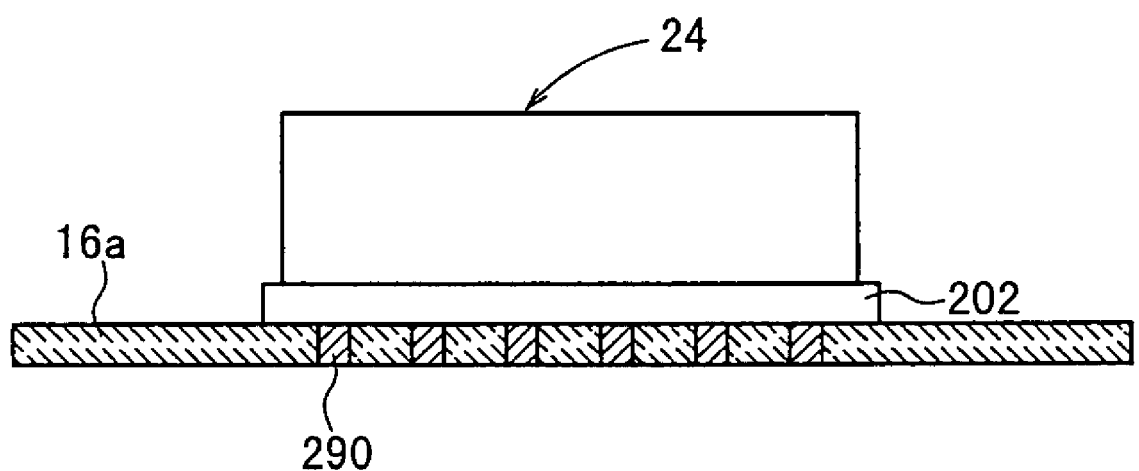
FIG. 47 illustrates a first technique (to define holes through a stainless steel thin plate)

At first, in the first technique shown in FIG. 47, a large number of holes 290 are provided through the thin plate section 16a. The stacked type piezoelectric/electrostrictive element 24 is glued to a portion at which the holes 290 are provided, by the aid of the adhesive 202. In this arrangement, the adhesive 202 enters the inside of the holes 290. Therefore, the adhesion area is substantially increased, and it is possible to use a thinner adhesive 202. It is preferable that the thickness of the adhesive 202 is not more than 5% of the total thickness of the stacked type piezoelectric/electrostrictive element 24 and not less than a thickness of such a degree that the thermal stress due to the difference in coefficient of thermal expansion between the thin plate section 16a and the adhesive 202 can be absorbed.

It is preferable that the diameter of the hole 290 is 5 μm to 100 μm. The arrangement pattern may be either a matrix form or a zigzag arrangement. Of course, a plurality of holes 290 may be arranged in one array. It is preferable that the arrangement pitch of the holes 290 is 10 μm to 200 μm. Alternatively, recesses (bores) may be used in place of the holes 290. In this arrangement, it is preferable that the diameter of the bore is 5 μm to 100 μm. The arrangement pattern may be either a matrix form or a zigzag arrangement. It is preferable that the arrangement pitch of the bores is 10 μm to 200 μm. Especially, in the case of the recess (bore), for example, it is also preferable to use a rectangular configuration as viewed in plan view with its opening area which is slightly smaller than the projection area of the piezoelectric/electrostrictive element 24 onto the thin plate section 16*a*. Those adoptable as the technique for forming the holes 290 or the bores in the thin plate section 16*a* include, for example, etching, laser machining, stamping, drill machining, electric discharge machining, and ultrasonic machining.

Figure 48:
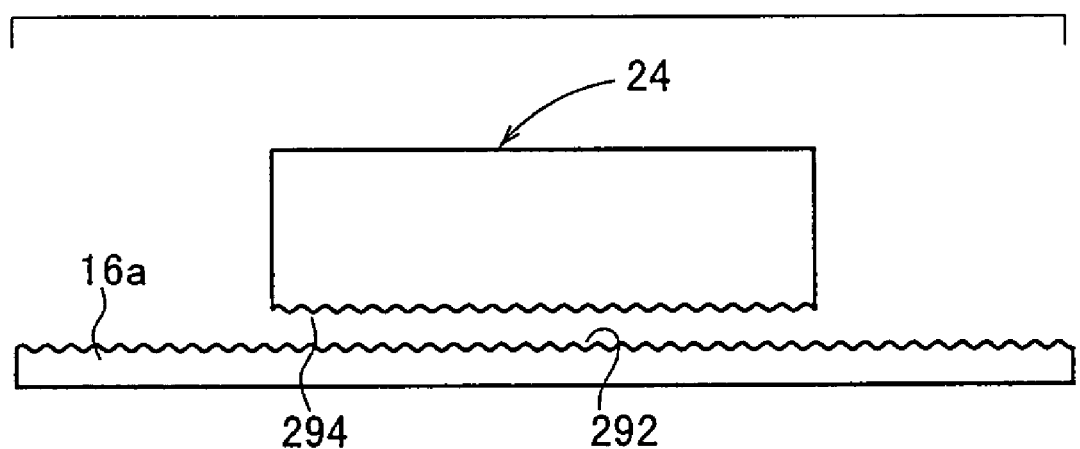
FIG. 48 illustrates a second technique (to roughen the surfaces of a stainless steel thin plate and a stacked type piezoelectric/electrostrictive element)

In the second technique shown in FIG. 48, the surface 292 of a portion of the thin plate section 16*a*, on which a stacked type piezoelectric/electrostrictive element 24 is formed, is roughened by means of the blast treatment, the etching treatment, or the plating treatment. In this arrangement, the lower surface 294 of the stacked type piezoelectric/electrostrictive element 24 is also roughened. Accordingly, the adhesion area is substantially increased. Therefore, it is possible to use a thin thickness of the adhesive 202.

FIG. 48 is illustrative of the case in which the surface of the thin plate section 16*a* and the lower surface of the piezoelectric/electrostrictive element 24 (surface opposed to the thin plate section 16*a*) are roughened. However, it is enough that the surface having the small adhesion force with respect to the adhesive 202 is roughened. A sufficient effect is obtained, for example, even when only the surface of the thin plate section 16*a* is roughened. The surface roughness is preferably Ra=0.1 μm to 5 μm, and more preferably 0.3 μm to 2 μm, for example, as estimated by the center line average roughness.

Figure 49:
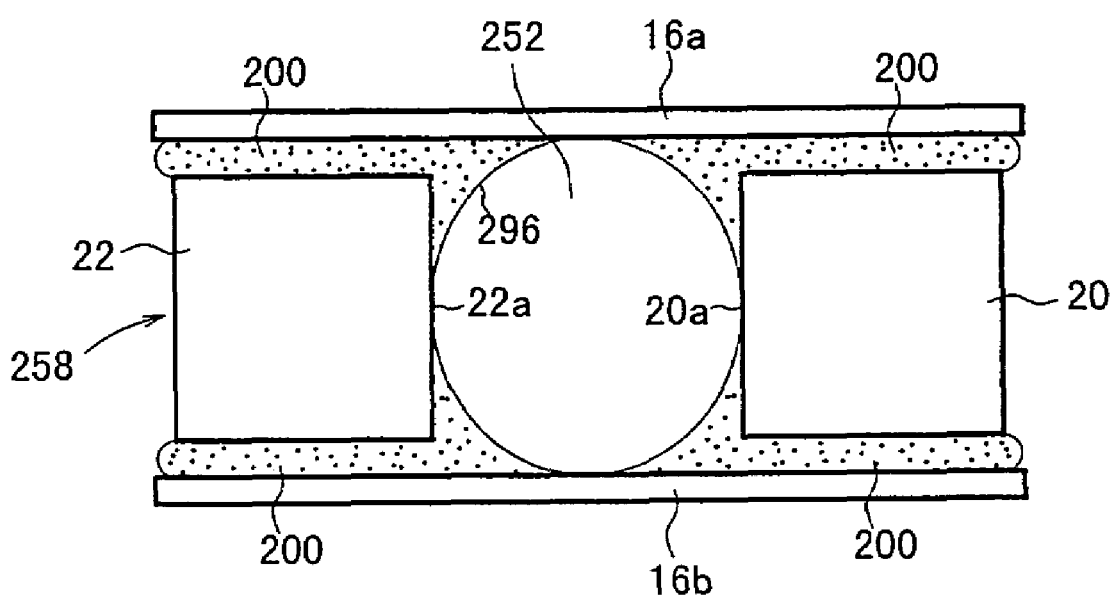
FIG. 49 illustrates a third technique (to provide a curvature for stick-out portions of an adhesive)

In the third technique shown in FIG. 49, a curvature 296 is provided for the stick-out shape of the adhesive 200, especially for the stick-out shape of the adhesive 200 toward the hole (hole 252 of the substrate 258) formed by the inner walls of the thin plate sections 16*a*, 16*b*, the inner wall 20*a* of the movable section 20, and the inner wall 22*a* of the fixation section 22. In this arrangement, it is preferable that the radius of curvature is not less than 0.05 mm and up to the extent that the stick-out shape is linear, or the stick-out shape includes a linear portion. The formation of the curvature 296 for the stick-out portion of the adhesive 200 can be realized, for example, by inserting a cylindrical core member into the hole 252 before curing the adhesive 200. Practically, the control is made based on the use of the application amount and the physical property of the adhesive 200 so that the stick-out shape is at least not convex.

Accordingly, the inner wall 20*a* of the movable section 20, the inner wall 22*a* of the fixation section 22, and the inner walls of the respective thin plate sections 16*a*, 16*b* are also used as the adhesion surfaces. Therefore, the adhesion area is increased, and it is possible to increase the adhesion strength. Further, it is possible to effectively disperse the concentration of the stress on the joined portions (angular portions) between the inner wall 22*a* of the fixation section 22 and the inner walls of the respective thin plate sections 16*a*, 16*b*.

Figure 50:
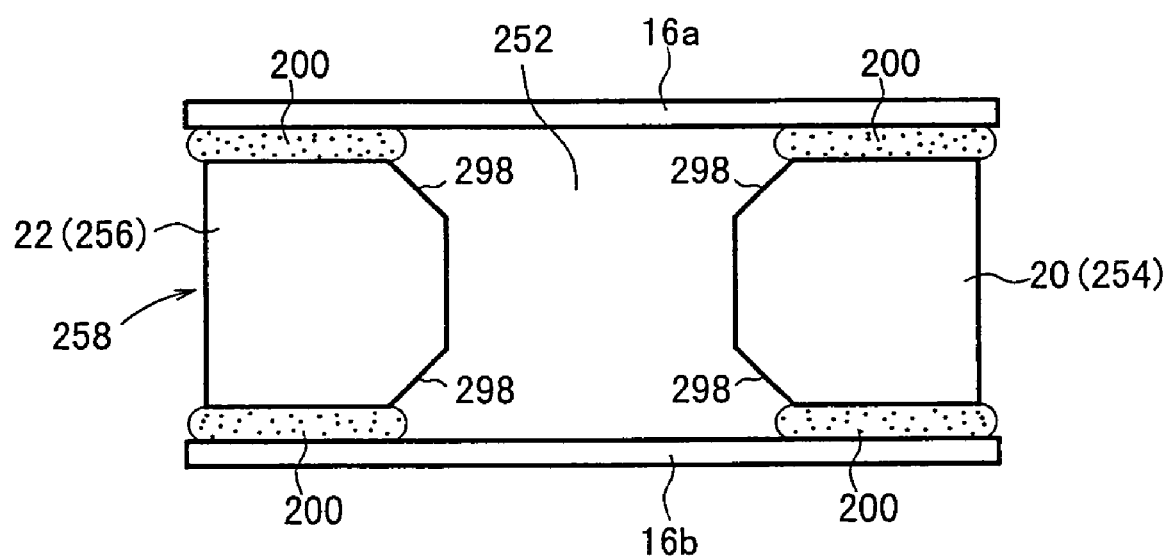
FIG. 50 illustrates a fourth technique (to chamfer angular portions of respective support sections)

In the fourth technique shown in FIG. 50, angular portions opposed to the fixation section 22, of angular portions of the movable section 20, and/or angular portions opposed to the movable section 20, of angular portions of the fixation section 22 are chamfered respectively to form tapered surfaces 298. The stick-out amount of the adhesive 200 can be stabilized by appropriately adjusting the radius of curvature and the angle of the chamfering. It is possible to suppress the local dispersion of the adhesion strength, and it is possible to improve the yield.

The following method is preferably used to chamfer the angular portion. That is, for example, the cutting and the polishing are performed beforehand for the portions to be formed into the angular portions of the first support section 264 and the second support section 256 to form the tapered surfaces 298 before the assembling. Of course, the chamfering may be performed after the assembling. In this case, for example, the laser machining, the ultrasonic machining, or the sandblast is preferably adopted.

Figure 51:
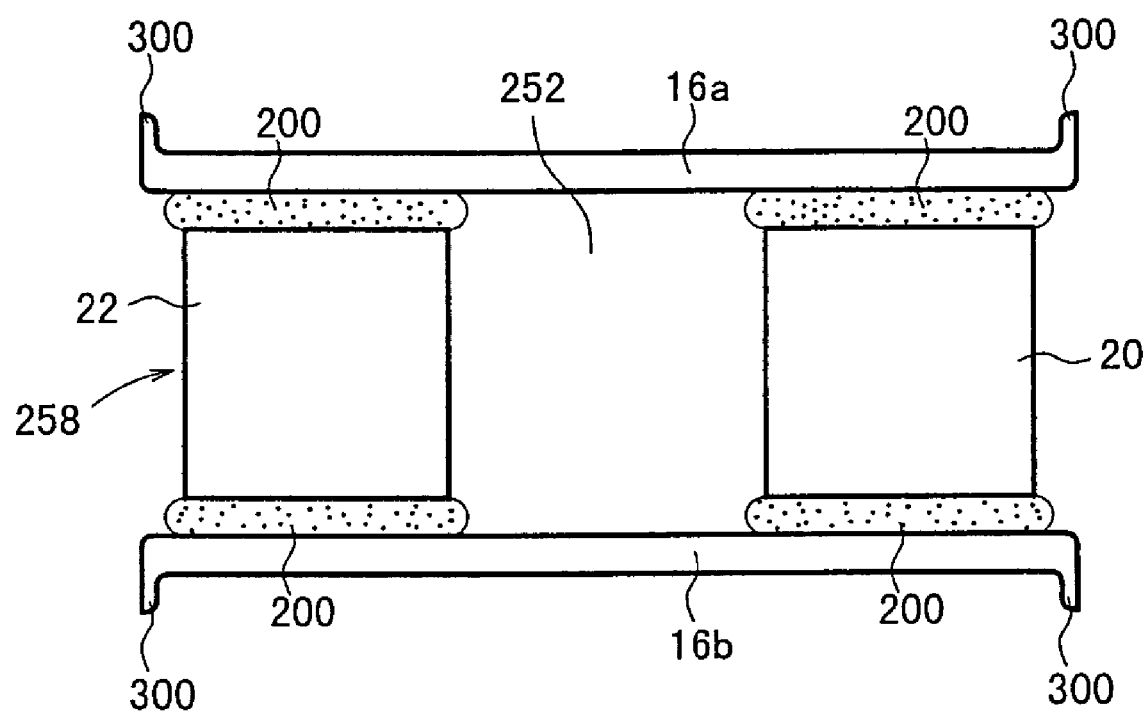
FIG. 51 illustrates a fifth technique (to direct burrs outwardly)

The fifth technique shown in FIG. 51 relates to the punching out process which is usually performed, for example, when the thin plate sections 16*a*, 16*b* are manufactured. In this case, burrs 300 are formed. The formed burrs 300 may be removed before the assembling. However, they may be allowed to remain as they are. In this case, it is preferable that the directions of the formed burrs 300 are regulated, for example, in consideration of the handling and the adhesion directions of the respective members as well as the easiness of control of the amount of the adhesive. The example shown in FIG. 51 is illustrative of a state in which the burrs 300 of the thin plate sections 16*a*, 16*b* are directed outwardly.

Figure 52:
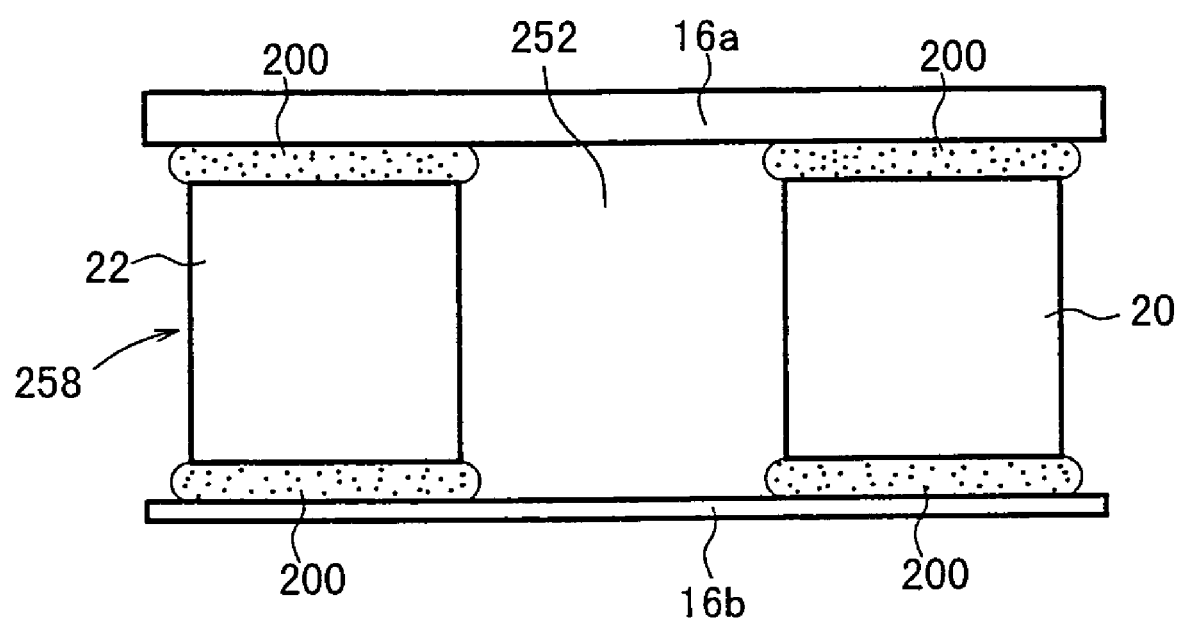
FIG. 52 illustrates a sixth technique (to change the thickness for respective stainless steel thin plates)
Figure 53:
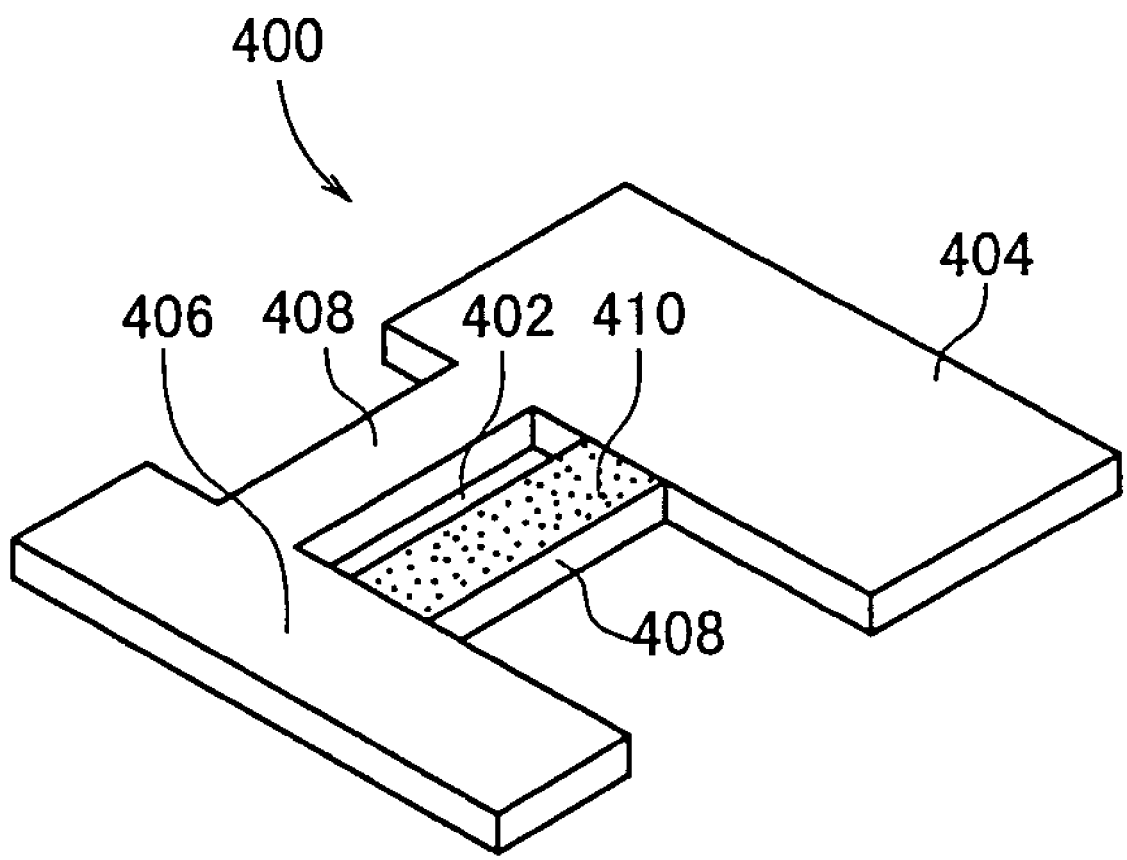
FIG. 53 shows an arrangement of a piezoelectric/electrostrictive device concerning an illustrative conventional technique.

In the sixth technique shown in FIG. 52, the thickness of the first thin plate section 16*a* is made to be larger than the thickness of the second thin plate section 16*b* as described above. In the case of the use as the actuator section 204 and the sensor, the stacked type piezoelectric/electrostrictive element 24 is preferably formed on the first thin plate section 16*a*.

Other techniques are also available. For example, when the stacked type piezoelectric/electrostrictive element 24 is glued to the thin plate section 16*a*, 16*b* by the aid of the adhesive 202, for example, it is preferable that a $ZrO_2$ layer is allowed to intervene as an underlying layer for the lower surface of the stacked type piezoelectric/electrostrictive element 24.

When the stainless steel thin plates 260, 262 (for example, see FIG. 33) are used as the thin plate sections 16*a*, 16*b*, it is preferable that the longitudinal direction of the thin plate sections 16*a*, 16*b* is approximately coincident with the direction of the cold rolling applied to the stainless steel thin plates 260, 262.

It is preferable that the piezoelectric/electrostrictive layer 26 for constructing the stacked type piezoelectric/electrostrictive element 24 is stacked in about three layers to ten layers.

The piezoelectric/electrostrictive devices 10A, 10B described above can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive devices 10A, 10B described above can be preferably utilized for various actuators to be used for the mechanism for adjusting the displacement and the positioning and for adjusting the angle for various precision parts such as those of optical instruments and precision mechanical equipments.

It is a matter of course that the piezoelectric/electrostrictive device and the method for producing the same according to the present invention are not limited to the embodiments described above, which may be embodied in other various forms without deviating from the gist or essential characteristics of the present invention.

What is claimed is:

1. A piezoelectric/electrostrictive device comprising:

a pair of mutually opposing thin plate sections, said thin plate sections each having a width "b" and being spaced apart by a distance "a", such that a ratio a/b is 0.5 to 20;

a fixation section for supporting said thin plate sections;

a movable section disposed at an opposite end of said thin plate sections from said fixation section; and at least one stacked type piezoelectric/electrostrictive element comprising a plurality of piezoelectric/electrostrictive layers and electrode films disposed on at least one of said thin plate sections.

2. A piezoelectric/electrostrictive device comprising:

a pair of mutually opposing thin plate sections;

a fixation section for supporting said thin plate sections;

a movable section disposed at an opposite end of said thin plate sections from said fixation section and spaced a distance La from said fixation section;

an actuator section with at least one stacked type piezoelectric/electrostrictive element fixed on at least one of said thin plate sections, said at least one stacked type piezoelectric/electrostrictive element comprising a plurality of piezoelectric/electrostrictive layers and electrode films, said electrode films contacting upper and lower surfaces of respective piezoelectric/electrostrictive layers and alternately extending to opposite end surfaces thereof such that a first end of each said electrode film is positioned at one of said opposite end surfaces and a second end of said electrode film extends a distance short of another of said opposite end surfaces, whereby said second end of one of said electrode films located nearest said movable section is spaced a distance Lb from said movable section; and end surface electrodes electrically connecting a first end of an electrode film that contacts one of said piezoelectric/electrostrictive layers and a first end of an electrode film that contacts another one of said piezoelectric/electrostrictive layers, said end surface electrodes being formed on respective outer side surfaces of said actuator section, wherein said at least one stacked type piezoelectric/electrostrictive element is disposed partially on said thin plate section and said fixation section, or partially on said thin plate section and said movable section, and wherein (1-Lb/La) is not less than 0.4.

* * * * *

UNITED STATES PATENT AND TRADEMARK OFFICE
CERTIFICATE OF CORRECTION

PATENT NO. : 7,336,021 B2 Page 1 of 1
APPLICATION NO. : 11/584223
DATED : February 26, 2008
INVENTOR(S) : Yukihisa Takeuchi, Kazuyoshi Shibata and Masahiko Namerikawa It is certified that error appears in the above-identified patent and that said Letters Patent is hereby corrected as shown below:

Title Page, (*) Notice

*Please add*: -- This patent is subject to a terminal disclaimer. --

Signed and Sealed this

First Day of July, 2008

JON W. DUDAS
*Director of the United States Patent and Trademark Office*